US007952876B2

(12) United States Patent
Azuma et al.

(10) Patent No.: US 7,952,876 B2
(45) Date of Patent: May 31, 2011

(54) ELECTRIC POWER CONVERTER

(75) Inventors: Katsunori Azuma, Hitachi (JP);
Mutsuhiro Mori, Mito (JP); Kinya Nakatsu, Hitachinaka (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/715,055

(22) Filed: Mar. 1, 2010

(65) Prior Publication Data
US 2010/0157640 A1 Jun. 24, 2010

Related U.S. Application Data

(63) Continuation of application No. 11/780,107, filed on Jul. 19, 2007, now Pat. No. 7,742,303.

(30) Foreign Application Priority Data

Jul. 21, 2006 (JP) .................................. 2006-198881

(51) Int. Cl.
*H05K 7/20* (2006.01)
(52) U.S. Cl. ........ 361/699; 361/709; 361/719; 363/131; 363/144
(58) Field of Classification Search .................. 363/131, 363/133, 127, 141–143, 144; 361/676, 688, 361/698, 699, 707–719; 307/10.1
See application file for complete search history.

(56) References Cited

U.S. PATENT DOCUMENTS

| | | | | |
|---|---|---|---|---|
| 5,604,672 A * | 2/1997 | Yoshida et al. | ................. | 363/97 |
| 6,370,041 B2 * | 4/2002 | Yasumura | ...................... | 363/19 |
| 6,414,867 B2 * | 7/2002 | Suzuki et al. | ................. | 363/141 |
| 6,777,846 B2 * | 8/2004 | Feldner et al. | ................. | 310/200 |
| 6,819,007 B2 * | 11/2004 | Fukaya | ...................... | 290/40 C |
| 7,450,388 B2 * | 11/2008 | Beihoff et al. | ................. | 361/715 |
| 2003/0031038 A1 | 2/2003 | Shirakawa et al. | | |

FOREIGN PATENT DOCUMENTS

| | | |
|---|---|---|
| JP | 10-303349 A | 11/1998 |
| JP | 2001-268942 A | 9/2001 |
| JP | 2001-332688 A | 11/2001 |
| JP | 2002-44964 A | 2/2002 |
| JP | 2005-259748 A | 9/2005 |
| JP | 2005-347561 A | 12/2005 |

OTHER PUBLICATIONS

Japanese Office Action dated Nov. 4, 2008 (Two-2-pages).

* cited by examiner

*Primary Examiner* — Rajnikant B Patel
(74) *Attorney, Agent, or Firm* — Crowell & Moring LLP

(57) ABSTRACT

The present invention provides a highly reliable electric power converter reduced in parasitic inductance.
An electric power converter that includes a capacitor module which has a DC terminal, an inverter which coverts a direct current into an alternating current, and heat release fins which cool the inverter, is constructed so that: the inverter has a power module including a plurality of power semiconductor elements; the power module further has a metallic base, a dielectric substrate provided on one face of the metallic base, a power semiconductor element fixed to the dielectric substrate, and a DC terminal; the metallic base has the heat release fins on the other face; the DC terminal in the power module and the DC terminal in the capacitor module are each formed by stacking flat plate conductors via an insulator; the two positive and negative DC terminals have respective front ends bent in opposite directions; a plane including the bent sections is used as a surface for connecting the power module and the capacitor module; and the insulators overlap each other at the connection surface.

6 Claims, 45 Drawing Sheets

DIRECTION OF COOLING WATER

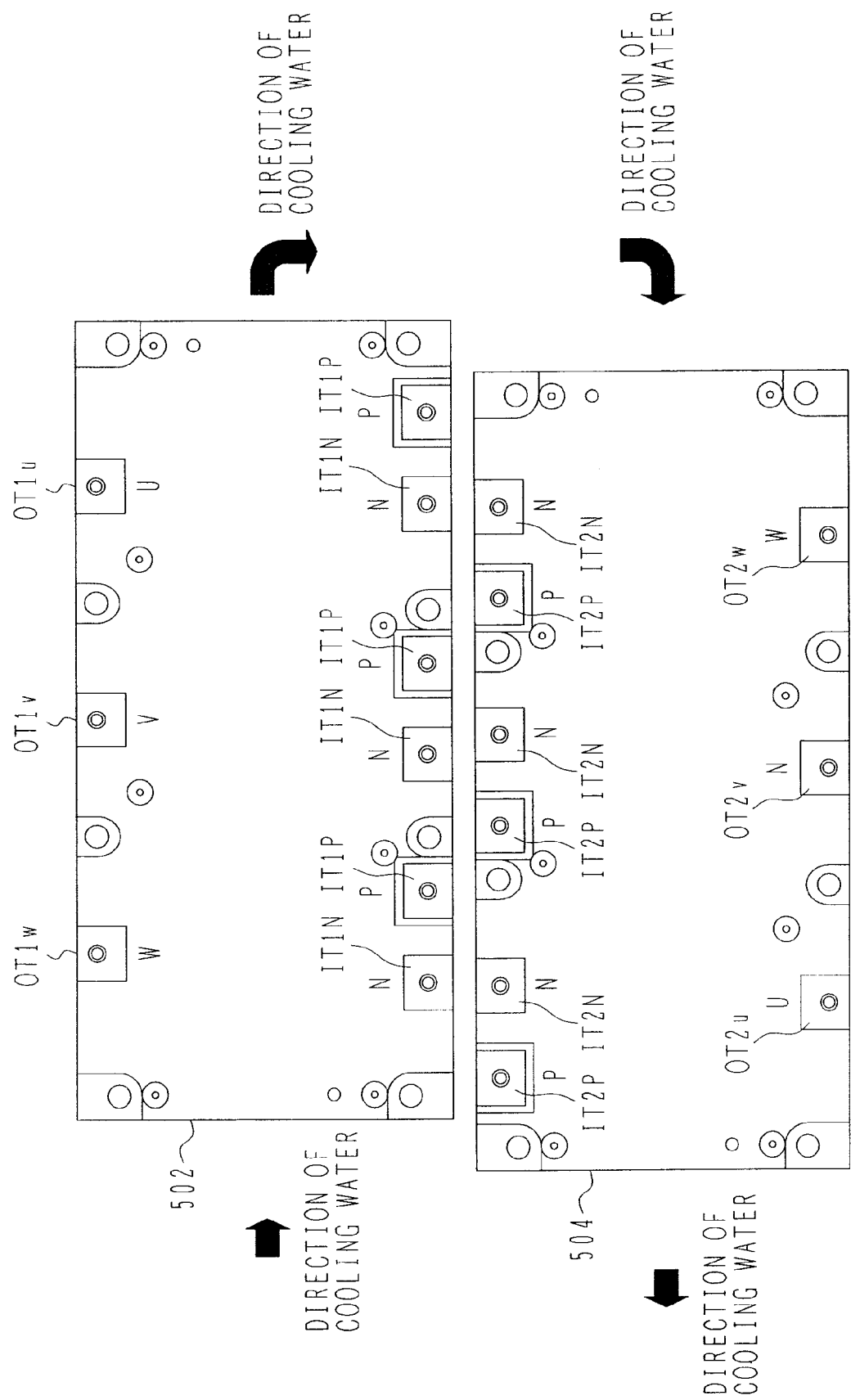

ELECTRIC POWER CONVERTER

RELATED APPLICATIONS

This application is a continuation of U.S. application Ser. No. 11/780,107, filed Jul. 19, 2007 which claims the benefit of priority under 35 U.S.C. §119 to Japanese patent application serial no. 2006-198881, filed Jul. 21, 2006, the disclosure of which is incorporated herein in its entirety.

BACKGROUND OF THE INVENTION

1. Field of the Invention

The present invention relates to an electric power converter adapted to convert direct-current power into alternating-current power, or vice versa.

2. Description of the Related Art

Electric power converters that supply alternating-current (AC) power to or receive AC power from a rotating electric machine operating as a motor or a power generator, may be used under severe environments. For example, when mounted in automobiles, electric power converters (hereinafter, referred to simply as power converters) may be used under severe environments such as a high-temperature environment. In addition, the power that power converters convert tends to be augmented in energy level. For example, power converters are likely to be used under the situation that a current of several hundreds of amperes flows.

Techniques relating merely to reducing inductance are disclosed in JP-A Nos. 2001-268942 and 2001-332688. Also, a technique relating merely to cooling is disclosed in JP-A-2005-259748 (FIG. 1).

SUMMARY OF THE INVENTION

The power converter used under a severe environment needs to maintain high reliability. When the power converter is mounted and used in an automobile, in particular, failures in the power converter during use in a high-temperature environment or during processing of power as high as several hundreds of amperes in current level could induce serious automobile accidents. This is why high reliability is required.

To enhance the reliability of a power converter, it is important to avoid using the power converter at unusual operating temperatures of its electric circuit components, and hence to conduct improvements concerning the temperature of the power converter. To protect the power converter from an unusual high-temperature state, it is important to bestow excellent cooling structure on the converter. It is also important that the converter be constructed to suppress the generation of heat.

An inverter that generates a large amount of heat is included in power converters, so it is necessary to construct the power converters so that each suppresses the generation of heat and so that each can efficiently cool the inverter. Since the inverter generates a large amount of heat during switching, the amount of heat generated can be controlled by shortening the switching time. This, however, tends to increase the amount of current to be processed. For example, if a current of several hundreds of amperes is conducted or cut off for a short time period, since inductance will cause a voltage increase, merely shortening the switching time will result in the deterioration of reliability due to a high voltage. For this reason, it has been difficult to shorten the switching time.

Accordingly, reducing the inductance is desired from the viewpoints of cooling the power converter efficiently and reducing the amount of heat generated. The reliability of the power converter can thus be enhanced.

In order to solve the foregoing problems, one feature of an electric power converter according to the present invention is that: the power converter includes on one face of a metallic base a power semiconductor chip constituting an inverter, uses a first wide conductor and a second wide conductor to establish electrical connection between a direct-current terminal of the inverter and a direct-current terminal of a capacitor module, and has the first and second wide conductors formed into a stacked structure.

The above power converter also has a lot of other features, which will be detailed in the description of embodiments, given below.

The present invention makes it possible to provide a highly reliable, electric power converter.

BRIEF DESCRIPTION OF THE DRAWINGS

FIG. 21 is a layout diagram of power modules in the present example;

DESCRIPTION OF THE PREFERRED EMBODIMENTS

Figure 1:
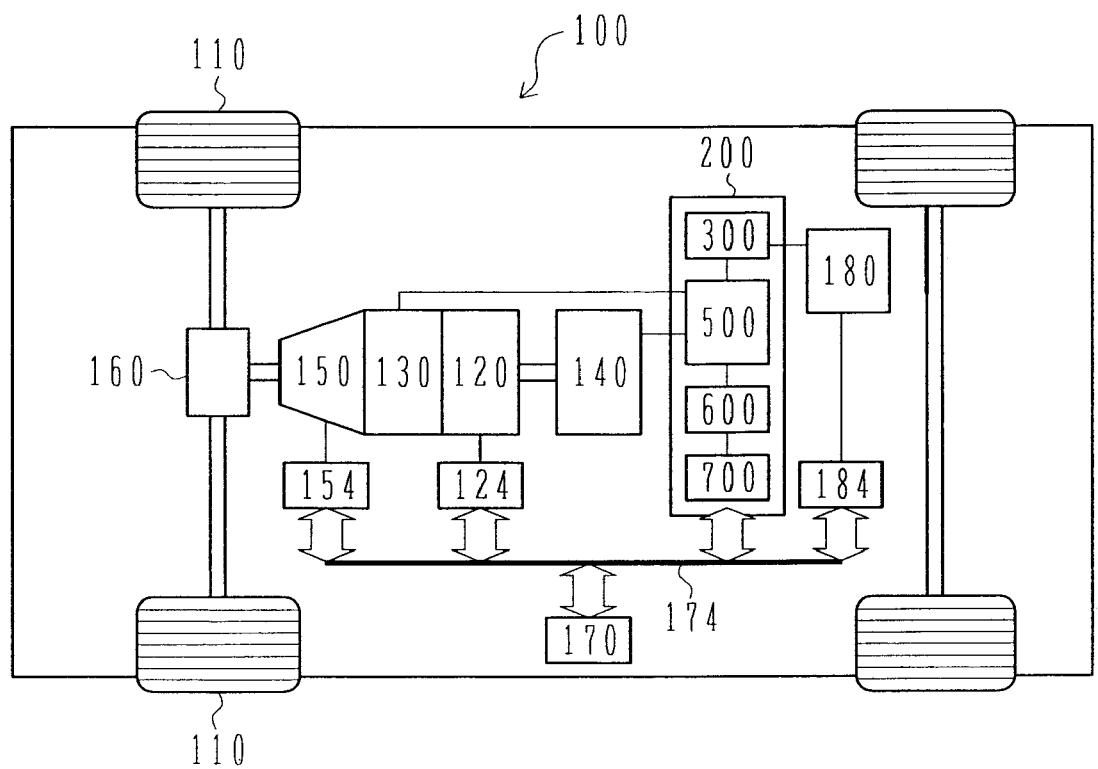
FIG. 1 is a system diagram showing an embodiment of an electric vehicle having an electric power converter according to the present invention.

In each of the embodiments described below, an electric power converter includes heat release fins in a semiconductor module and is constructed to cool the semiconductor module efficiently by means of the heat release fins. Also, temperature increases of a smoothing capacitor module are minimized since the power converter is constructed to be efficiently cooled by cooling water. In addition, the amount of heat generated is minimized since the power converter is constructed so that inductance of an electric circuit formed between the inverter and the capacitor module is reduced. That is to say, reducing the inductance of the above circuit makes it possible to reduce a switching time, especially, the operating time required when a power module constituting the inverter changes from a conducting state to a cutoff state. The reduction in the operating time, in turn, makes it possible to reduce the amount of heat generated.

In each of the embodiments described below, there are advantageous effects in that planarity of a heat release substrate forming a metallic base of the semiconductor module can be maintained with high accuracy and that the heat release substrate can be easily manufactured. In addition, a plurality of dielectric substrates each having a plurality of semiconductor chips can be bonded onto one metallic base during manufacture of the dielectric substrates. Furthermore, bonding reliability of each dielectric substrate is high and heat-releasing efficiency of the semiconductor module can be improved.

In each of the embodiments described below, inductance between the capacitor module and a semiconductor power module can be reduced to a low level. Since a conductor between the capacitor module and the semiconductor power module can be reduced in inductance, a terminal connection between the capacitor module and the semiconductor power module can also be reduced in inductance. In addition, a DC terminal section of the semiconductor power module can be reduced in inductance. Efficient reduction of these sections in inductance can be structurally implemented. Furthermore, internal inductance of the capacitor module can be reduced.

In the first and second embodiments, a cooling medium and the semiconductor module are high in heat transfer efficiency, even more reliable cooling is possible, and reduction in the amount of heat generated and efficient release of the heat can be achieved with high reliability.

In first and second embodiments, cooling water for an engine can be used as the cooling medium, device mountability in a vehicle is improved, and a total drive system configuration is simplified. In each of the embodiments described below, a structural relationship between a cooling water pathway and the heat release fins is improved to make the engine cooling water usable. The cooling water pathway and installation of a smoothing capacitor are also structurally improved.

According to the first and second embodiments relating to an electric power converter which has a function that controls two rotating electric machines, a configuration of the entire device is simplified and even higher cooling efficiency can be obtained. In addition, the device is constructed so that it can be easily manufactured.

First Embodiment

<<Electric Vehicle 100>>

FIG. 1 is a block diagram showing an embodiment of a hybrid type electric vehicle having an electric power converter according to the present invention. The power converter 200 according to the present invention can be applied to both a pure electric vehicle and a hybrid type electric vehicle. However, hereinafter, an embodiment of the hybrid type electric vehicle is described below as a representative of both types.

The hybrid type electric vehicle 100 has an engine 120, a first rotating electric machine 130, a second rotating electric machine 140, and a battery 180 that supplies high-voltage DC power to the first rotating electric machine 130 and the second rotating electric machine 140. The vehicle 100 also has a battery to supply low-voltage DC power (14-volt power) to the control circuit described below. This battery is not shown.

Torques based on the engine 120, on the first rotating electric machine 130, and on the second rotating electric machine 140, are transmitted to a transmission 150 and a differential gear 160, and then transferred to front wheels 110.

A transmission controller 154 for controlling the transmission 150, an engine controller 124 for controlling the engine 120, the rotating electric machine control circuit disposed on a rotating electric machine control circuit board 700 to control an electric power converter 200, a battery controller 184 for controlling the battery 180 such as a lithium ion battery, and an integrated controller 170 are each connected to a communications line 174.

The integrated controller 170 is a lower-level control device. This controller receives information that indicates states of the transmission controller 154, the engine controller 124, the power converter 200, and the battery controller 184, from these controllers via the communications line 174. Based on the information, control commands addressed to the four controllers are computed by the integrated controller 170 and transmitted therefrom to each controller via the communications line 174. The battery controller 184, for example, reports to the integrated controller 170 a discharge status of the battery 180 which is a lithium ion battery, and states of unit cells which constitute the lithium ion battery. After judging from the reported states that the battery 180 requires recharging, the integrated controller 170 delivers a power-generating operation instruction to the power converter 200. Also, the integrated controller 170 manages output torques of the engine 120, the first rotating electric machine 130, and the second rotating electric machine 140, arithmetically processes an overall torque or torque distribution ratio of the output torques of the engine 120, the first rotating electric machine 130, and the second rotating electric machine 140, and transmits appropriate control commands to the transmission controller 154, the engine controller 124, and the electric power converter 200, according to particular processing results. In accordance with a torque command, the power converter 200 controls the first rotating electric machine 130 and the second rotating electric machine 140 so that the torque output or power generation specified in the command will be implemented using either one of the rotating electric machines or both thereof.

In order to operate the first rotating electric machine 130 and the second rotating electric machine 140, the power converter 200 controls switching actions of power semiconductor chips, pursuant to the command from the integrated controller 170. The power semiconductor chips each constitute an inverter. The first rotating electric machine 130 and the second rotating electric machine 140 are operated as motors or power generators by the switching actions of the power semiconductor chips.

For operation as a motor, direct-current power from the high-voltage battery 180 is applied to an inverter of the power converter 200, then the DC power is converted into a three-phase alternating current by controlling the power semiconductor chip constituting the inverter, and the alternating current is supplied to the rotating electric machine 130 or 140. For operation as a power generator, the rotating electric machine 130 or 140 has its rotor rotated by an external torque, and in accordance with this torque, generates three-phase AC power in a stator coil of the rotating electric machine. The generated three-phase AC power is converted into DC power by the power converter 200 and supplied to the high-voltage battery 180, which is then recharged with the DC power.

As shown in FIG. 1, the power converter 200 includes a capacitor module 300 containing a plurality of smoothing capacitors to suppress voltage fluctuation of the DC power supply, a power module 500 containing a plurality of power semiconductors, a switching driver board 600 with a switching driver for controlling a switching action of the power module 500, and a rotating electric machine control circuit board 700 having a rotating electric machine control circuit for generating a signal which determines a time width of the switching action, that is, a pulse width modulation (PWM) control signal. The high-voltage battery 180 is a secondary battery such as a lithium ion battery or nickel-hydrogen battery, and outputs high-voltage DC power of 250-600 volts or more.

<<Total Power Converter Configuration>>

Figure 2:
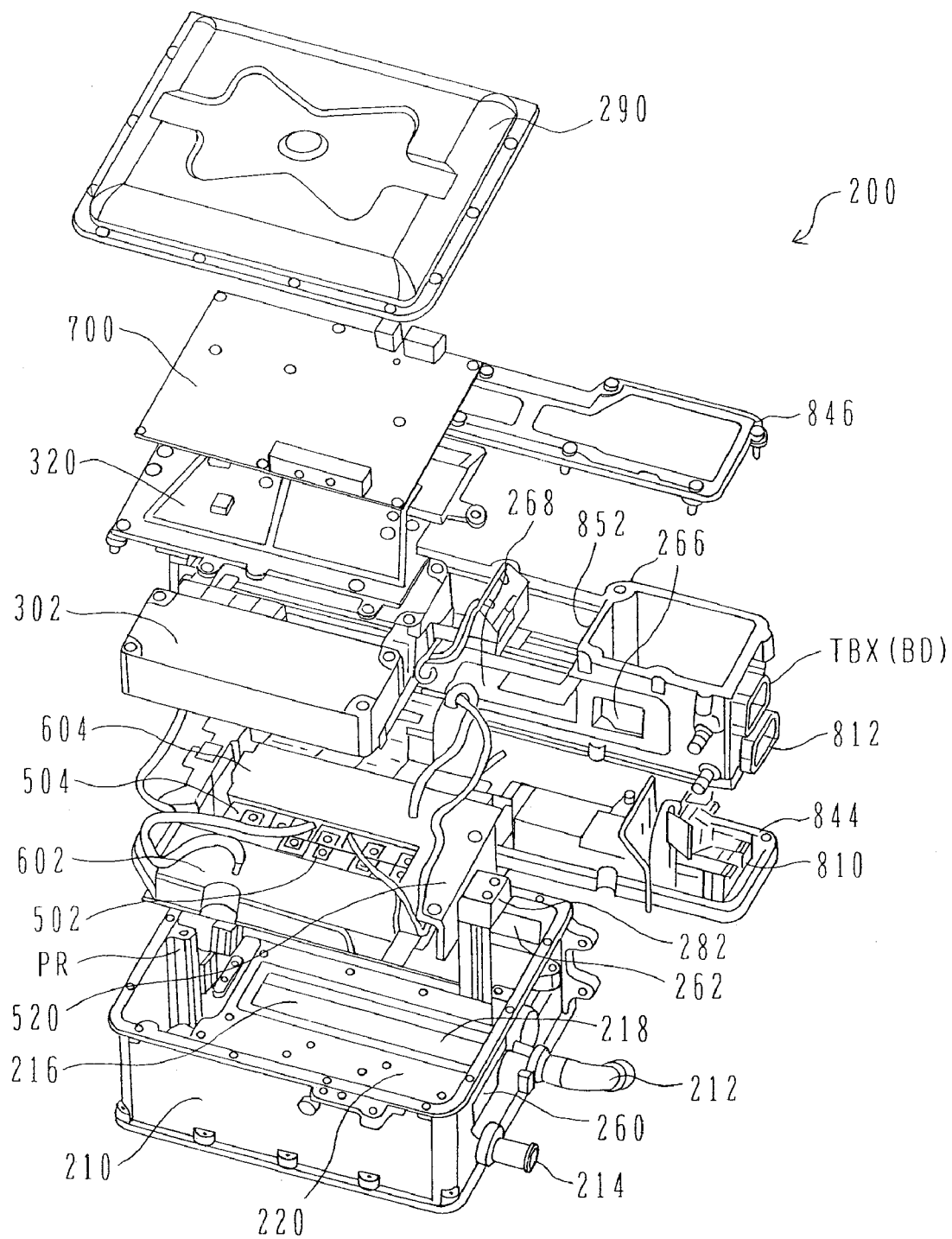
FIG. 2 is an exploded perspective view of the power converter according to the present invention.
Figure 3:
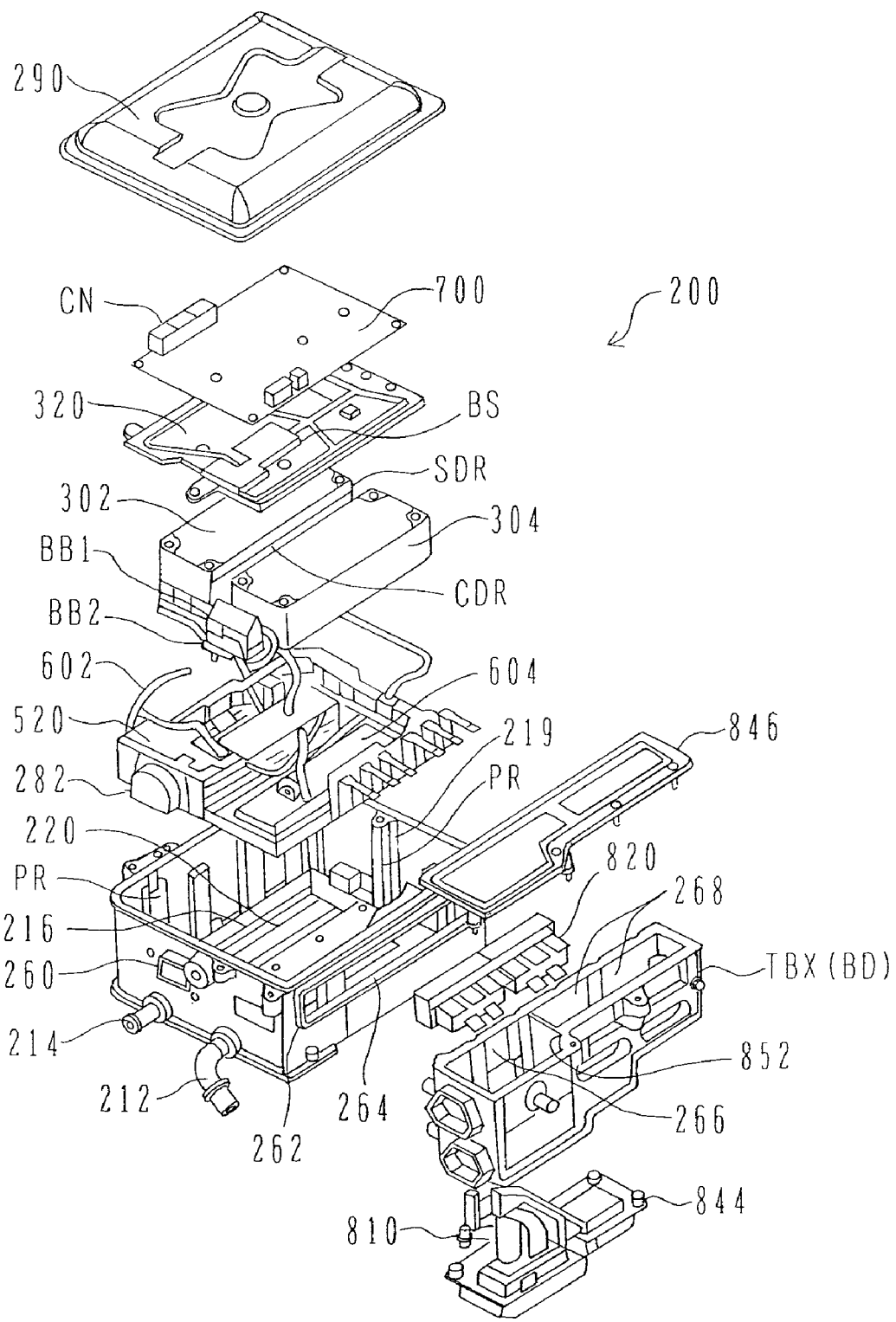
FIG. 3 is another exploded perspective view of the power converter according to the present invention, when viewed from a direction different from that of FIG. 2.
Figure 4:
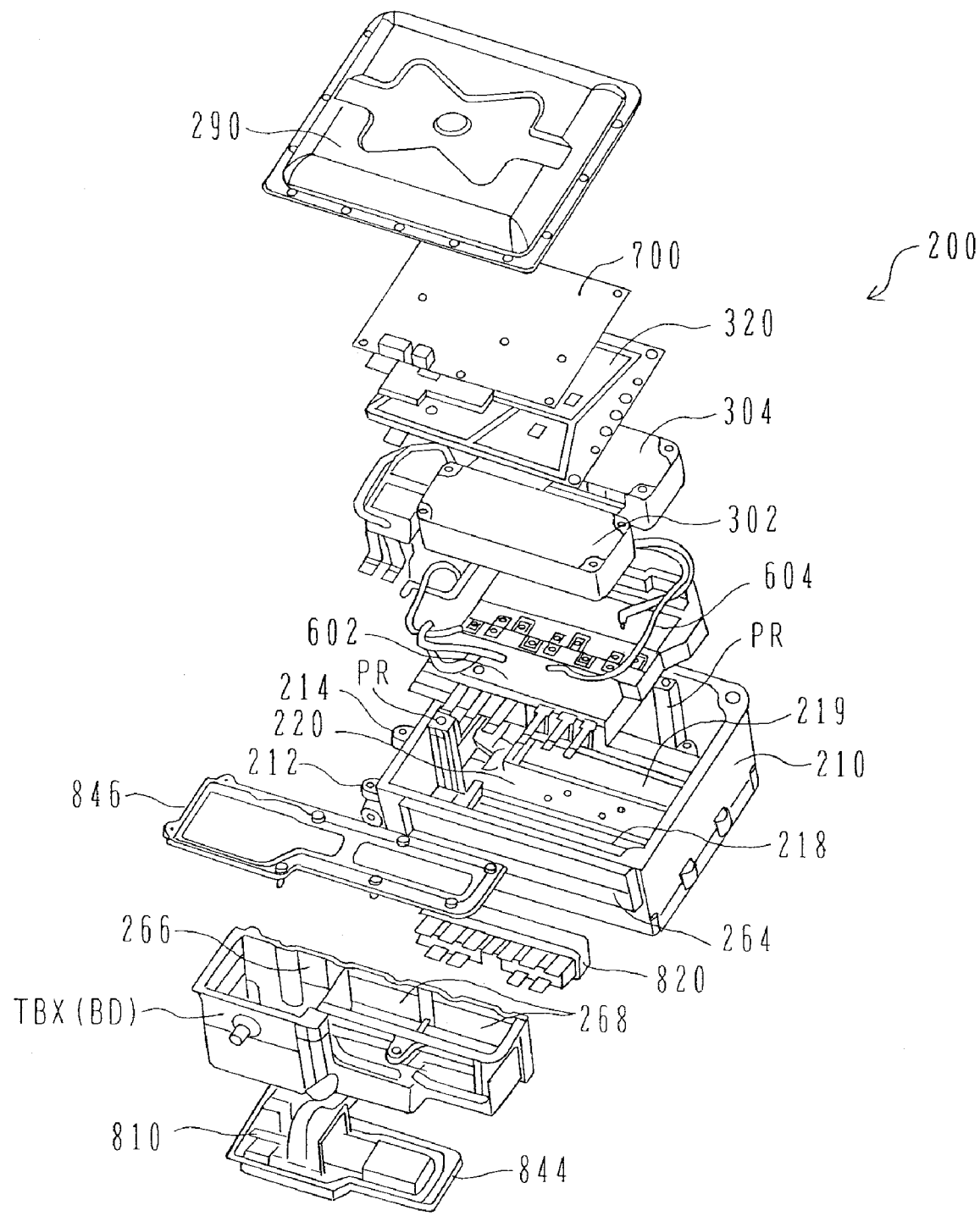
FIG. 4 is yet another exploded perspective view of the power converter according to the present invention, when viewed from a direction different from that of FIG. 2 or 3.

FIGS. 2, 3, and 4 are exploded perspective views of the above-described power converter 200, schematically showing a total configuration thereof. FIGS. 2, 3, and 4 are exploded perspective views of the power converter 200 when the converter is seen from different directions.

The power converter 200 has a box-shaped housing 210, at the bottom of which is disposed a cooling water channel formation 220 internally having a cooling water channel 216 as a cooling pathway for cooling water to circulate therethrough. At the bottom of the housing 210, an inlet pipe 212 for supplying the cooling water to the cooling water channel 216, and an outlet pipe 214 protrude outward from the housing 210. The cooling water channel formation 220 has a function that forms a cooling pathway. Engine-cooling water is used as a cooling medium in the present embodiment, wherein the constituent element 220 functions as the cooling water channel formation.

The power module 500 in FIG. 1 is constituted by a first power module 502 and a second power module 504, both arranged next to each other in the housing 210. The first power module 502 and the second power module 504 each have heat release fins 506, 507 for cooling. The cooling water channel formation 220 has openings 218, 219. Fixing the first power module 502 and the second power module 504 to the cooling water channel formation 220 makes the cooling heat release fins 506, 507 project from the openings 218, 219 to the inward of the water channel 216. The openings 218, 219 are blocked with peripheral metallic walls of the heat release fins 506, 507. This forms cooling water channels and prevents the cooling water from leaking.

The first power module 502 and the second power module 504 are arranged at left and right positions of a virtual line segment orthogonal to a sidewall on which the cooling water inlet pipe 212 and outlet pipe 214 are formed. The cooling water channel formed in the water channel formation 220 extends from one end of the cooling water inlet pipe 212 to the other end in a longitudinal (longer-side) direction of the housing bottom, is bent into a U-character shape at the other end, and is re-routed to extend to the outlet pipe 214 in the longitudinal direction of the housing bottom. Thus, two sets of water channels parallel in the longitudinal direction are formed in the water channel formation 220, and the openings 218, 219 shaped to penetrate the water channels are also formed in the water channel formation 220. The first power module 502 and the second power module 504 are fixed to the water channel formation 220, along the water channels. The heat release fins provided in the first power module 502 and the second power module 504 project to the inward of the water channel 216, thus implementing efficient cooling. In addition, heat release surfaces of the first power module 502 and the second power module 504 come into firm contact with the metallic water channel formation 220, thus implementing efficient heat-releasing construction. Furthermore, since the openings 218, 219 are blocked with the heat release surfaces of the first power module 502 and the second power module 504, compact construction is realized and a cooling effect is improved.

A first driver circuit board 602 and a second driver circuit board 604 are arranged next to each other in stacked form above the first power module 502 and the second power module 504, respectively. The first driver circuit board 602 and the second driver circuit board 604 constitute the switching driver circuit board 600 described in FIG. 1.

In planar view, the first driver circuit board 602 disposed above the first power module 502 is formed to be slightly shorter than the first power module 502. In planar view, the second driver circuit board 604 disposed above the second power module 504 is likewise formed to be slightly shorter than the second power module 504.

The cooling water inlet pipe 212 and outlet pipe 214 are provided on a sideface of the housing 210, a hole 260 is formed on this sideface, and a connector 282 for a signal is disposed at the hole 260. A noise reduction board 560 fixed adjacently to the connector 282, and a second electrical discharge board 520 are arranged at the disposing position of the connector 282, inside the housing 210. The noise reduction board 560 and the second electrical discharge board 520 are installed so that respective installation surfaces are parallel to those of the first power module 502 and the second power module 504.

A capacitor module 300 with a plurality of smoothing capacitors is disposed above the driver circuit boards 602 and 604. The capacitor module 300 also has a first capacitor module 302 and a second capacitor module 304, and the first capacitor module 302 and the second capacitor module 304 are arranged above the first driver circuit board 602 and the second driver circuit board 604, respectively.

Above the first capacitor module 302 and the second capacitor module 304, a planar retaining plate 320 is fixedly disposed with its periphery brought into firm contact with an inner wall surface of the housing 210. In addition to supporting the first capacitor module 302 and the second capacitor module 304 from above, the retaining plate 320 retains and immobilizes the rotating electric machine control circuit board 700 from the underside thereof, as shown in FIG. 2. The retaining plate 320 constructed of a metallic material releases heat from the capacitor modules 302, 304 and the rotating electric machine control circuit board 700 by discharging the heat towards the housing 210.

As described above, the power module 500, the switching driver circuit board 600, the noise reduction board 560, the second electrical discharge board 520, the capacitor module 300, the retaining plate 320, and the rotating electric machine control circuit board 700 are stored within the housing 210, and an opening that forms an upper section of the housing 210 is blocked with a metallic cover 290.

In addition, if the sidewall of the housing 210 that has the cooling water inlet pipe 212 and outlet pipe 214 routed through the housing is regarded as a front panel, a terminal box 800 is installed and disposed on the sidewall, that is, the front panel. The terminal box 800 has DC power terminals 812 through which to receive the DC power supplied from the battery 180, a DC power terminal block 810 provided internally to the terminals 812, AC terminals 822 connecting to the first rotating electric machine 130 and the second rotating electric machine 140, and an AC terminal block 820 provided internally to the terminals 822.

The DC power terminals 810 are electrically connected to electrodes of the first capacitor module 302 and the second capacitor module 304 via a bus bar, and the AC terminal block 820 is electrically connected via another bus bar to terminals of the power modules 502 and 504 constituting the power module 500.

Figure 5:
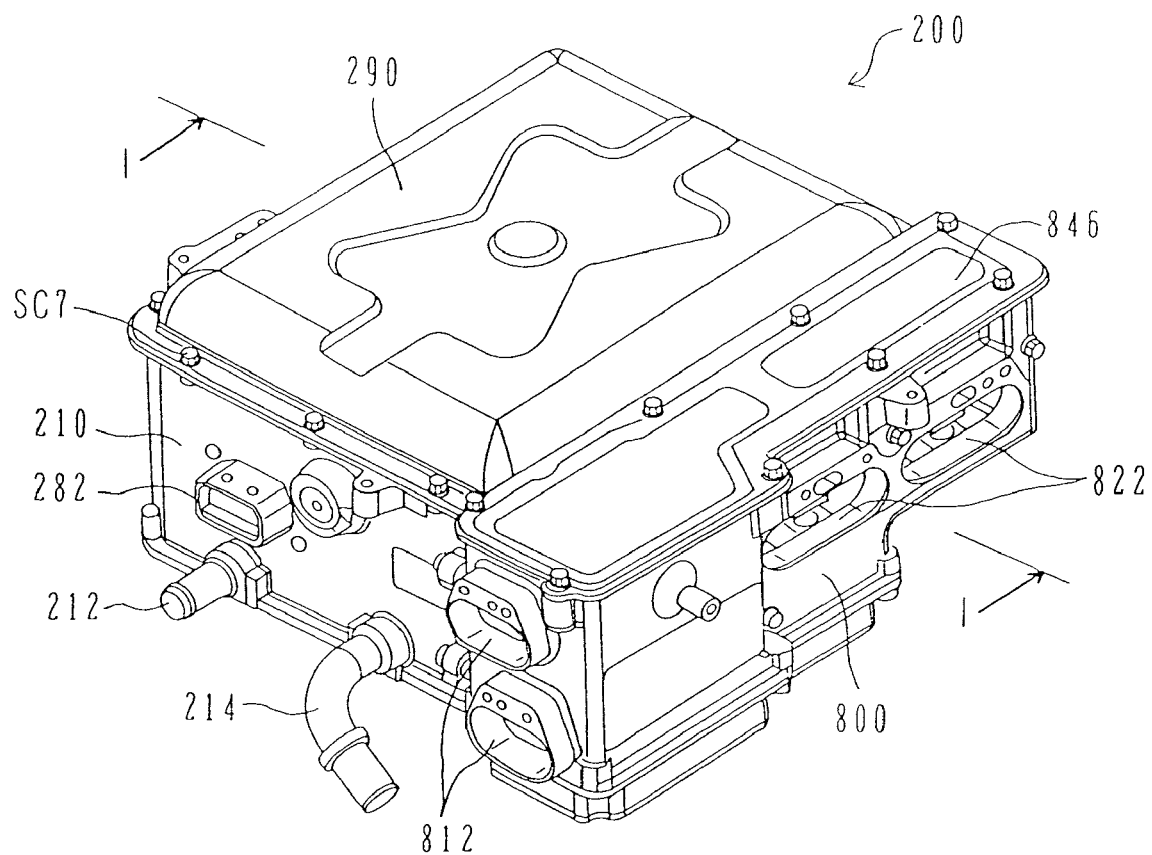
FIG. 5 is an external perspective view showing an embodiment of an electric power converter according to the present invention.
Figure 6:
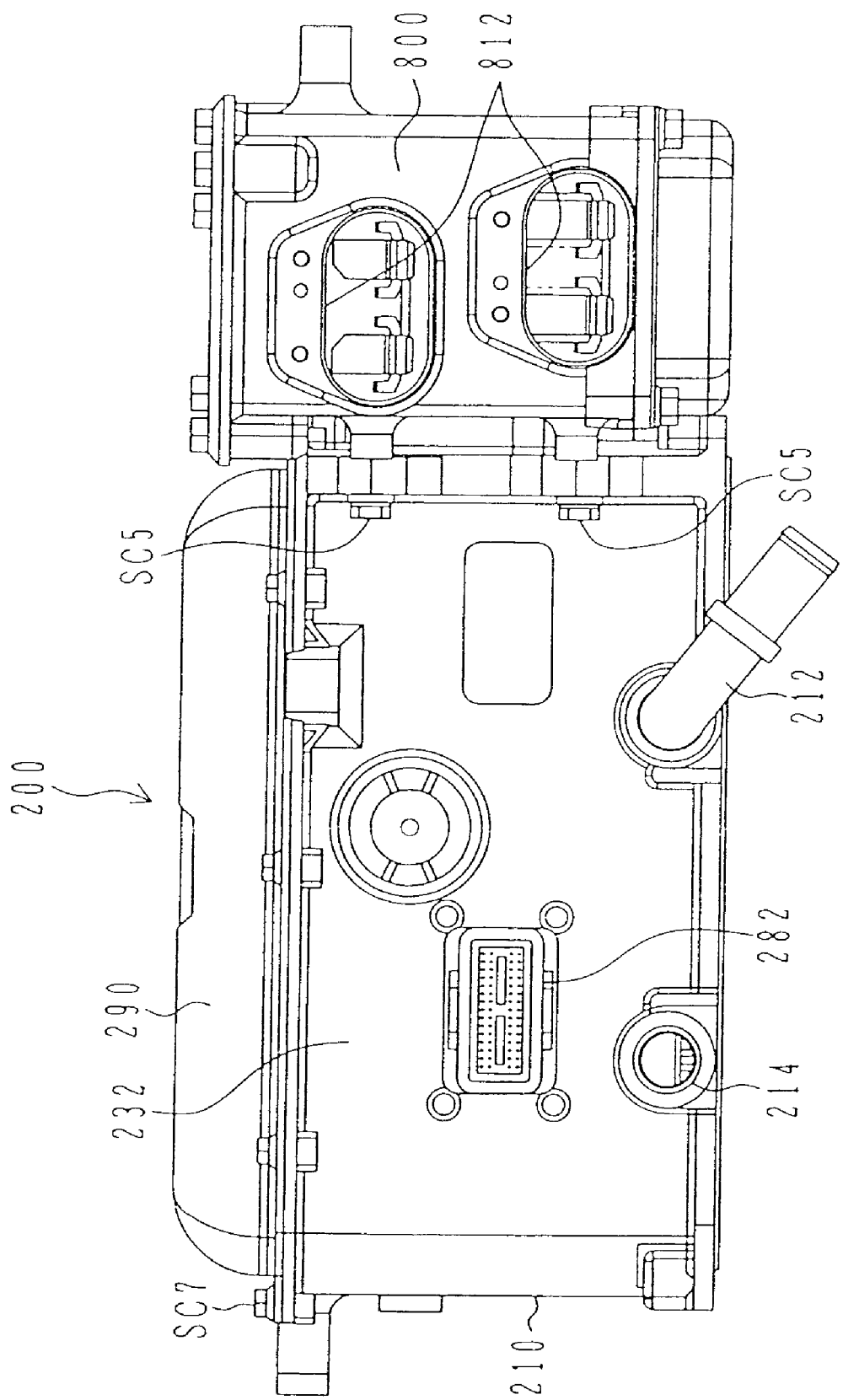
FIG. 6 is a view of the electric power converter shown in FIG. 5, when viewed from a front wall side.
Figure 7:
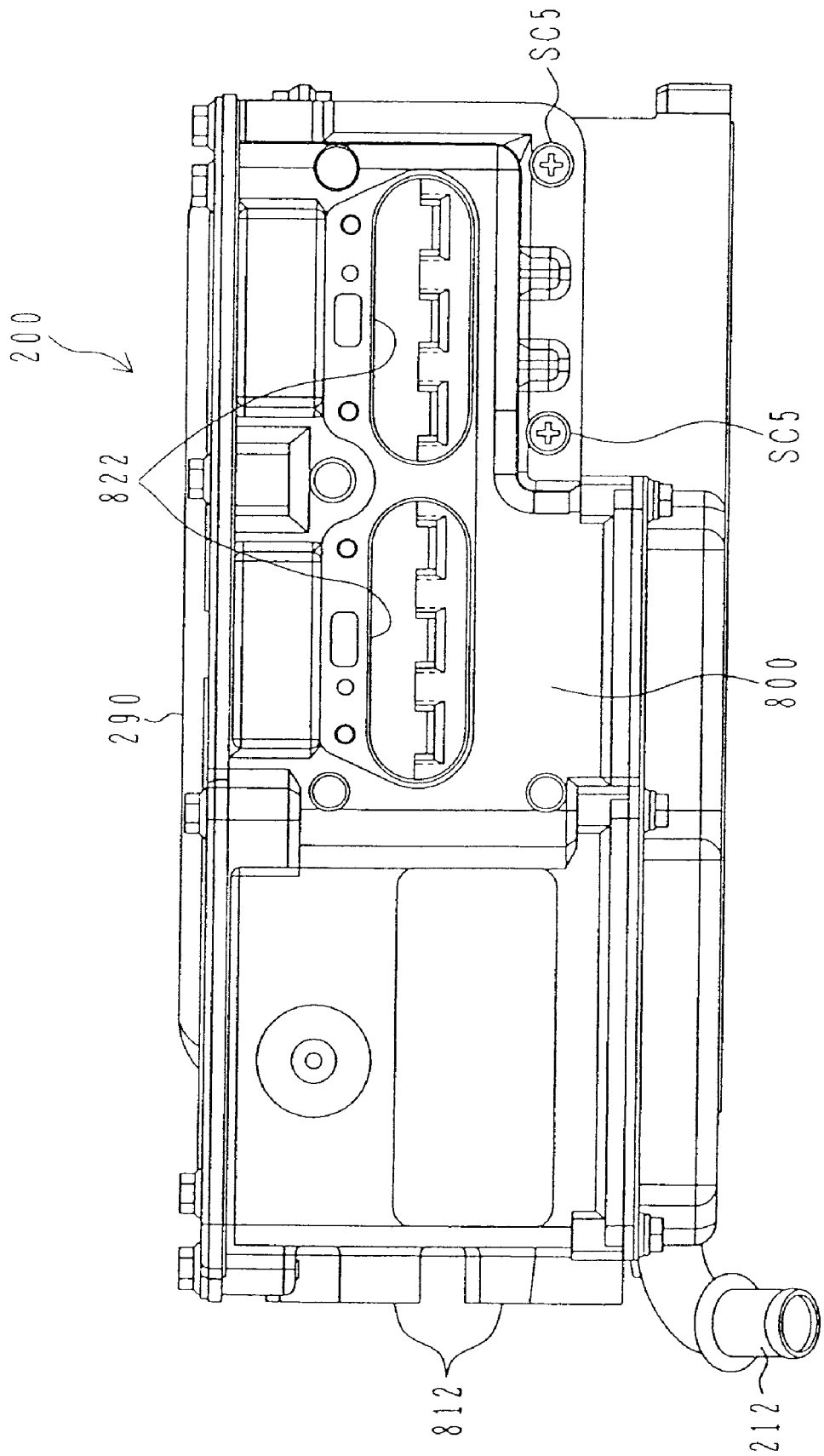
FIG. 7 is a side view of the electric power converter shown in FIG. 5, when viewed from a terminal box mounting surface.

The terminal box 800 is constructed so that its assembly will be completed when a bottom plate 844 with the DC power terminal block 810 disposed thereon, and a cover 846 are installed on a main unit 840 of the terminal box. This construction facilitates the assembly of the terminal box 800. The power converter 200 is of a compact shape, as shown in FIG. 5.

<<Constituent Members of the Power Converter 200>>

Next, a detailed configuration of the power converter 200 shown in FIGS. 2 to 7 is described below.

(Housing 210)

Figure 8:
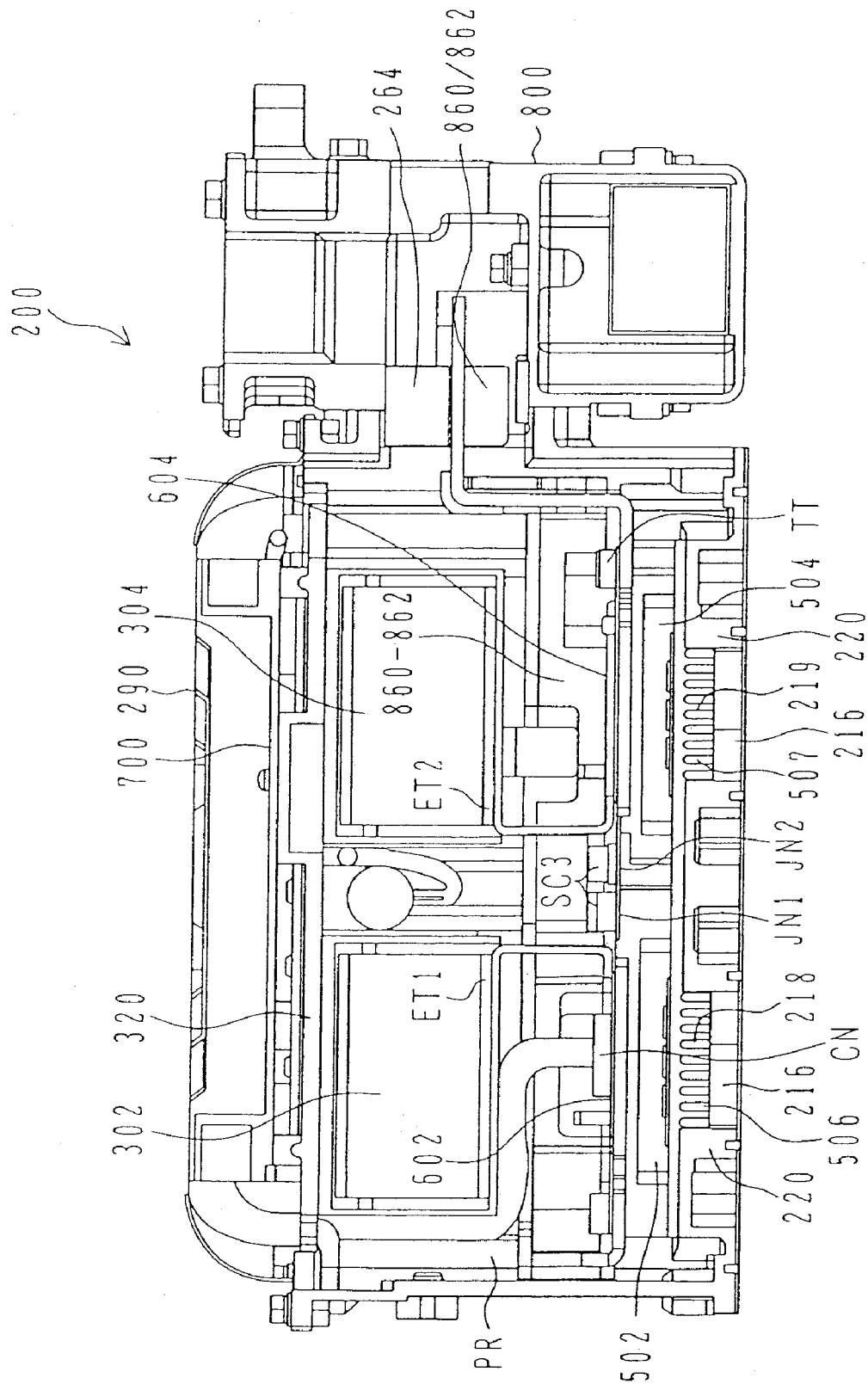
FIG. 8 is a sectional view taken along line I-I of FIG. 5.

A section taken along line I-I of FIG. 5 is shown in FIG. 8. The housing 210 is approximately a rectangular box structure made of a metallic material, for example, aluminum. The housing 210, at the bottom thereof, has a water channel formation 220 fitted with a cooling water channel, and is open atop. At a section opposite to an inlet and outlet port, the water channel in the bottom of the housing 210 is bent over to form two cooling water channels next to each other, so that cooling water circulates through the water channels. The cooling water channel bent over includes the water channel formation 220 constructed into a double structure with a space sandwiched centrally therein so that the cooling water flows through the space. An upper plate of the water channel formation 220 is formed with openings 218 and 219 along the water channels, as shown.

In a lower section of the housing 210, one pair of power modules consisting of a first power module 502 and a second power module 504 are arranged, which are arranged and immobilized at independent positions above the water channel formation 220. The housing 210 has a large number of heat release fins 506, 507 arranged next to one another on respective heat release surfaces of the first power module 502 and the second power module 504. The heat release fins 506, 507 protrude to the inward of the openings 218 and 219 in the water channel formation 220. Additionally, each of these openings is blocked with the heat release surfaces of the power modules 502 and 504, formed around the heat release fins 506 and 507. This prevents water leakage and forms an enclosed water channel 216.

Such construction efficiently cools the first power module 502 and the second power module 504. In addition, since the housing 210 is constructed so that the heat release fins 506 and 507 of the first power module 502 and the second power module 504 are inserted along the openings 218 and 219, the housing 210 has an advantageous effect in that the first power module 502 and the second power module 504 can be accurately positioned with respect to the housing.

In the housing 210, a relatively small hole 262 and a hole 264 with a relatively large area are sequentially formed next to each other (see FIG. 3). On a sidewall of the housing 210 is disposed the terminal box 800, with its internal DC power terminal block 810 being electrically connected to the internal first capacitor module 302 and second capacitor module 304 of the housing 210 via the hole 262, and with the internal AC terminal block 820 of the terminal box 800 being electrically connected to the internal first capacitor module 302 and second capacitor module 304 of the housing 210 via the hole 264 by bus bars 860 and 862. Part of the bus bars is disclosed in FIG. 8.

(Power Module 500 and Switching Driver Circuit Board 600)

Figure 9:
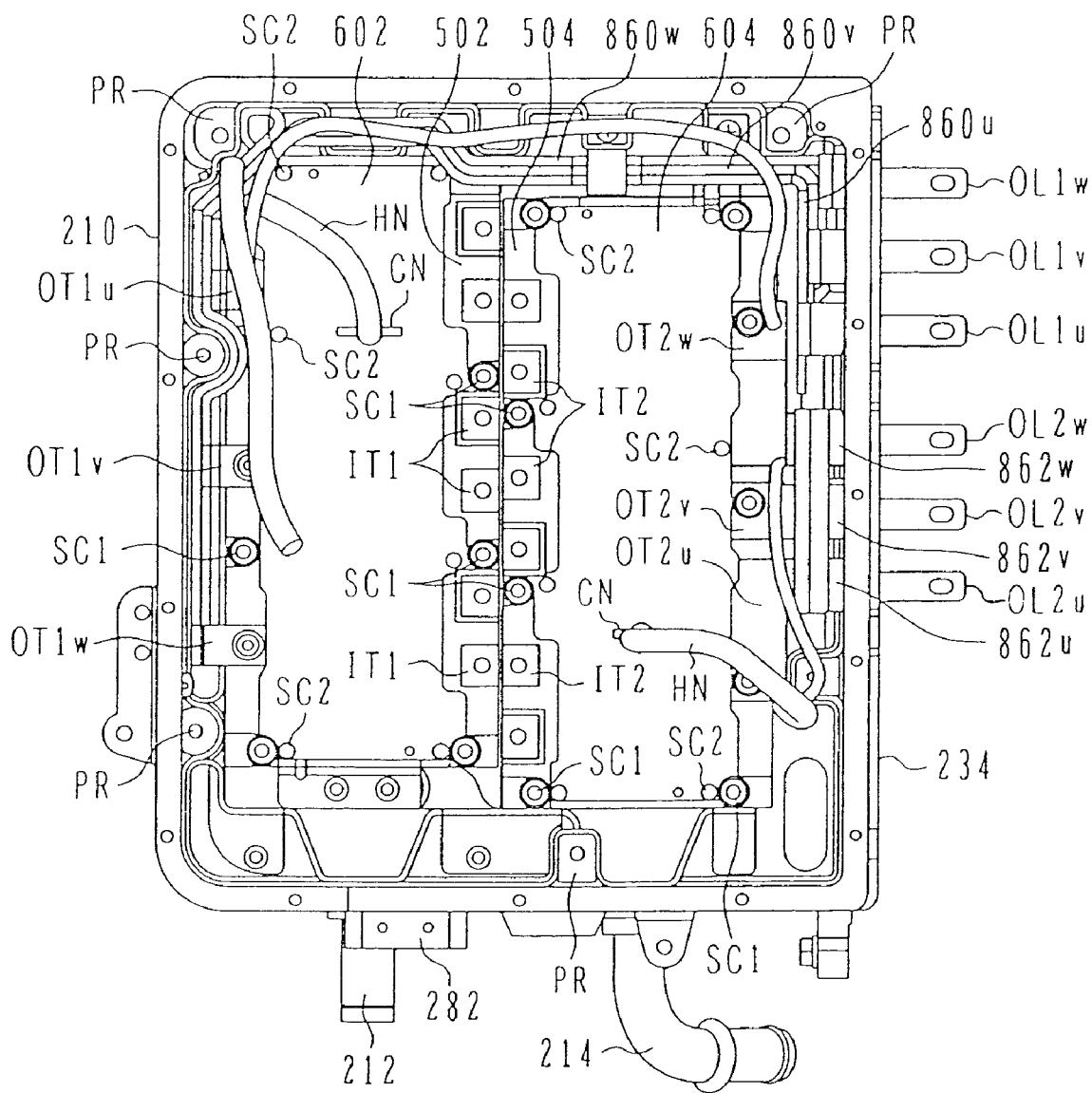
FIG. 9 is a view showing a state in which a power module and a switching driver circuit board are arranged inside a housing of the electric power converter shown in FIG. 5.

FIG. 9 is a plan view showing a state in which the power module 500 and the switching driver circuit board 600 are arranged inside the housing 210.

The first power module 502 and second power module 504 constituting the power module 500 are arranged closer to the cooling water channels than to the rotating electric machine control circuit board 700 and the capacitor modules 502 and 504, inside the housing 210. The first power module 502 and the second power module 504 are arranged in parallel to each other along the cooling water channels.

Geometrically, the first power module 502 and the second power module 504 are also of the same construction with respective DC terminals IT1 and IT2 and AC terminals OT1 and OT2 arranged to be oriented in the same direction. In this construction, if one of the two power modules (e.g., the first power module 502) is disposed in 180-degree rotated form with respect to the other power module (e.g., the second power module 504), the respective DC terminals IT1, IT2 are arranged to face each other centrally between both. Also, the AC terminals OT1 and OT2 are both arranged at a sidewall side of the housing 210. The first power module 502 and the second power module 504 are arranged at positions slightly offset with respect to each other in a longitudinal (longer-side) direction, since the respective DC terminals IT1, IT2 opposite in polarity are arranged in close proximity to each other.

In FIG. 9, the DC terminals IT1, IT2 and the AC terminals OT1, OT2 are shown at both sides of the switching driver circuit boards 602 and 604 in a lateral direction thereof, since the first power module 502 and the second power module 504 are arranged overlapping the switching driver circuit boards 602 and 604, respectively.

The DC terminals IT1, IT2 of the first power module 502 and those of the second power module 504 are electrically connected to various terminals of the capacitor modules 302 and 304. The AC terminals OT1, OT2 of the first power module 502 and those of the second power module 504 are connected to the AC terminal block 820 within the terminal box 800.

The AC terminal OT1 of the first power module 502 includes terminals OT1$u$, OT1$v$, OT1$w$ associated with a U-phase, a V-phase, and a W-phase, respectively. At a sidewall 234 of the housing 210, there are bus bars 860$u$, 860$v$, and 860$w$ directed upward after being routed from layout positions of the terminals OT1$u$, OT1$v$, OT1$w$ along one lateral side of each of the power modules 502 and 504 arranged next to each other. The terminals OT1$u$, OT1$v$, OT1$w$ connect, via the bus bars 860$u$, 860$v$, and 860$w$, to lead terminals OL1$u$, OL1$v$, OL1$w$ projecting through the hole 264 formed in major sidewall 234 of the housing 210. The bus bars 860$u$, 860$v$, and 860$w$ in the present embodiment are routed through a side opposite to the inlet and outlet ports of the water channels.

The AC terminal OT2 of the second power module 504 includes terminals OT2$u$, OT2$v$, OT2$w$ associated with the U-phase, the V-phase, and the W-phase, respectively. There are bus bars 862$u$, 862$v$, and 862$w$ directed upward at the sidewall 234 of the housing 210 after being routed from layout positions of the terminals OT2$u$, OT2$v$, OT2$w$. The terminals OT2$u$, OT2$v$, OT2$w$ connect, via the bus bars 862$u$, 862$v$, and 862$w$, to lead terminals OL2$u$, OL2$v$, OL2$w$ projecting through the hole 264.

The first capacitor module 302, the second capacitor module 304, and the rotating electric machine control circuit board 700 are arranged above the first power module 502, the second power module 504, and the switching driver circuit boards 602 and 604.

The power modules 502 and 504 have screw holes in respective peripheral sections and are fixed to the water channel formation 220 at the bottom of the housing through the screw holes by means of screws SC1. Also, the driver circuit boards 602 and 604 above the power modules 502 and 504 are fixed thereto by means of screws SC2.

In FIG. 9, as described above, the first driver circuit board 602 and the second driver circuit board 604 are constructed as circuit boards to supply switching signals to the first power module 502 and the second power module 504, respectively. The first driver circuit board 602 and the second driver circuit board 604 each have a harness HN routed outward via a connector CN provided on a main surface of the circuit board, and the harness HN is connected to the rotating electric machine control circuit board 700.

(Capacitor Module 300)

Figure 10:
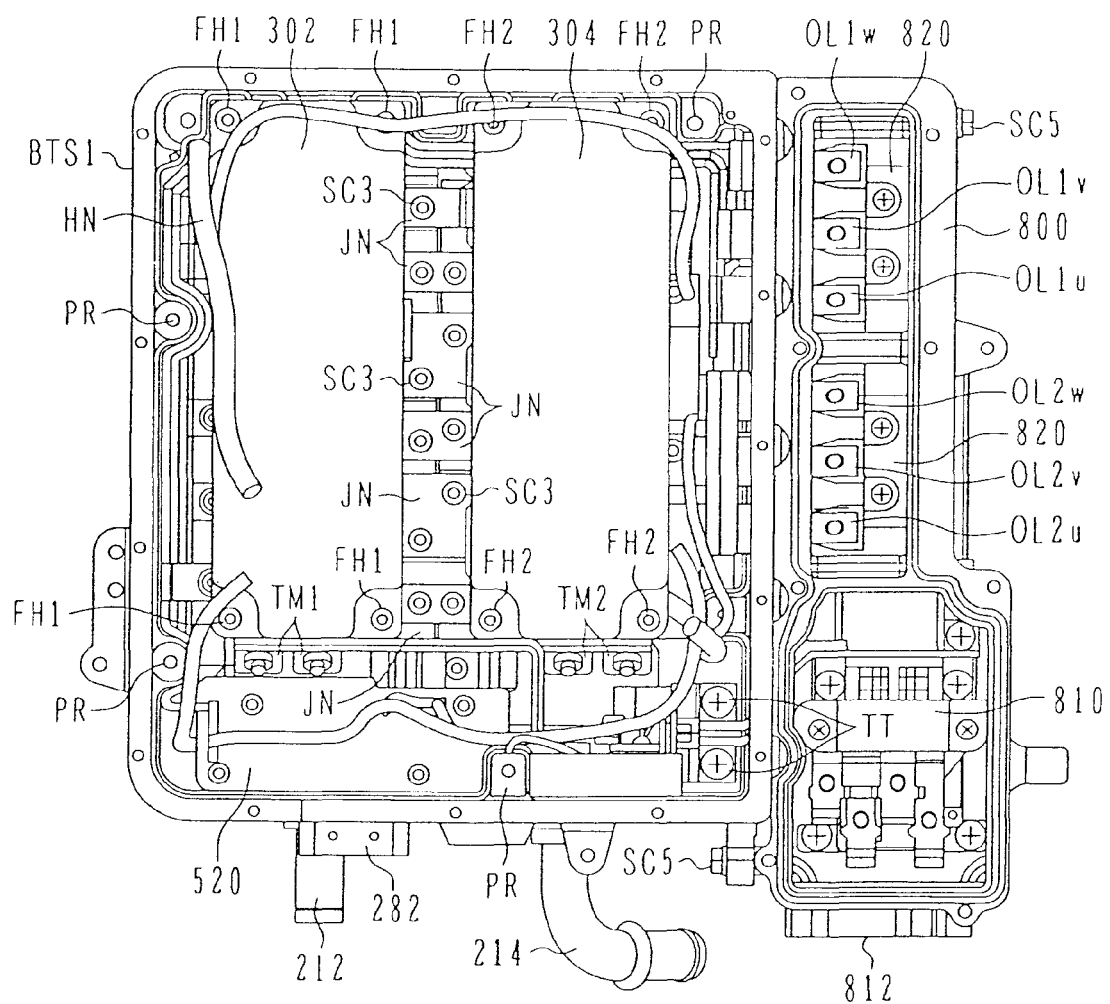
FIG. 10 is a view showing a state in which a capacitor module is disposed inside the housing of the electric power converter shown in FIG. 5.

FIG. 10 is a plan view showing a state in which the capacitor module 300 with a plurality of smoothing capacitors is disposed inside the housing 210. The capacitor module 300 includes the first capacitor module 302 and the second capacitor module 304, which are each formed with five or six film capacitors (capacitor cells) stored within a rectangular parallelepiped casing created from a resin material, for example.

As shown in FIGS. 8 and 10, the first capacitor module 302 and the second capacitor module 304 are arranged in parallel to each other, the former being disposed above the first driver circuit board 602 and the latter above the second driver circuit board 604. The first capacitor module 302 and the second capacitor module 304 are electrically connected at junctions JN (inclusive of JN1 and JN2) to the DC terminals of the first power module 502 and the second power module 504.

The first capacitor module 302 and the second capacitor module 304 are constructed so that in the power module 500, each is connected to one pair of DC terminals in a U-phase arm, one pair of DC terminals in a V-phase arm, and one pair of DC terminals in a W-phase arm. As shown in FIG. 10, therefore, the first power module 502 and the second power module 504 are electrically connected at six positions to the first capacitor module 302 and the second capacitor module 304, respectively, and the connection between the power module and the capacitor module is established in a stacked structure of both with a wide insulator interposed between wide metal conductors. This structure makes it possible to reduce inductance of an electric circuit formed between the power module and the capacitor module. Reducing the inductance yields an effect in that a temporary rise in voltage due to switching of the power module can be suppressed and makes it possible to correspondingly shorten a switching time and hence to realize control that reduces the amount of heat generated.

In FIG. 10, the first capacitor module 302 and the second capacitor module 304 have one pair of electrodes TM1 and TM2, respectively, that are connected to the DC power terminal block 810, and the two capacitor modules are connected to an external DC power supply via the electrodes. The electrodes TM1 and TM2 of the first capacitor module 302 and the second capacitor module 304 are all arranged at the water channel inlet and outlet side of the housing 210. That is to say, since these electrodes are arranged at the same side as that having the DC power terminal block 810 in the terminal box 800, electrical wiring to the high-voltage battery that is the external DC power supply becomes easy and working efficiency improves.

In FIG. 10, fixing holes FH1 and FH2 each with an embedded nut are formed at respective four corners of the first capacitor module 302 and the second capacitor module 304, and these capacitor modules are fixed to the retaining plate 320 by means of screws SC4 (see FIG. 11) that are threaded into fixing holes FH1, FH2 of the retaining plate 320 through holes associated with the fixing holes FH1, FH2. That is to say, the first capacitor module 302 and the second capacitor module 304 are fixed in a suspended condition to the retaining plate 320.

(Retaining Plate 320)

Figure 11:
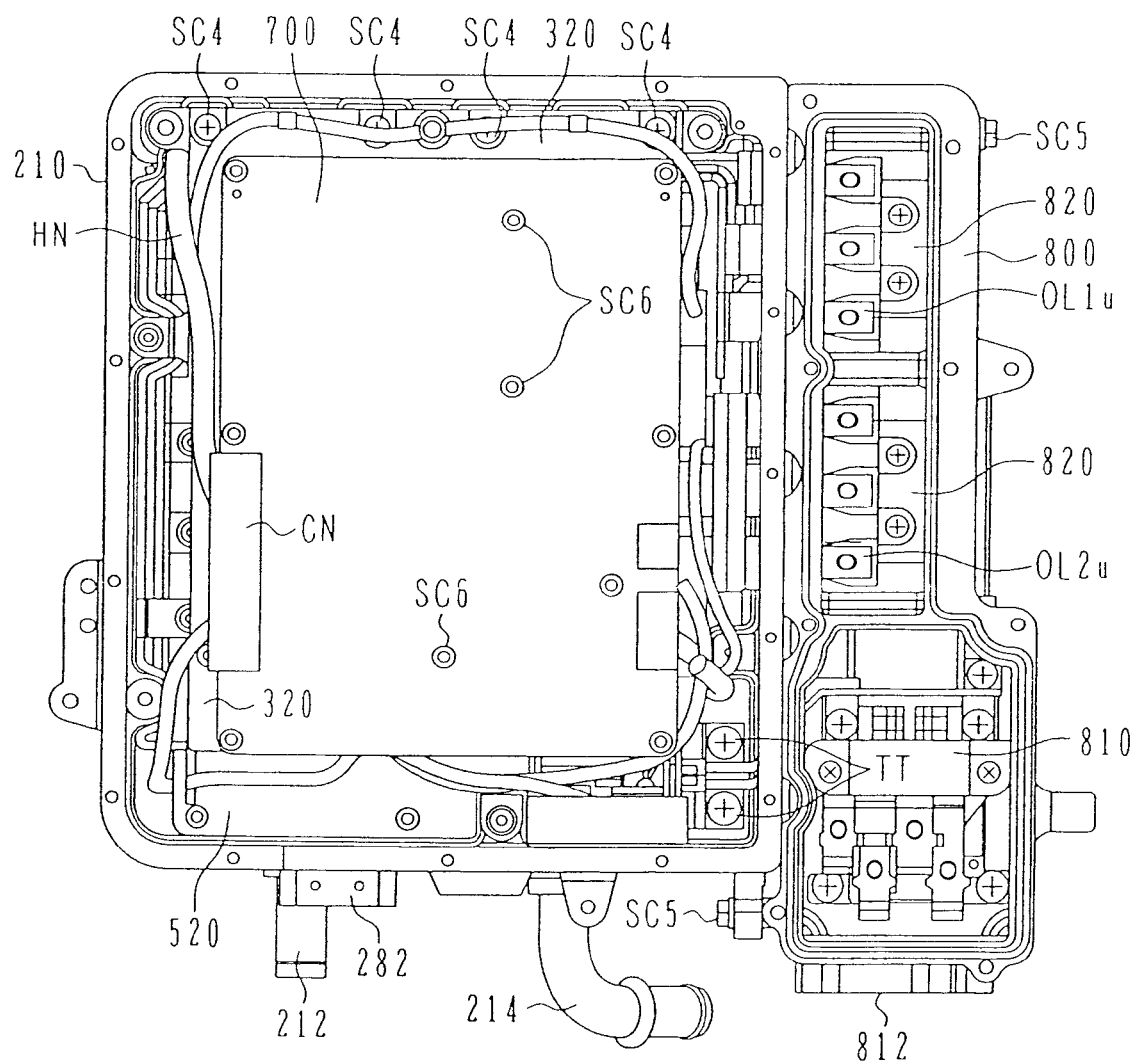
FIG. 11 is a view showing a state in which a rotating electric machine control circuit board is disposed inside the housing of the electric power converter shown in FIG. 5.

FIG. 11 is a plan view of the rotating electric machine control circuit board 700 existing when it is mounted on the retaining plate 320 disposed inside the housing 210. The retaining plate 320 is constructed as a control circuit board bracket having the rotating electric machine control circuit board 700, and is fixed to the housing 210, above the capacitor module 300.

A plurality of almost equally spaced projections PR (see FIGS. 9 and 10) are formed peripherally on an inner surface of the housing 210. The retaining plate 320 is supported from its periphery by upper edges of the projections PR and fixed using the screws SC4 threaded into the upper edges of the projections PR through the screw holes formed on the periphery of the retaining plate 320.

Since the retaining plate is supported by the large number of peripheral projections with an upper wide area, the housing 210 and the retaining plate 320 are placed in a favorable, thermal conducting state. As with the housing 210, the retaining plate 320 is formed of a metallic material of high heat conductivity, such as aluminum, in order to improve mechanical strength of the retaining plate. Also, the retaining plate 320 is formed with patterned depressions and projections on the mounting surface for the rotating electric machine control circuit board 700.

The depressions in the retaining plate 320 are formed at sections opposed to an electrical wiring layer or other regions on the face of the rotating electric machine control circuit board 700 that is closer to the retaining plate 320. Such layout of the depressions makes it possible to prevent the wiring layer or other regions from coming into contact with the retaining plate 320, and hence to prevent electrical short-circuiting of the wiring layer or the like. Particularly the sections at which the AC terminals OT1 and OT2 of the power modules 502 and 504, respectively, are provided have a concave shape. A concave section is also formed at the DC power supply connections. In the depressed sections on the face of the retaining plate 320 that is directed towards the rotating electric machine control circuit board 700, a plurality of bosses BS are formed in scattered form as shown in FIG. 3, and at these bosses, the rotating electric machine control circuit board 700 is fixed to the retaining plate 320 by means of screws SC6 (see FIG. 16) that are threaded into the screw holes formed in the rotating electric machine control circuit board 700.

As described above, the first capacitor module 302 and second capacitor module 304 arranged below the retaining plate 320 are fixed thereto using the screws SC4 threaded into the fixing holes FH1, FH2 at the four corners of both capacitor modules through the screw holes in the retaining plate 320.

Since the first capacitor module 302 and the second capacitor module 304 are thus constructed to be fixed to the retaining plate 320 that abuts the housing 210, the capacitor modules 302 and 304 produce an excellent heat-releasing effect in that the heat stemming from both capacitor modules will be easily conducted into the housing 210 through the retaining plate 320. Also, since the housing 210 is cooled by the cooling water channels, temperature rises of the capacitor modules 302 and 304 can be minimized.

(Rotating Electric Machine Control Circuit Board 700)

FIG. 11 is a plan view of the rotating electric machine control circuit board 700 with the retaining plate 320 mounted thereon inside the housing 210. Electronic components for small signals are mounted with a connector CN on the rotating electric machine control circuit board 700. This connector CN is connected via a harness HN to connectors CN mounted on, for example, the switching driver circuit boards 602 and 604. The rotating electric machine control circuit board 700 has screw holes formed in various regions at four corners of its periphery and in a central region exclusive of the periphery. The central region detours a region in which components are mounted, and a region in which an electrical wiring layer for connecting the components is formed. The rotating electric machine control circuit board 700 is constructed so that it can be fixed to the retaining plate 320 by the screws SC6 threaded thereinto through the above screw holes. This construction of the rotating electric machine control circuit board 700, compared with, for example, a construction in which the control circuit board is fixed at its marginal portions only to a frame, makes it possible to avoid the adverse event that a middle section of the board deflects or warps for reasons such as vibration. As described above, since the rotating electric machine control circuit board 700 is constructed to be mounted on the retaining plate 320 that abuts the housing 210, the rotating electric machine control circuit board 700 produces an excellent heat-releasing effect in that the heat stemming therefrom will be easily conducted into the housing 210 through the retaining plate 320.

(Cover 290)

The cover 290 includes a cover member that blocks the opening in the housing 210 after sequential storage of the first power module 502, the second power module 504, the switching driver circuit boards 602, 604, the first capacitor module 302, the second capacitor module 304, and the retaining plate 320, and the rotating electric machine control circuit board 700 into the housing 210.

(Cooling Structure of the Power Modules 502 and 504)

Figure 12:
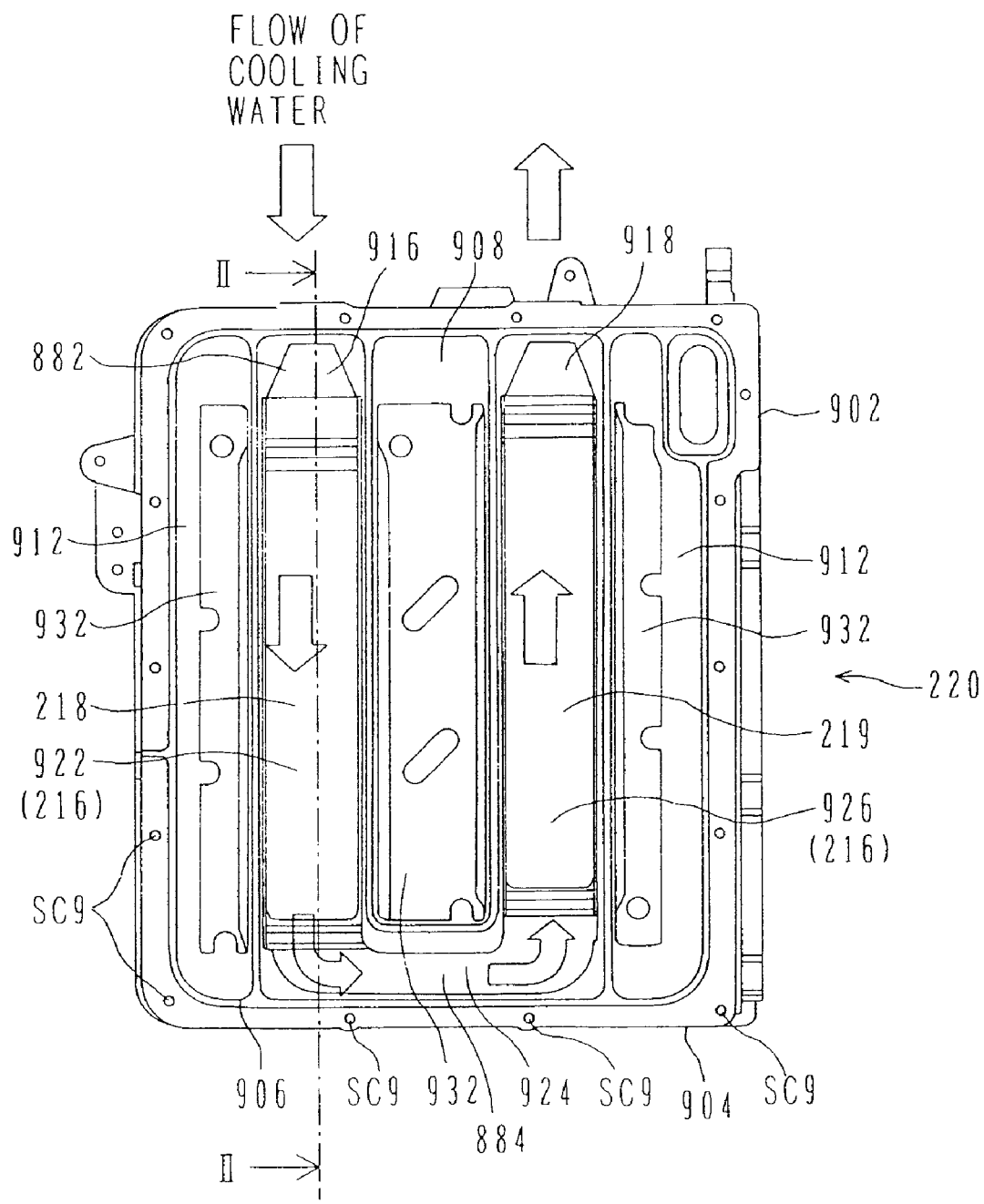
FIG. 12 is a top view of a water channel formation in the housing of the electric power converter in FIG. 5, showing the water channel formation existing when viewed from a bottom side without a lid of the formation.

As described above, cooling water channels are formed at a bottom section of the power converter 200, near one face thereof. FIG. 12 is a bottom structural view of the housing 210, showing a water channel retaining member 902 that is one part of a water channel formation 220 forming the bottom of the housing. The water channel retaining member 902 includes a peripheral section 904 formed to install a bottom plate 934 which serves as another water channel formation 220, and the peripheral section 904 has a large number of holes SC9 for screw locking. The reference number is assigned only to some of the holes, and others are shown without the number. The peripheral section 904 has a sealing groove 906 inside to prevent water leakage, and the water channel retaining member 902 internal to the sealing groove 906 has an outer region 912 at both sides. In addition, a first water channel 922, a second water channel 926, and a central section 908 are provided, the water channels 922 and 926 being the cooling water channels 216 described in FIG. 8. Fitting an O-ring or a sealing member such as rubber into the sealing groove and then locking each screw hole SC9 with a screw provides a sealing function to the sealing groove. Cooling water is supplied to an inlet port 916 of the water channel 922 (described earlier as 216), and the cooling water flows through the first water channel 922 in a direction of an arrow. The flow of the cooling water changes into a U-shape inside a bent pathway 924, then the cooling water flows through the second water channel 926 in a direction of an arrow, and the cooling water is discharged from an outlet port 918 of the water channel 926. The first water channel 922 and the second water channel 926 are holed as openings 218 and 219, respectively. Installing the bottom plate 934 described below per FIG. 13 forms the water channels 922 and 926.

The central section 908 between the first water channel 922 and the second water channel 926, and the outer regions 912 between the first water channel 922 and the peripheral section 904 and between the second water channel 926 and the peripheral section 904, each have dents 932 to reduce aluminum-diecasting thickness.

Figure 13A:
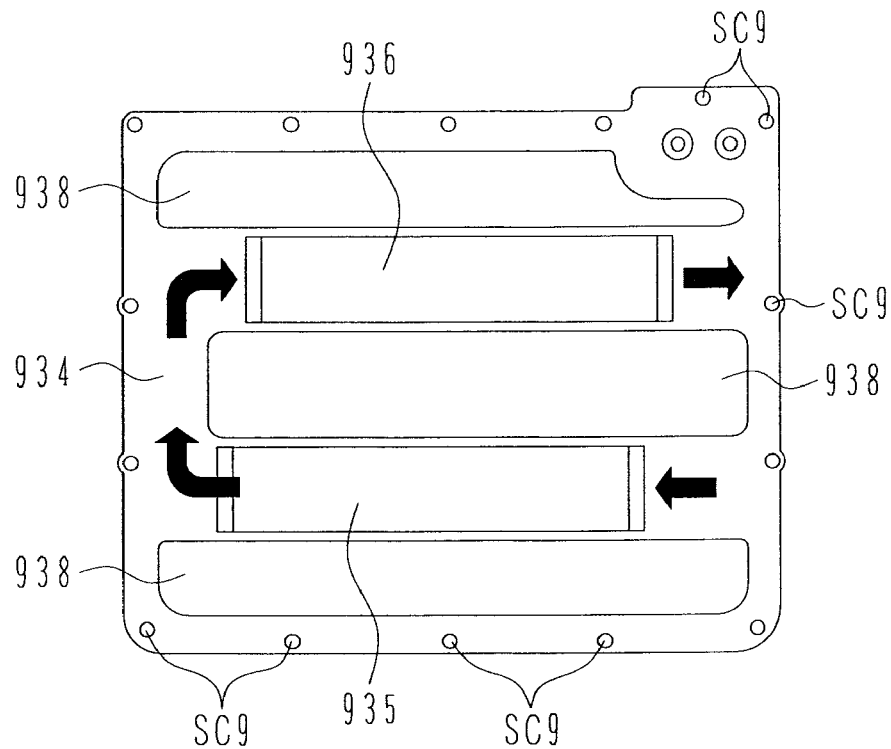
FIG. 13A is a plan view of the lid of the water channel formation.
Figure 13B:
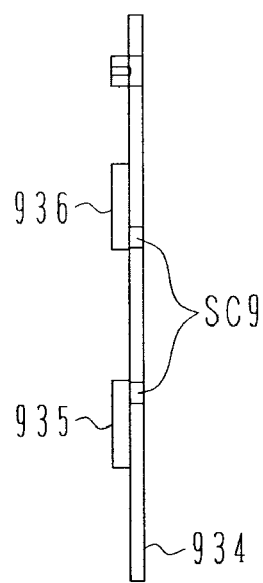
FIG. 13B is a side view of the lid of the water channel formation.

The bottom plate 934 for blocking up the bottom of the housing 210, shown in FIG. 12, is shown in FIGS. 13A and 13B. The bottom plate 934 and the water channel retaining member 902 constitute the water channel formations provided to form the water channels. Inside the water channels, water flows as indicated by arrows in FIG. 13A. The bottom plate 934 has a lot of screw holes SC9 and is screwed down via the screw holes SC9 in the peripheral section 904 of the water channel retaining member 902. The bottom plate 934 also has a first convex 935 and a second convex 936, the first convex 935 is inserted into the water channel 922, and the second convex 936 is inserted into the water channel 926. Dents 938 are provided to reduce the aluminum-diecasting thickness.

Figure 14:
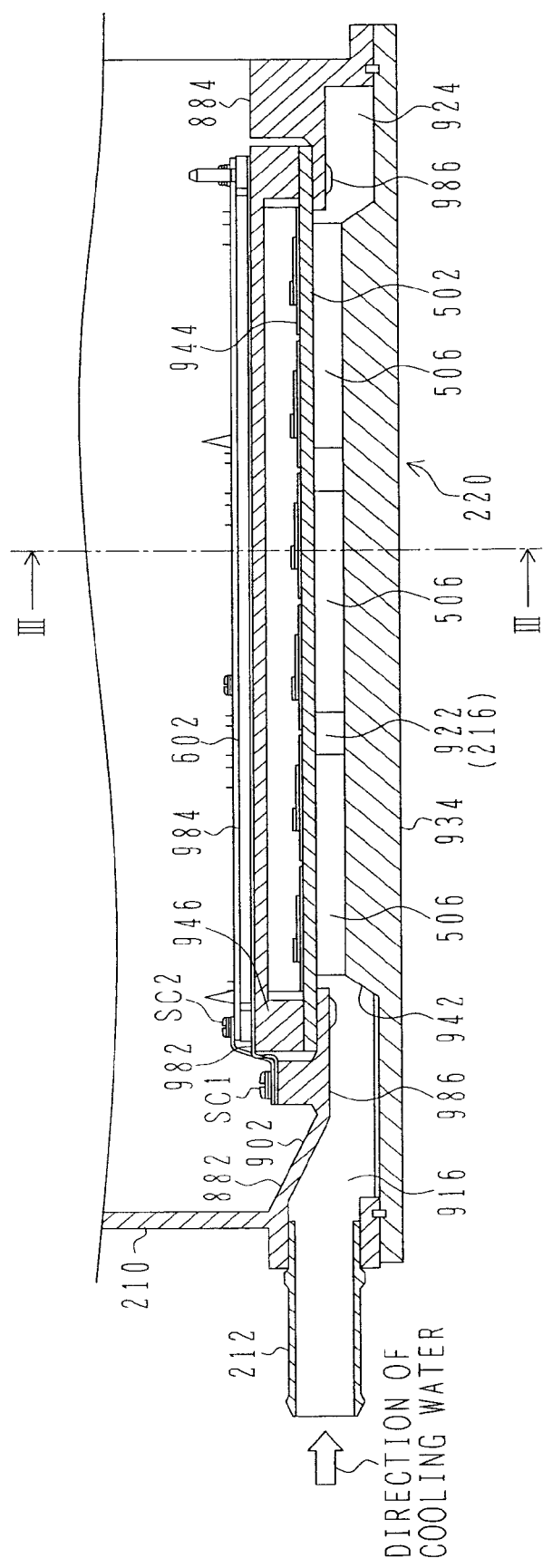
FIG. 14 is a sectional view taken along line II-II of FIG. 12.

A sectional view of the water channel 922, taken along line II-II in FIG. 12, is shown in FIG. 14. The water channel 926 is also of much the same shape. The water channel retaining member 902 in FIGS. 12, 13, and 14 includes the water channels 922 and 926 arranged in parallel to each other. Cooling water is introduced from the inlet pipe 212 (omitted from FIG. 12) into the inlet port 916. The inlet port 916 of the water channel includes a ceiling 882 formed using metal members integrated with the housing 210, and both sides of the water channel include other metal members integrated with the housing 210. The latter metal members are sidewalls 988 and 990 shown in FIG. 15. As shown in FIG. 14, at a section internal to the inlet pipe, the water channel is progressively increased in width, whereas the water channel is progressively reduced in depth. This structure creates a smooth flow of cooling water, makes swirling less prone to occur, and reduces fluid resistance. The water, once passed through the inlet port, is introduced into the water channel having an opening. When the convex 935 shown in FIG. 13 is provided at the bottom of the water channel having an opening, the bottom of the water channel will correspondingly rise and depth thereof will be greater than height of the heat release fins. The height of the heat release fins ranges from 6 millimeters to 8 millimeters, and the depth of the water channel is up to 10 millimeters, desirably, up to 9 millimeters.

The opening 218 is disposed at a side opposite to the convex 935 of the water channel formation 220, and the power module 502 is fixed to the opening 218 by means of the screws SC1 so that the heat release fins 506 provided on a metallic base 944 of the power module 502 jut out towards the opening 218. The power module 504, although not shown, is fixed to the opening in the water channel formation 220 forming the other water channel 926 disposed in parallel to the above water channel 922. This method of fixing both power modules improves heat exchange efficiency between the heat released from the heat release fins, and the water that is a cooling medium. In addition, at the bends of the juxtaposed water channels 922, 926 that are connections therebetween, the depth of the water channels is greater than at where the heat release fins 506 jut out, so that fluid resistance is reduced and the flow of the cooling water is improved.

The power module 504 has essentially the same structure as that of the power module 502, and is also fixed in almost the same way, so the power module 502 is described in detail below as a representative. A plurality of heat release fins 506 (in the present embodiment, three units) jut out from the opening 218, towards the water channel 922. The heat release fins 506 are provided on one face of the metallic base 944, and semiconductor chips are provided on another face of the metallic base 944. The semiconductor chips are hermetically sealed in a resin casing 946. This construction is also the same in a relationship between the power module 504 and the water channel 926.

As shown in FIGS. 9 and 14, the power module 502 is fixed together with a metal plate 982 via the screws SC1 to the water channel formation that forms the water channel. In the present embodiment, the power module 502 is fixed to the water channel cover 882 formed integrally with the housing 210. Screw locking of the power module 502 blocks the opening 218 of the water channel 922, at the heat release surface of the power module 502. A hermetic sealing member, for example, an O-ring 986 is provided between the heat release surface of the water channel 922 and the water channel formation around the opening. This forms the structure that makes it possible to prevent water leakage.

A heat release plate 984 made of a metal or of a relatively soft resin material excellent in heat conductivity is provided facing the metal plate 982, and the driver circuit board 602 is provided facing the heat release plate 984. Heat from the driver circuit board 602 is transmitted to the water channel formation via the heat release plate 984 and then transferred to the cooling water. Increases in the temperature of the driver circuit board 602 are minimized. The above construction, operation, and advantageous effects also apply to the power module 504 and the driver circuit board 604.

Figure 15:
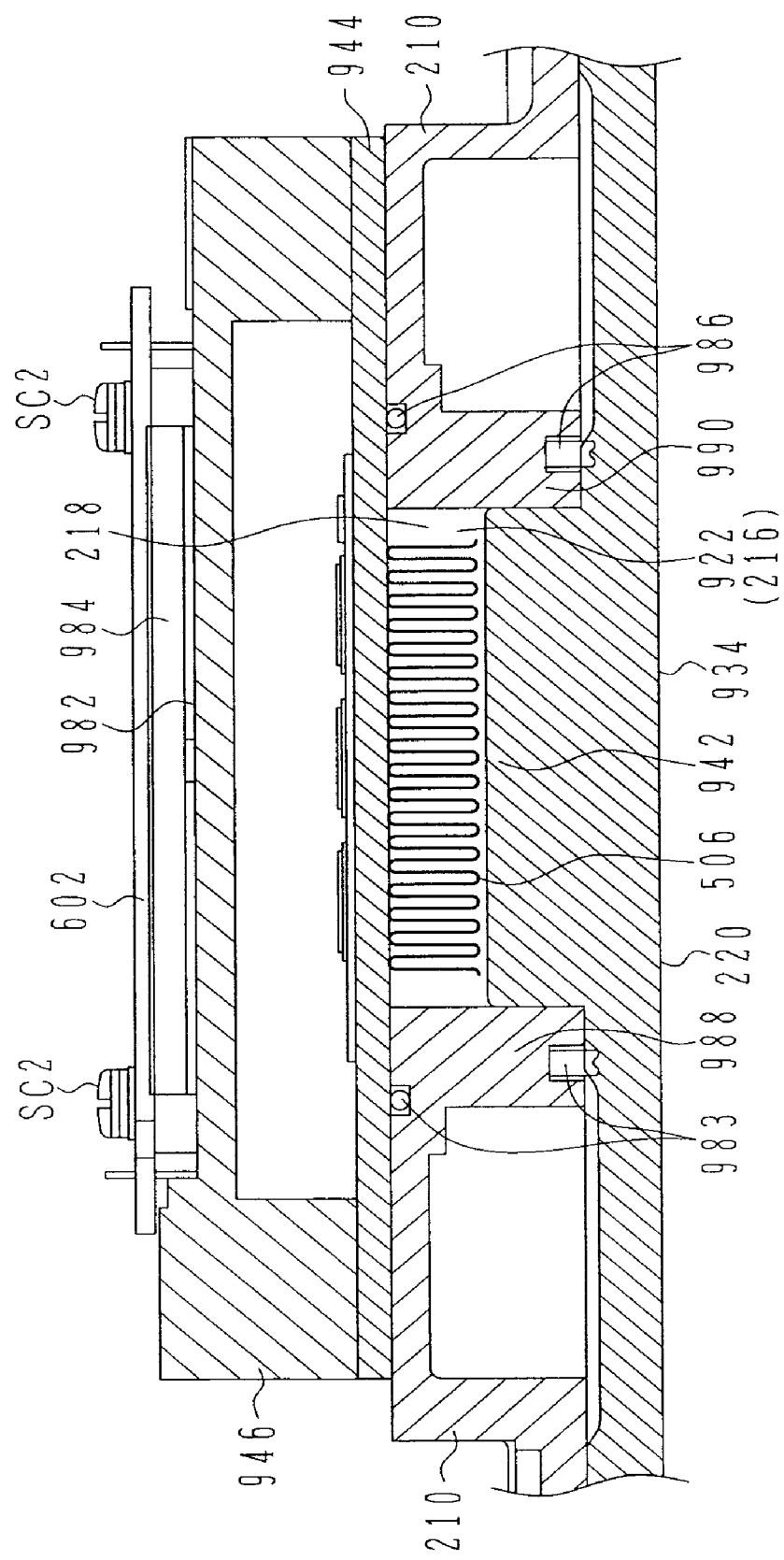
FIG. 15 is a sectional view taken along line of FIG. 14.

FIG. 15 is a partial, enlarged view of section III-III in FIG. 14. The water channel 220 adapted to form the water channel 922 includes the bottom plate 934 at bottom. Both sides of the water channel 922 are formed by side plates 988 and 990 integrated with the housing 210. Hermetic sealing of connections between the side plates 988, 990 and a lower section of the water channel formation 220, is accomplished by disposing a hermetic sealing member, for example, a sealing member 986 formed by an O-ring or a gasket wider than the O-ring. Also, as described above, the heat release surface of the metallic base 944 of the power module 502 serves to hermetically seal the opening 218 in the water channel 922. A hermetic sealing member, for example, the sealing member 986 formed by an O-ring, a gasket, or the like, is provided to seal the above opening. A plurality of semiconductor chips are fixed to the face opposite the above-mentioned face of the metallic base 944, and are hermetically sealed by the resin casing 946. Above the power module 502, as described above, the driver circuit board 602 is fixed by the screws SC2, with the heat release plates 982 and 984 interposed between the circuit board and the screws.

In the above description, as shown in FIG. 14, the water channel is deep at the inlet, outlet, and bends thereof, and the section where the heat release fins are inserted is shallower than these sections of the water channel. That is to say, the depth of the water channel at the insertion section of the fins is slightly greater than the height thereof. In the present embodiment, as described above, the height of the fins ranges from 6 millimeters to 8 millimeters and the depth of the water channel is up to 10 millimeters, desirably, up to 9 millimeters. The above construction, operation, and advantageous effects also apply to the power module 504 and the water channel formation including the water channel.

(Power Modules)

Figure 16:
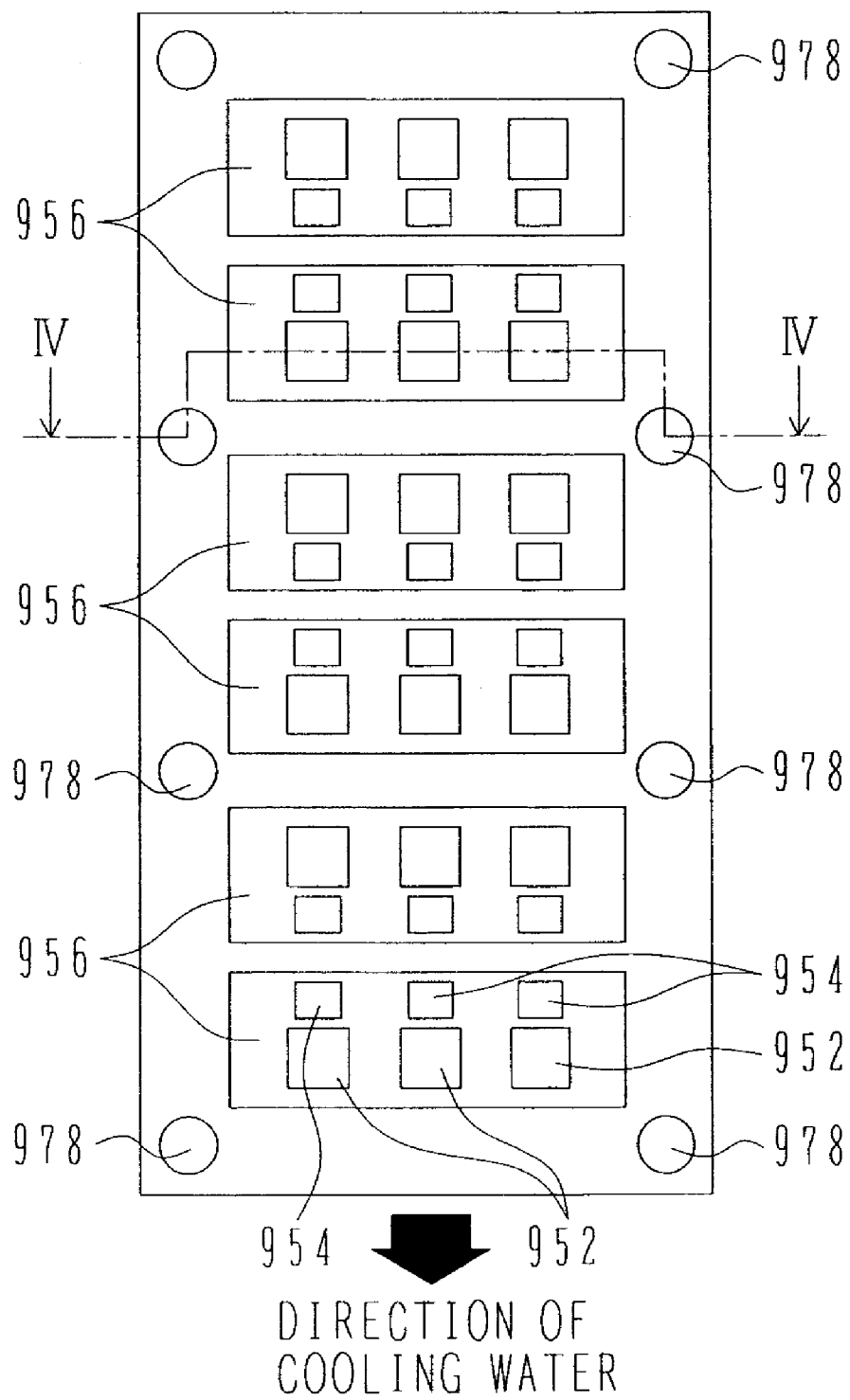
FIG. 16 is a view showing the power module according to the embodiment, a resin lid of the power module being removed.
Figure 17:
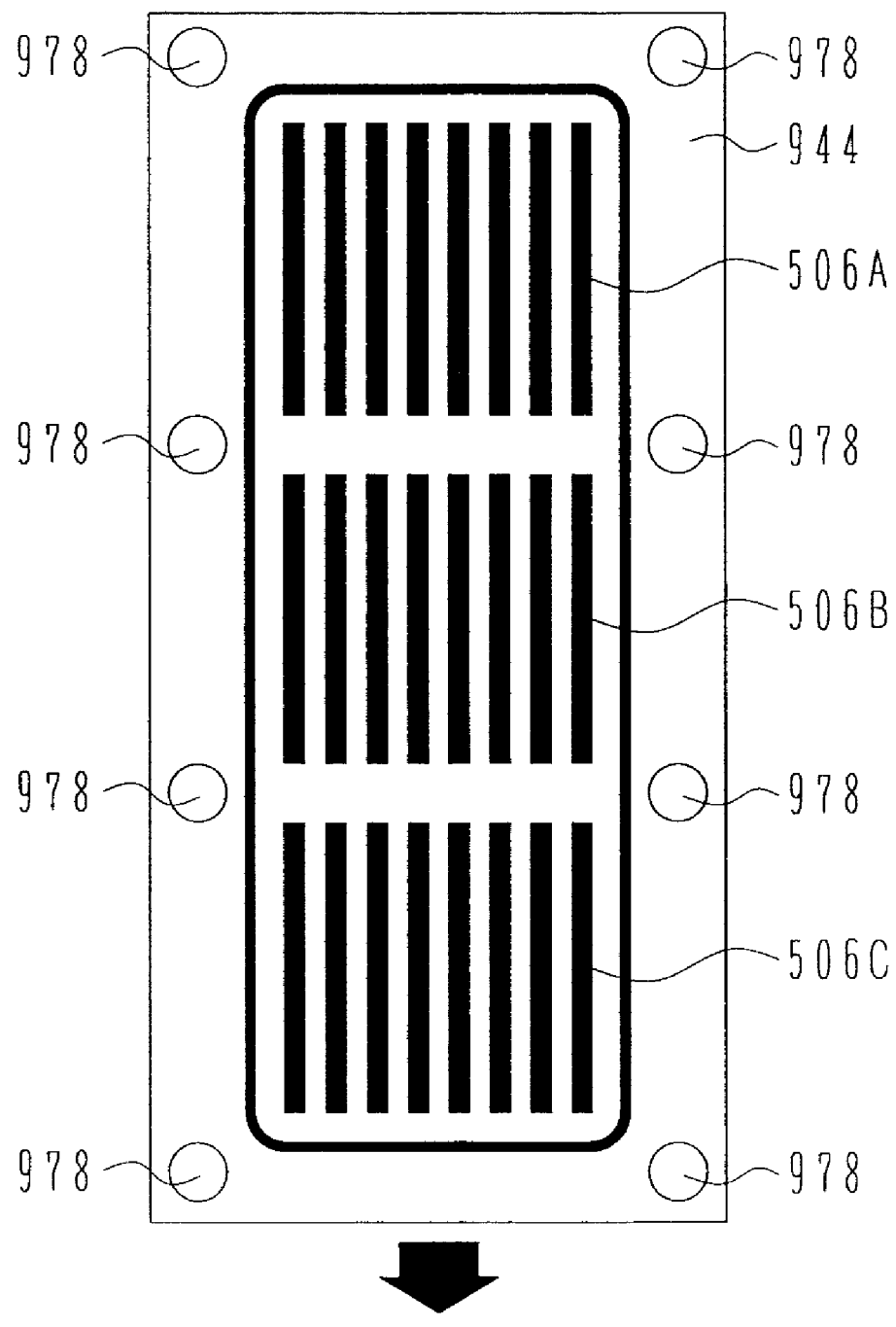
FIG. 17 shows the power module according to the embodiment, when viewed from its fins.
Figure 18:
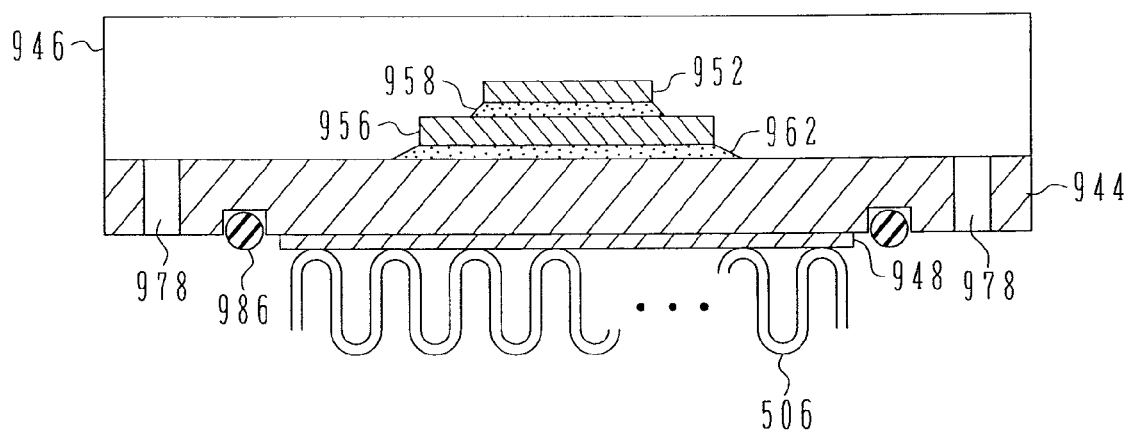
FIG. 18 is a sectional view taken along line IV-IV of FIG. 16.

FIG. 17 shows the power module 502 or 504 existing when viewed from the fins. FIG. 16 shows the power module 502 or 504 whose resin casing 946 is removed. Section IV-IV in FIG. 16 is shown in FIG. 18. Although three semiconductor chips will be shown in an actual sectional view, one semiconductor chip only is shown in enlarged form in FIG. 16. As shown in FIG. 17, three sets of heat release fins, 506A, 506B, and 507C, are provided on the heat release surface of the metallic base 944. On this heat release surface, an O-ring or a gasket is provided as a sealing member 86 to prevent cooling water leakage from the water channel. Pressing the heat release surface of the metallic base 944 firmly against the opening in the water channel 922 (216) or 926 (216) by using screws or the like makes it possible to block the opening with the metallic base 944, thus preventing the cooling water from the water channel.

As shown in FIG. 18, the heat release fins are fixed using a brazing material 948. Brazing with this material is conducted at a temperature from 600 to 700 degrees Centigrade. On one face of the metallic base 944, an electrical dielectric substrate is bonded via a second soldering layer 962 for each of the three sets of heat release fins, as shown in FIG. 18.

The metallic base 944 is formed of an alloy that uses copper as its principal constituent and contains an impurity. After brazing, the heat release fins 506 are, desirably, at least HV50 in hardness and at least 200 W/mK in heat conductivity. The thickness of the metallic base 944 ranges from 2 millimeters to 4 millimeters. Also, a departure from planarity of the metallic base section under the associated dielectric substrate or between the fixing screw holes 978 is desirably within ±0.2 mm, and optimally, within ±0.1 mm. In addition, errors in planarity under the six dielectric substrates that are the semiconductor chips constituting the inverters are desirably ±0.4 mm, and optimally, within ±0.3 mm. If an impurity harder than copper is mixed with copper, hardness will increase with each increase in mixing ratio. The heat conductivity of the entire metallic base, however, will decrease since the above impurity is typically lower than copper in heat conductivity. The above hardness and heat conductivity values, therefore, are desirably maintained by adjusting a rate of the impurity. Besides, the metallic base is desirably nickel-plated to a thickness of about 3-9 μm. As shown in FIG. 18, one face of the metallic base has a brazed heat release fin 506 and another face has a soldered dielectric substrate 956 that uses a semiconductor chip. In this case, surface roughness of the metallic base can be properly maintained by providing appropriate plating thickness to the metallic base that may be damaged on the surface of the copper. In the present embodiment, the surface roughness of the metallic base sections in at least a mounting region of the dielectric substrate and in a contact region of the O-ring desirably satisfies "Ra=3.2" (Ra: roughness average).

(Manufacture of the Semiconductor Modules)

As shown in FIG. 18, the base plate of a copper-based alloy that satisfies the above conditions has a metallic heat release fin 506 brazed at a temperature from 600 to 700 degrees Centigrade. The brazing temperature is likely to reach 800 to 900 degrees in some cases. If the metallic base is too soft, the brazing operation will deteriorate planarity, making subsequent bonding of the dielectric substrate 956 difficult. After-brazing characteristics of at least HV50 in hardness and at least 200 W/mK in heat conductivity can be achieved by selecting an appropriate impurity content. As shown in FIG. 16, three heat release fins, 506A to 506C, are brazed.

In another processing step, a semiconductor chip 952 is bonded onto each dielectric substrate 956 by hot soldering. A first solder layer 958, the layer created in this step, is used to fasten the semiconductor chip 952 and the dielectric substrate together. This hot solder layer is not melted by cold solder bonding with a second solder layer 962. As shown in FIG. 16, three diode chips 954 and three IGBP chips 952 are bonded onto one dielectric substrate 956. In order to avoid the complexity of illustration, one dielectric substrate 956 only is shown with a reference number, and others are shown without numbering. When two opposed dielectric substrates, each with three diode chips 954 and three IGBP chips 952, are arranged in parallel to each other, one of three phases (U, V, W) is formed for one fin that has been bonded onto a reverse face of the metallic base 944. The metallic base 944 in FIG. 16 includes three sets of dielectric substrates of the above opposed parallel arrangement in order to constitute inverters for the three phases. Each dielectric substrate is of the same structure.

After the above processing step, the six dielectric substrates 956 each with three bonded semiconductor chips 952, and the metallic base 944 with three heat release fins 506 are bonded with the cold solder 962 so as to establish the positional relationship shown in FIGS. 16 and 17. That is to say, bonding is conducted to obtain the positional relationship with one fin brazed onto the opposite face of the metallic base 944 for two dielectric substrates. Of all sections shown in FIG. 18, the section between the heat release fin 506 and the metallic base 944 is the highest in bonding temperature, and this section is bonded using a brazing material. The section between the semiconductor chip 952 and the dielectric substrate 956 is next highest in bonding temperature, and this section is bonded using hot solder. The section between the dielectric substrate 956 and the metallic base is the lowest in bonding temperature, and this section is bonded using cold solder. Since the bonding temperature of the heat release fin 506 brazed is high, the metallic base 944 uses a metal harder than pure copper. Otherwise, brazing will deteriorate the planarity of the opposite face of the metallic base 944 and make the dielectric substrate difficult to bond. If the metal added as the impurity is increased in content, the planarity will be easier to maintain, as described above. However, heat conductivity will decrease and the dielectric substrate 956 will decrease in cooling effect. Both characteristics can be simultaneously obtained using the foregoing after-brazing characteristics conditions of at least HV50 in hardness and at least 200 W/mK in heat conductivity. A departure from the planarity of the metallic base section under the region of each dielectric substrate 956 is desirably within ±0.2 mm, and optimally, within ±0.1 mm. In addition, an area on the metallic base 944 where the six dielectric substrates are bonded is desirably able to maintain high planarity, and a departure from the planarity of the metallic base section in the bonding area for all six dielectric substrates is desirably within ±0.4 mm, and optimally, within ±0.3 mm.

In other perspective, the departure from the planarity of the metallic base 944 in the area sectioned by the fixing screw holes 978 is desirably within ±0.2 mm, and optimally, within ±0.1 mm.

The present embodiment includes a plurality of dielectric substrates 956 arranged on the metallic base 944, and maintains a layout relationship in which a plurality of semiconductor chips are arranged on each of the dielectric substrate 956 so as to be able to withstand a high voltage. For the dielectric substrates 956 thus arranged so that each has a plurality of semiconductor chips to receive, for example, DC power of 300 volts or more and convert the DC power into AC form, since the dielectric substrates increase in surface area, the departure from the planarity in the area where each dielectric substrate 956 is bonded is desirably within ±0.2 mm, and optimally suppressed to be within ±0.1 mm.

The three sets of semiconductor chips bonded onto one dielectric substrate in FIG. 16 are, in the present embodiment, IGBT (Insulated Gate Bipolar Transistor) chips and diode chips, and the chip 952 in FIG. 18 is one of the IGBT chips. Also, in order to form essentially the same structure as that shown in FIG. 18, the diode chips 954 adjacent to the IGBT chips in FIG. 16 are bonded onto the dielectric substrate 956 by using essentially the same manufacturing method as used in FIG. 18. There is a difference in that the semiconductor chip 952 is replaced by diode chip 954. Three IGBT chips 952 and three diode chips 954 are bonded onto each dielectric substrate, and six dielectric substrates 956 each having the six chips are bonded onto the metallic base 944 by cold soldering in order to obtain the array shown in FIG. 16.

While the above embodiment has used IGBT chips as the semiconductor chips 952, MOS transistor chips may be used instead, in which case, the diode chips 954 become unnecessary.

The holes 978 in FIGS. 16, 17, and 18 are screw holes for fixing the semiconductor module to the water channel formation 220.

Figure 19:
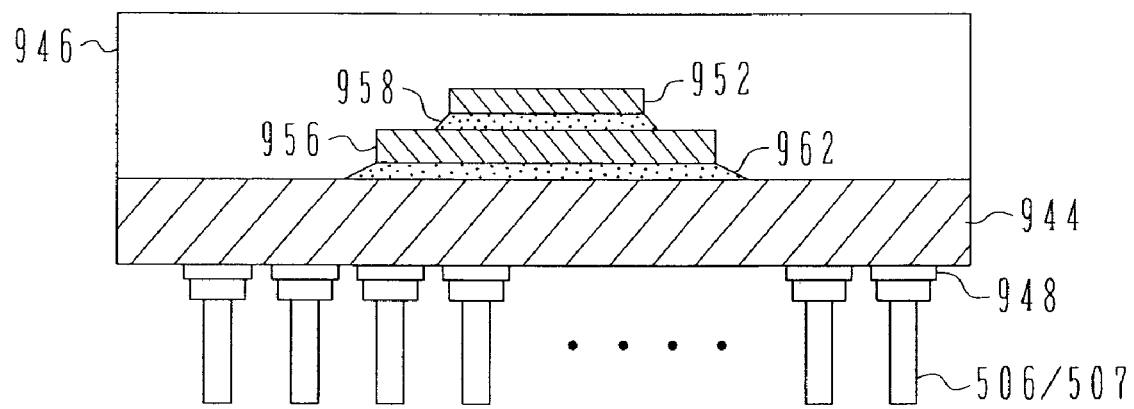
FIG. 19 is a sectional view of a power module, showing another example of FIG. 18.

FIG. 19 shows another example of FIG. 18, and the present example uses pin-shaped heat release fins 506. Similarly to the wave-shaped heat release fins 506 in FIG. 18, the pin-shaped heat release fins 506 are brazed onto a metallic base 944 using a brazing material. The metallic base plate and the pin-shaped fins are bonded using the brazing material 948. In the present example, height of the heat release pins above the base surface ranges from 6 mm to 8 mm. The depth of the position at which the heat release fins are inserted in the water channels in FIG. 4 is 10 mm or less, and desirably, 9 mm or less. The number of fins in the areas of each fin and in the area of the heat release fin 506A in FIG. 17 is from 300 to 700. A diameter of the pins is from 3 to 5 mm at the brazed section, height thereof is from 0.5 mm to 1.5 mm, and a diameter of a section even higher than the brazed section is from 2 mm to 3 mm. These pins are arranged in zigzag form.

Figure 20A:
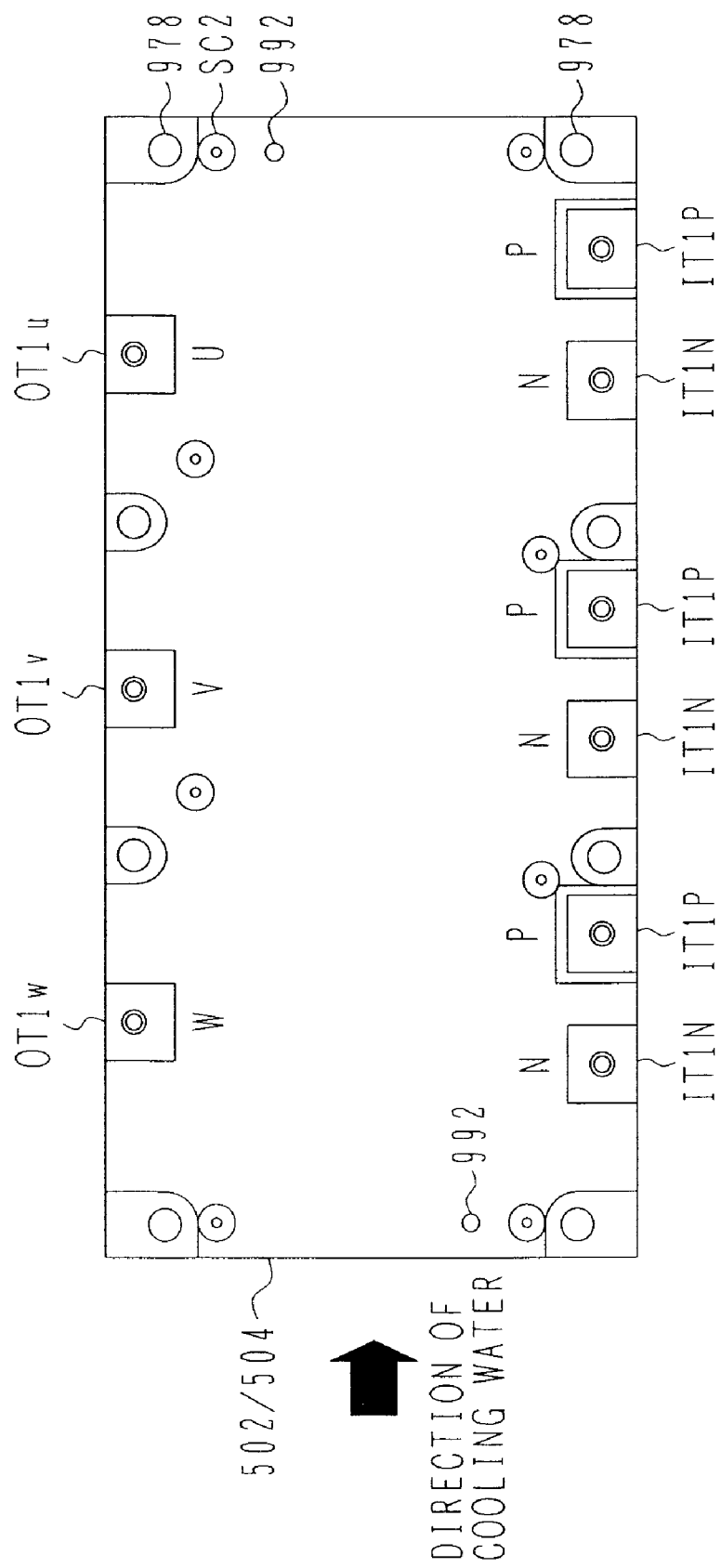
FIG. 20A is an external plan view of the power module in the present example.
Figure 20B:
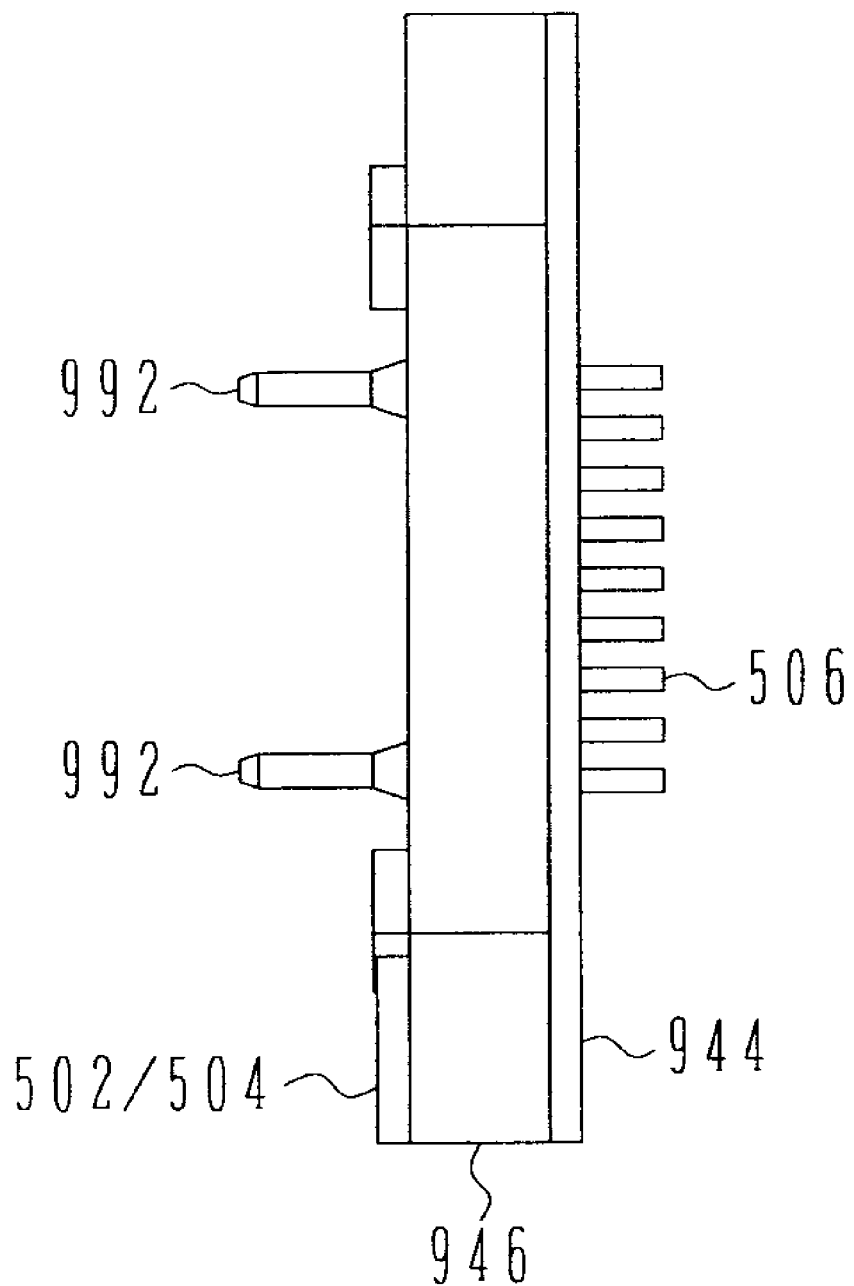
FIG. 20B is an external side view of the power module in the present example.
Figure 20C:
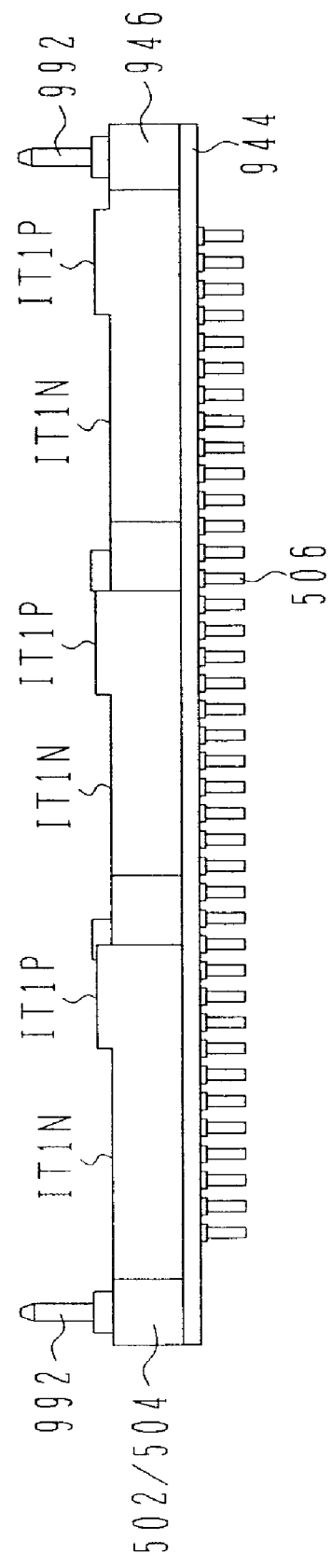
FIG. 20C is an external front view of the power module in the present example.

FIGS. 20A to 20C are external views of power module 502 or 504. FIG. 20A is a plan view of the power module 502 or 504, FIG. 20B is a side view thereof, and 20C is a front view thereof. As described in the above example, in the power module structural views of FIGS. 16 and 17, the resin casing of the power module in FIG. 20 is removed from the module. In the plan view of FIG. 20A, AC terminals OT1$u$, OT1$v$, OT1$w$ that connect to a rotating electric machine are provided at one end of the power module 502 or 504. Three sets of DC terminals IT1N and IT1P that connect to a DC power supply are provided at the other end. These terminals are arranged as in FIG. 9, and are connected to capacitor terminals. The IT1N terminals are connected to a negative side of the DC power supply, and the IT1P terminals, to a positive side of the DC power supply. When the three sets of DC terminals IT1N and IT1P in FIGS. 20A, 20C are electrically connected, parallel connections are conducted between positive terminals and between negative terminals.

Reference pins 992 are provided for positioning the driver circuit boards 602 and 604 fixed to the power module 502 or 504.

FIG. 21 shows a relationship in position between the power modules 502 and 504 existing when the respective heat release fins are fixed so as to protrude towards an opening 218 or 219 in a water channel 922. Arrows indicate directions of a flow of water in the water channel. The two power modules 502 and 504 are arranged in parallel and so that the DC terminals are positioned internally. This arrangement makes the module terminals connectible at a central section to the capacitor terminals, thus simplifying a total device structure. The arrangement also makes it possible to connect capacitor modules 302 and 304 in a stacked structure with short electrical wiring and with the DC positive and negative sides facing each other. In addition, it becomes possible to reduce inductance of the electrically wired section and to suppress increases in voltage due to switching between the power modules 502 and 504.

In this device, the power modules have their DC positive terminals IT1P and IT2P connected to one another and have their DC negative terminals IT1N and IT2N connected to one another. Arranging the power module 502 or 504 in slightly offset form in parallel, as shown in FIG. 21, makes it possible for a power module of the same shape to be used as the other power module 502 or 504. Such arrangement is also effective for reducing a connection distance and hence, the above inductance. It is possible to arrange the negative N-terminals of the power module 502 or 504 adjacently to one another, and arrange the positive P-terminals adjacently to one another. Thus, connection lines are arranged into a neat relationship, and productivity-associated electrical wiring efficiency improves. Additionally, the inductance can be reduced.

Since the AC terminals OT1 and OT2 that connect to rotating electric machines are arranged outside the parallel-arranged power modules 502 and 504, bus bars for connecting the AC terminals OT1 and OT2 to terminals of different rotating electric machines can be easily arranged in this structure. The above arrangement also simplifies the structure of the entire device and improves working efficiency.

(Description of Electrical Circuit)

Figure 22:
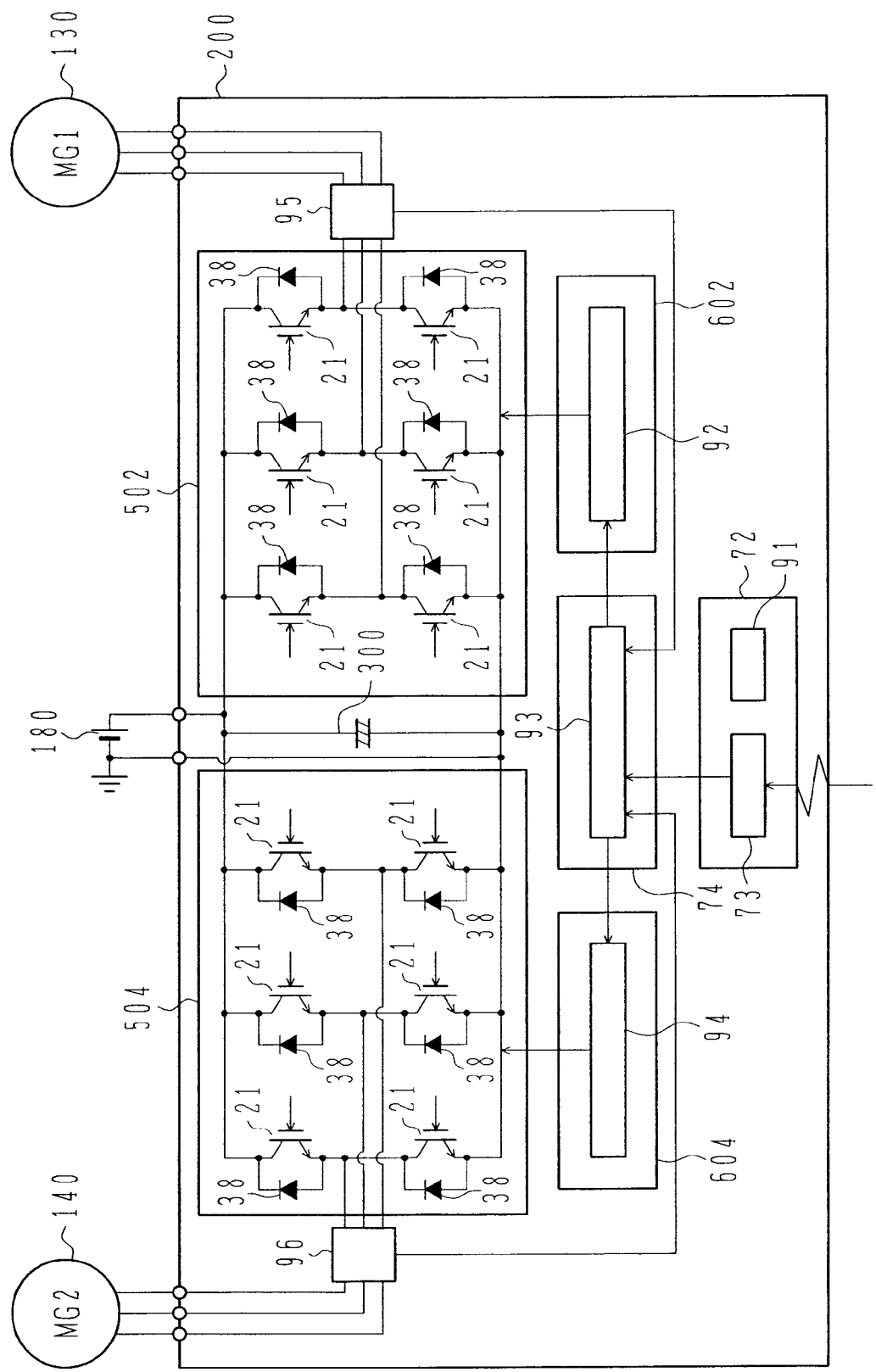
FIG. 22 is a circuit diagram of the present embodiment.

FIG. 22 is a circuit diagram of the electric power converter 200 in the present example. The power converter 200 includes: a first power module 502 constituting a first inverter; a second power module 504 constituting a second inverter; a capacitor module 300; a driver circuit 92 mounted on a first driver circuit board 602 of the first inverter; a driver circuit 94 mounted on a second driver circuit board 604 of the second inverter; a control circuit 93 mounted on a rotating electric machine control circuit board 700; a connector 73 mounted on a connector board 72; a driver circuit 91 driving a discharge circuit (not shown) of the capacitor module 300; and current sensors 95 and 96.

The first power module 502 and the second power module 504 each constitute a power converter main circuit of the associated inverter and have a plurality of switching power semiconductor elements. The first power module 502 and the second power module 504 operate in accordance with driving signals output from the associated driver circuits 92 and 94, convert DC power supplied from a high-voltage battery 180, into three-phase AC power, and supply the power to armature coils of associated rotating electric machines 130 and 140. The main circuit that is the three-phase bridge circuit shown in FIG. 22 includes series circuits for three phases, and the series circuits are electrically connected in parallel to one another between positive and negative sides of the battery 180. The series circuits are constituted by the semiconductor chips 952 bonded onto the dielectric substrates 956 arranged facing each other in FIG. 16. Semiconductor chips of the first power module 502 and second power module 504 shown in FIG. 22 are arranged as shown in FIG. 16.

(Description of the Second Power Module 504)

The first power module 502 and the second power module 504 are of the same circuit composition, as shown in FIG. 22, and the second power module 504 is described below as a representative. The present example uses IGBTs (Insulated Gate Bipolar Transistors) 21 as the switching power semiconductor elements. Each IGBT 21 has a collector electrode, an emitter electrode, and a gate electrode. A diode 38 is electrically connected between the collector electrode and emitter electrode of the IGBT 21, and the diode 38 has a cathodic electrode and an anodic electrode. In order that a direction from the emitter electrode of the IGBT 21, towards the collector electrode thereof, is a forward direction, the cathodic electrode and the anodic electrode are electrically connected to the collector electrode and emitter electrode, respectively, of the IGBT 21. The IGBT 21 that is a chip is associated with the semiconductor chip 952 shown in FIG. 16, 18, or 19, and the diode 38 is associated with the diode chip 954 shown therein. As described in the above example, the switching power semiconductor elements may be MOSFETs (Metal-Oxide Semiconductor Field-Effect Transistors). Each MOSFET has a drain electrode, a source electrode, and a gate electrode. Since the MOSFET includes, between the source electrode and the drain electrode, a parasitic diode in which a direction from the drain electrode, towards the source, is a forward direction, such independent diode as added to each IGBT is not required in the MOSFET.

Arms of each phase are constructed with the source electrodes and drain electrodes of associated IGBTs 21 electrically connected in series. In the present example, although one IGBT only is shown for an upper or lower arm of each phase, since a capacity of a current to be controlled is large, it is to be assumed that a plurality of IGBTs are electrically connected in parallel. In the present example of FIG. 22, the upper and lower arms of each phase are each constructed of three IGBTs. The drain electrodes of the IGBTs 21 constituting the upper arms of each phase are electrically connected to the positive side of the battery 180, and the source electrodes of the IGBTs 21, to the negative side of the battery 180. The terminals of power modules 502 and 504 that are to be connected to the positive side of the battery 180 are shown as IT1P or IT2P in FIGS. 20 and 21. Also, the terminals of power modules 502 and 504 that are to be connected to the negative side of the battery 180 are shown as IT1N or IT2N in FIGS. 20 and 21.

A neutral point in the arms of each phase (i.e., a connection between the source electrode of the upper-arm IGBT and the drain electrode of the lower-arm IGBT) is electrically connected to the armature coil of the associated phase of the associated rotating electric machine 130 or 140. These neutral points are shown as terminals OT1$u$, OT1$v$, OT1$w$, OT2$u$, OT2$v$, OT2$w$, in FIGS. 20 and 21.

The driver circuit 92, 94 constitutes a driver of the associated inverter, and in accordance with a control signal output from the control circuit 93, generates the driving signal for driving the IGBT 21. The driving signal that has been generated in the circuit 92 or 94 is output to the associated first power module 502 or second power module 504. The driver circuit 92, 94 is constructed of one circuit into which the plurality of circuits associated with the upper and lower arms of each phase are integrated, that is, the driver circuit is composed of the integrated circuit in which the circuits for driving the six IGBTs are stored into one block. The circuits associated with the upper and lower arms of each phase include interface circuits, gate circuits, abnormality detection circuits, and so on.

The control circuit 93 constitutes a controller of the associated inverter, and is constructed of a microcomputer that computes control signals (control data) adapted to operate (turn on/off) a plurality of switching power semiconductor elements. Torque command signals (torque command values) from a host controller, and signals (sensor outputs) from the current sensors 95, 96, and from rotation sensors mounted in the rotating electric machines 130, 140, are input to the control circuit 93. The control circuit 93 computes control data from these input signals, and outputs switching timing control signals to the driver circuits 92, 94.

The connector 73 for electrical connection between the power converter 200 and an external controller exchanges information with other devices via a communications line 174 (see FIG. 1).

Capacitor module 300 including the capacitor modules 302 and 304 shown in FIG. 10 constitutes a smoothing circuit to suppress DC voltage fluctuations caused by switching operation of the IGBT 21, and is electrically connected in parallel to the DC terminals of the first power module 502 and second power module 504. The driver circuit 91 drives the discharge circuit (not shown) that is provided to release a stored charge from the capacitor module 300.

Second Embodiment

Next, a second embodiment is described below using FIGS. 23 to 28. The second embodiment is essentially the same as the first embodiment in terms of the basic concept relating to circuit composition (see FIG. 22), power module structure (see FIGS. 16 to 21), and cooling water channel structure (see FIGS. 12 to 15), and in terms of operation and advantageous effects. One difference exists in that whereas the first embodiment has cooling water channels 922 and 926 at the bottom of an inverter 200, the second embodiment has cooling water channels at a middle stage of an inverter 200. In the second embodiment, electrical components to be cooled, such as power modules 502, 504 and capacitor modules 302, 304, can be mounted on both upper and lower faces of a cooling water channel formation, and both the upper and lower faces can be used for cooling. For example, the second embodiment can be constructed so that the semiconductor modules mounted as the power modules 502, 504 on one face of the cooling water channel formation will be cooled and so that the capacitor modules 302, 304 mounted on the other face of the cooling water channel formation will be cooled.

The second embodiment of the power converter is described in detail below. In the power converter 200, second base 12 is stacked on a lower casing 13, a first base 11 on the second base 12, and an upper casing 10 on the first base 11, and each is fixed in the particular state. The housing, or inverter 200, with the above elements stacked in fixed form on one another, has a round-cornered, rectangular parallelepiped shape as a whole. Constituent components of the housing are formed using a material excellent in heat conductivity, such as aluminum. This housing basically having functions equivalent to those of the housing 210 described in the first embodiment include the upper casing 10 and the lower casing 13. A water channel formation including the first base 11 and the second base 12 is fixed to a central section of the housing that includes the upper and lower casings, and electrical components of the power modules and capacitor modules described below are mounted on both faces of the water channel formation.

The above housing has its entire surface (sidewalls, upper wall, and lower wall) surrounded with a material excellent in heat conductivity, such as aluminum, and the cooling water channel including the first base 11 and the second base 12 is fixed in an appropriate heat-conductive structure to the housing, so the housing itself is appropriately cooled. The cooling water channel including the first base 11 and the second base 12 forms a cooling water channel in the housing, and forms a room at both upper and lower sections of the water channel formation in the housing. The water channel formation includes two channels, 922 and 926, that are arranged in parallel to each other to allow cooling water as a cooling medium to flow through. The two rooms in this structure are thermally separated by the cooling water channels so that thermal impacts of heat transfer from one room to the other room can be suppressed. In addition, the two rooms and walls thereof are cooled.

Figure 24:
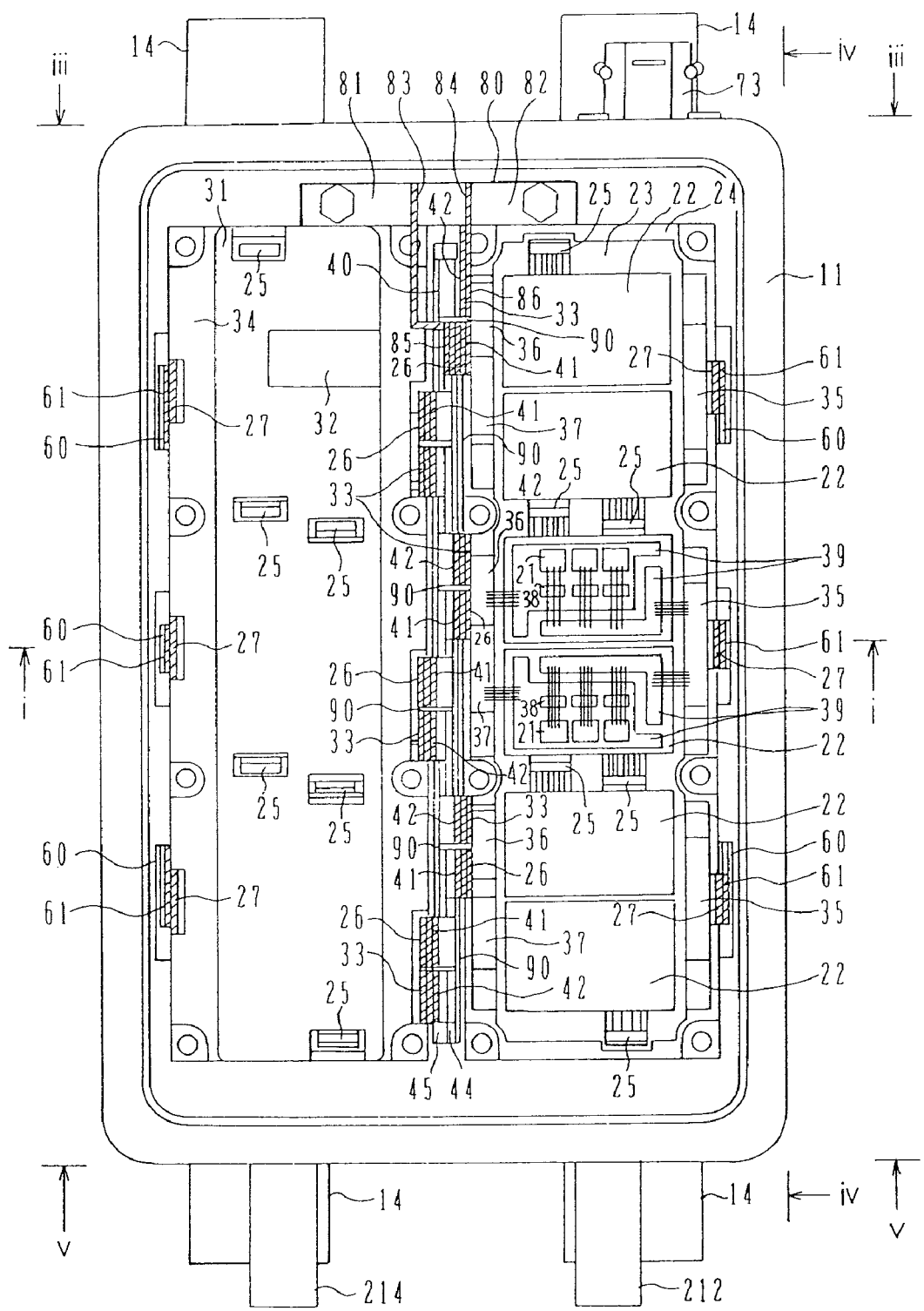
FIG. 24 is a plan view showing an upper section of a water channel in the power converter of the second embodiment.
Figure 25:
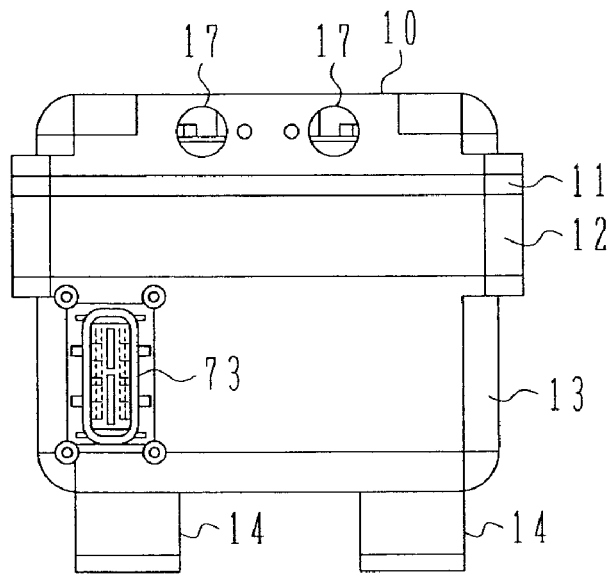
FIG. 25 is a side view showing the power converter of the second embodiment.
Figure 26:
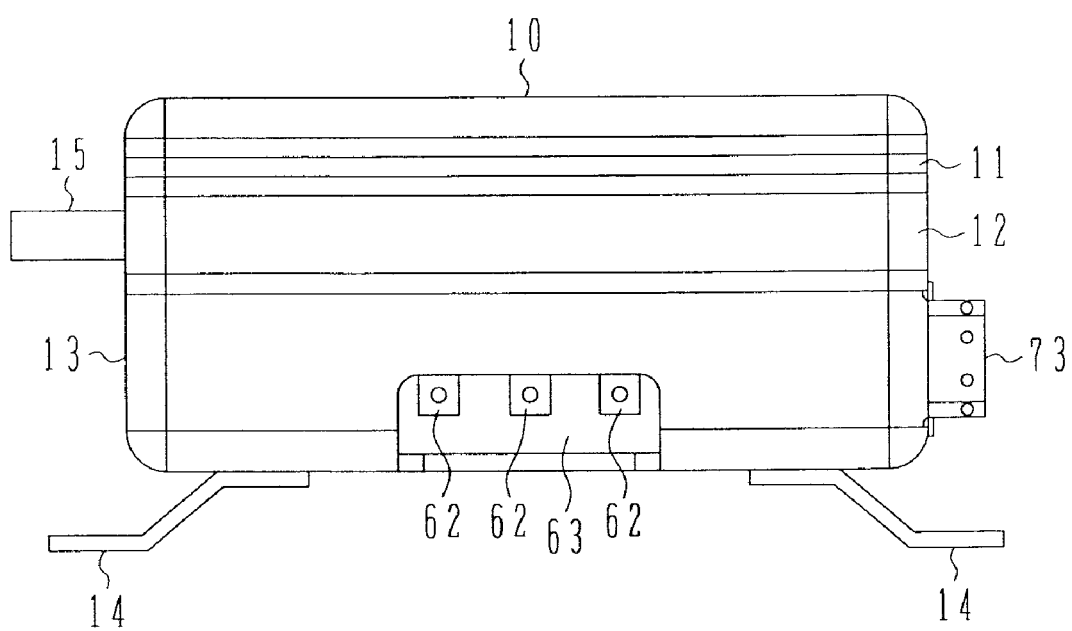
FIG. 26 is another side view showing the power converter of the second embodiment.

As shown in FIG. 24, in the upper room of the water channel formation, a first power module 502 and a second power module 504 are arranged next to each other in a longitudinal (longer-side) direction of the housing. The cooling water channels 922 and 926 have openings 218 and 219, respectively, as described in FIGS. 12 and 13, and heat release fins of the power modules 502 and 504 protrude from the openings into the water channels. Also, the openings 218 and 219 are blocked with heat release surfaces of the first power module 502 and the second power module 504, and thus, both power modules are efficiently cooled. In addition, thermal impacts of heat transfer from the power modules 502 and 504 to the lower room can be suppressed.

Figure 27:
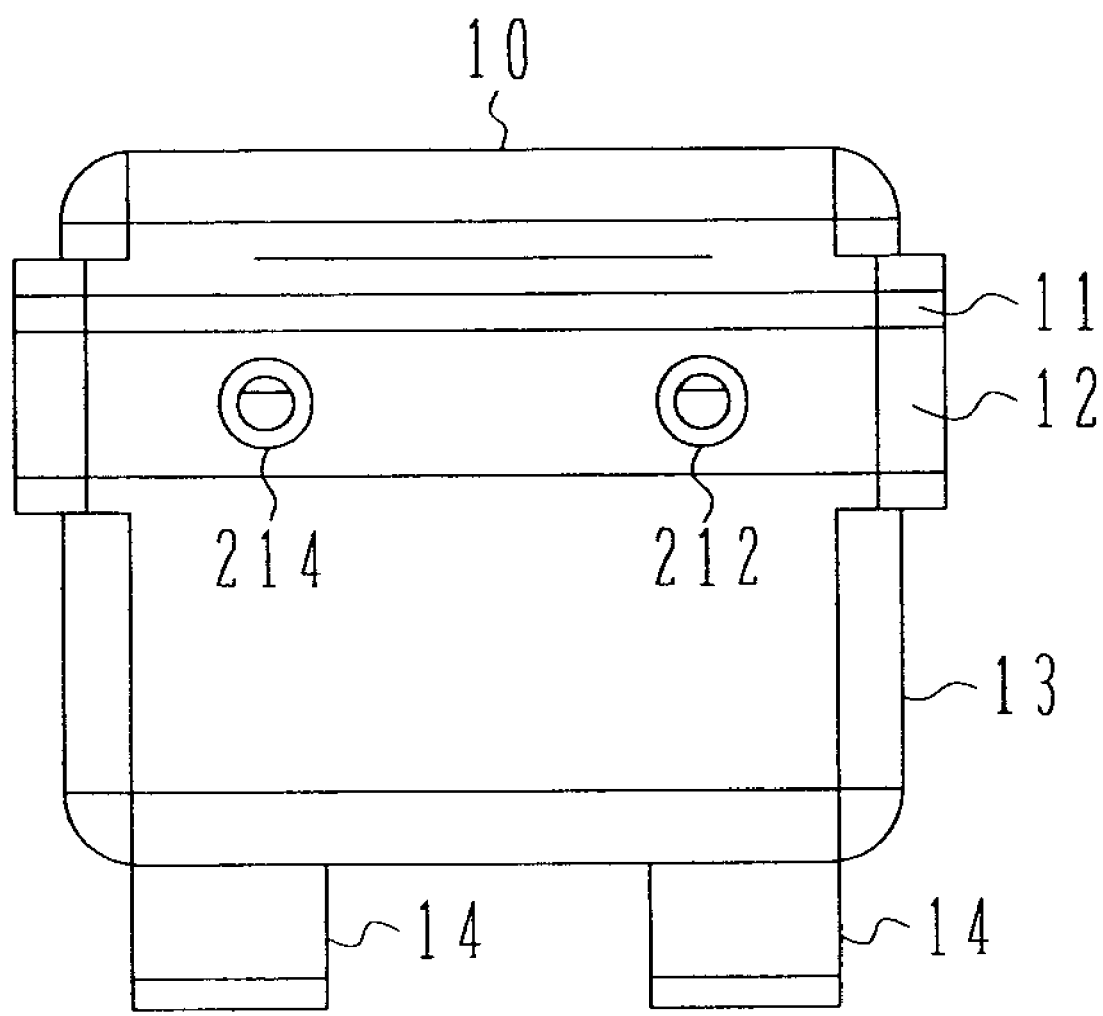
FIG. 27 is yet another side view showing the power converter of the second embodiment.

As shown in FIG. 27, the housing has, on one side face thereof in the longitudinal direction, an inlet pipe 212 and outlet pipe 214 communicating with the cooling water channels 922 and 926, respectively. The cooling water channels 922 and 926 extend in parallel to the longitudinal direction of the housing, are bent into a U-shape at opposite longitudinal ends of the housing, and communicate with each other at the opposite longitudinal ends. The water channels in the second embodiment are essentially of the same shape as that of the water channels described in FIGS. 12-14.

As described above, the cooling water channels 922 and 926 of the first base 11 have the openings 218 and 219, respectively, the heat release fins of the power modules 502 and 504 protrude from the openings into the water channels, and the openings 218 and 219 are blocked with metallic bases 23 of the power modules 502 and 504. The fins are directly cooled by the cooling medium, and the metallic bases 23 are cooled efficiently by the cooling medium flowing through the water channels 922 and 926.

The metallic bases 23 are of the same shape, operation and advantageous effects as those of the metallic base 944 described in FIGS. 18 and 19, and are constructed of a highly heat-conductive metallic material based on copper, and the heat release fins protruding into the water channels 922 and 926 are provided on a face thereof that is close to flow routes of the cooling medium. The heat release fins have the same structure as that of the heat release fins 506 and 507 described in FIGS. 18 and 19, an essential cooling area by the cooling medium increases, and a cooling effect by the cooling medium can be improved.

As described in FIG. 14, in the second embodiment, a depth of the first water channel 922 also increases at its inlet port formed to receive the cooling water supplied from the inlet pipe 212, and then decreases at where the heat release fins 506 protrude. At the water channel bends where the first water channel 922 and the second water channel 924 are connected, the water channel 922 is once again deeper than at the protruding section of the heat release fins 506, and is shallow at where the heat release fins 507 in the second water channel 926 protrude. At an outlet port of the second water channel 926, the water channel is deeper than at where the heat release fins protrude, and connects to the outlet pipe 214. These water channels have the same shape and same operation and advantageous effects as those described in FIGS. 12, 13, and 14, and are constructed so that at where the heat release fins protrude, the heat released therefrom will be exchanged with the entire cooling water as efficiently as possible, and so that sections free from the fins are minimized in fluid resistance. Cooling efficiency of the entire cooling system consequently improves.

Figure 23:
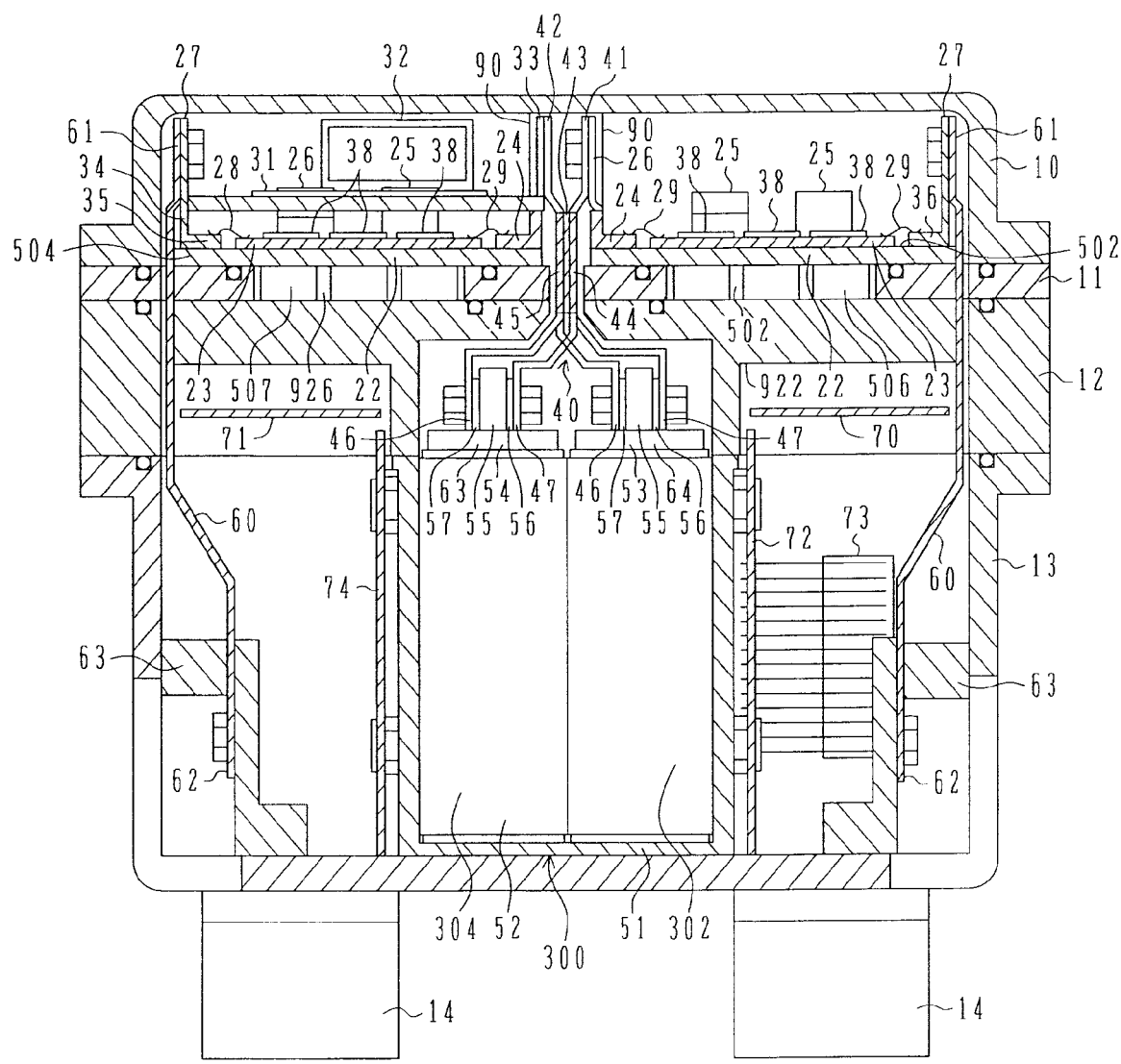
FIG. 23 is a sectional view showing a configuration of an electric power converter according to a second embodiment of the present invention.

The metallic bases 23 of the power modules 502 and 504 are provided so as to block the openings in the respective water channels, and upper faces of the metallic bases 23 have essentially the same resin casing 24 as that shown in FIGS. 15 to 21. The resin casing 24 shown in FIGS. 23-27 is the same as the resin casing 946 shown in FIGS. 14, 15, and 20. In FIGS. 23 and 24, an upper lid originally provided on the resin casing 24 of the first power module 502 is intentionally omitted for a better understanding of the inside of the power module 502. Also, of all semiconductor chips (and wiring structures) present in bonded form on the six dielectric substrates of the first power module 502 that are arrayed in a row in FIG. 24, only two in the middle of the array are shown in detail and details of the other four semiconductor elements are omitted.

On sidewalls of the first power module 502 and the second power module 504 each, these sidewalls extending in a longitudinal (longer-side) direction of the resin casing and being positioned at an opposed side of both power modules, a DC positive module terminal 26 (see FIG. 24) and a DC negative module terminal 33 (also, see FIG. 24) are provided for each storage room. The DC positive module terminal 26 and the DC negative module terminal 33 protrude upward from a side of the resin casing 24. A side thereof that is opposite to the protruding side of the DC positive module terminal 26 and DC negative module terminal 33 extends into the associated storage room, and the surface thereof is exposed to face the surface of the resin casing 24. This forms a DC positive module electrode 36 and a DC negative module electrode 37 in each storage room. The terminal 26 is the same as the IT1P and IT2P shown in FIGS. 20 and 21 for the first embodiment, and the terminal 33 is the same as the IT1N and IT2N shown in FIGS. 20 and 21.

In addition, the first power module 502 and the second power module 504 each have AC module terminals 27 (see FIG. 24) on the respective sidewalls extending in the longitudinal direction of the resin casing and positioned at sides opposite to the opposed sides of the power modules. The AC module terminals 27 protrude upward from a sidewall of the resin casing 24. A side thereof that is opposite to the protruding side of the AC module terminals 27 extends into the associated storage room, and the surface thereof is exposed to face the surface of the resin casing 24. This forms an AC module electrode 35 in each storage room. The AC terminals 27 have the same shape and same operational effects as those of the terminals OT1$u$, OT1$v$, OT1$w$, OT2$u$, OT2$v$, and OT2$w$ shown in FIGS. 20 and 21 for the first embodiment.

On the upper face of the metallic base 23 of each storage room, two dielectric substrates 22 are arranged next to each other in the longitudinal direction of the housing. On an upper face of each dielectric substrate 22, two plate-like wiring members 39 (see FIG. 24) are arranged next to each other in the longitudinal direction of the housing. One of the two wiring members 39 provided on one of the two dielectric substrates 22 of each storage room is electrically connected to the DC positive module electrode 36. One of the two wiring members 39 on the other dielectric substrate 22 of the storage room is electrically connected to the DC negative module electrode 37. The other wiring member 39 on the other dielectric substrate 22 of the storage room is electrically connected to the AC module electrode 35. These electrical connections are each conducted using an electroconductive wire 29.

As shown, on an upper face of either of the wiring members 39 provided on the two dielectric substrates 22 of each storage room, three pairs of IGBTs 21 and diodes 38 lined up in one direction of the housing are mounted next to one another to face in another direction of the housing. This constitutes upper and lower arms of each phase. The IGBTs 21 and the diodes 38 are electrically connected to the wiring member 39 electrically connected to the AC module electrode 35. Gate electrodes of the IGBTs 21 are electrically connected to a connector 25. These electrical connections are each conducted using the electroconductive wire 29. The connector 25 is provided on each of the four sidewalls of the resin casing that form three regions of the upper face of the metallic base 23. The above IGBTs 21 and diode chips 38 are arranged under the same positional relationship as that described in FIG. 16. Each dielectric substrate 22 in the second embodiment is the same as the dielectric substrate 956 in the first embodiment, and has the same operation and same advantageous effects as those of the dielectric substrate 956.

The resin casing has a plate-like module casing lid 34 at its upper section. The module casing lid 34 constitutes an upper wall to shroud an upper opening in the resin casing and block the storage room, and is molded from the same dielectric resin as used in the resin casing. An upper face of the module casing lid 34 has a wiring sheet 31 and a wiring connector 32 electrically connected thereto. The wiring sheet 31 is electrically connected to the connector 25 protruding upward from a through-hole in the module casing lid 34. The wiring connector 32 is electrically connected to driver circuits of a first driver circuit board 70 and a second driver circuit board 71 via wiring not shown. The driver circuits are the same as the driver circuits 92 and 94 shown in FIG. 22, and are the same as the circuits formed on the driver circuit boards 602 and 604 of the first embodiment.

In a cooling room formed at a lower section of the housing is disposed a capacitor module 300, which includes two capacitor modules, 302 and 304, and is the same as the capacitor module 300 used in the first embodiment and in the circuit composition of FIG. 22.

The capacitor module 300 is disposed so that its electrical terminals are positioned below a central section of the second base 12 (i.e., a region enclosed in two legs of a π shape) to ensure proximate arrangement with the DC terminals of the first power module 502 and the second power module 504. The capacitor module 300 includes four electrolytic capacitors whose sectional shape in a height direction of the housing is rectangular. In order for a longer side of each to face in the longitudinal direction of the housing, the four electrolytic capacitors are arranged in groups of two, one group in the longitudinal direction of the housing and the other group in a lateral (shorter-side) direction thereof, and stored in a capacitor casing 51 via a retaining band 52. The capacitor casing 51 is a heat-conductive container with an open upper end, and a flange on this casing is in contact with lower ends of the n-shaped legs of the second base 12. This makes it possible to connect the capacitor module 300 and the water channels 922 and 926 thermally in a highly heat-conductive condition and to sufficiently cool the capacitor module 300.

Each electrolytic capacitor has a positive capacitor terminal 57 and a negative capacitor terminal 56, both of which penetrate a capacitor lid 54 that blocks the opening in the upper section of the capacitor casing 53. The positive capacitor terminal 57 and the negative capacitor terminal 56 are plate-shaped and laterally face each other, and a dielectric member 55 formed integrally with the capacitor lid 54 is laterally inserted between the terminals. The capacitor terminals are provided such that when the four electrolytic capacitors are stored into the capacitor casing 53, the capacitors laterally adjacent to each other will differ in longitudinal position.

The first driver circuit board 70 is disposed below the second base 12 at the first power module 502, and more specifically, in a region enclosed between one of the π-shaped legs of the second base 12 and a flange section thereof. The second driver circuit board 71 is disposed below the second base 12 at the second power module 504, and more specifically, in a region enclosed between the other π-shaped leg of the second base 12 and a flange section thereof. The first driver circuit board 70 and the second driver circuit board 71 are thermally connected to the respective second bases 12. Thus, the cooling medium flow channels and the driver circuit boards 70 and 71 can be thermally connected and the driver circuit boards 70 and 71 can be cooled using the cooling water that is the cooling medium.

A rotating electric machine control circuit board 74 is provided so as to be opposed to one lateral side of the capacitor casing 53 that faces the second power module 504. The rotating electric machine control circuit board 74 is thermally connected to the second base 12. This makes it possible to arrange the water channels 922 and 926 and the rotating electric machine control circuit board 74 in a highly heat-conductive condition and to efficiently cool the rotating electric machine control circuit board 74 by means of the cooling medium.

A connector board 72 is provided so as to be opposed to the other lateral side of the capacitor casing 53 that faces the first power module 502. The connector board 72 is thermally connected to the second base 12. This makes it possible to thermally connect the cooling medium flow channel 28 and the connector board 72 and to cool the connector board 72 by means of the cooling medium. The connector 73 protrudes outward from the other longitudinal edge of the housing.

The capacitor module 300, the first power module 502, and the second power module 504 are electrically connected through a DC connection conductor 40. The DC connection conductor 40 is a rectangular hole penetrating a central portion of the first base 11 and that of the second base 12, and the conductor 40 extends in the longitudinal direction of the housing and leads to the upper and lower cooling rooms via a through-hole penetrating in the height direction of the housing.

The DC connection conductor 40 is a wiring member of a stacked structure in which: a plate-like DC positive bus bar 45 and a plate-like DC negative bus bar 44, both extending in the longitudinal direction of the housing, are stacked in the lateral direction thereof, a DC positive module terminal 42 and a positive capacitor terminal 46 are integrally formed on the DC positive bus bar 45, and a DC negative module terminal 41 and a negative capacitor terminal 47 are integrally formed on the DC negative bus bar 44.

Employing this structure makes it possible to reduce inductance between the first power module 502, the second power module 504, and a capacitor module 50, and reduce temporary rises in voltage during the switching operation of the IGBT 21. Temporary rises in voltage can also be reduced, even at higher switching speeds. Faster switching is therefore possible, so a release of heat from the power modules during switching can be suppressed.

The DC positive module terminal 42 extends upward from an upper section of the DC positive bus bar 45, at where the DC positive module terminal 33 protrudes upward from the resin casing. The above terminal 42 is fixed to the DC positive module terminal 33 by means of a screw or any other appropriate fixture so as to face the DC positive module terminal 33, in the lateral direction of the housing. In this way, the DC positive module terminal 42 is electrically connected to the DC positive module terminal 33. The DC negative module terminal 41 extends upward from an upper section of the DC negative bus bar 44, at where the DC negative module terminal 26 protrudes upward from the resin casing. The above terminal 41 is fixed to the DC negative module terminal 26 by means of a screw or any other appropriate fixture so as to face the DC negative module terminal 26, in the lateral direction of the housing. In this way, the DC negative module terminal 41 is electrically connected to the DC negative module terminal 26.

The positive capacitor terminals 46 and the negative capacitor terminals 47 extend downward from lower sections of the DC positive bus bar 45 and DC positive bus bar 44, where the above capacitor terminals protrude. The capacitor terminals 46, 47 are each sandwiched from the lateral direction of the housing so as to face in the lateral direction thereof, and one capacitor terminal 46, 47 is fixed to the other capacitor terminal 46, 47 of the same polarity by means of a screw or any other appropriate fixture. In this way, one capacitor terminal is electrically connected to the other capacitor terminal. In this wiring structure, since wiring sections extending from the DC positive bus bar 45 and the DC negative bus bar 44 to each capacitor terminal can also be opposed with the same polarity, wiring members with further reduced inductance can be obtained and temporary rises in voltage during the switching operation of the IGBT 21 can be reduced. Since temporary rises in voltage can also be reduced at higher switching speeds, even if a rise to one voltage level is allowed, faster switching is possible, so the release of heat from the semiconductors during switching can be suppressed.

In the above embodiment, it is possible to arrange the cooling water channels in parallel, provide openings in interstitial regions between the water channels, and connect the terminals of the capacitor module 300 and the DC terminals of the power modules 502 and 504 that are semiconductor modules, through the above openings, and thus to implement the improvement of cooling efficiency and the reduction in inductance.

A DC terminal 80 is provided at the other longitudinal end of the housing. The DC terminal 80 includes: a DC positive bus bar 84 that connects a DC positive external terminal 82, a DC negative external terminal 81, a DC positive connection terminal 86, a DC negative connection terminal 85, a DC positive external terminal 82, and a DC positive connection terminal 86; and a DC negative bus bar 83 that connects the DC negative external terminal 81 and the negative connection terminal 85.

The DC positive external terminal 82 and the DC negative external terminal 81 are electrically connected to external cables extending via connectors mounted in through-holes 17 provided at the other longitudinal edge of the housing. The DC positive bus bar 84 and the DC negative bus bar 83 extend towards the first power module 502 and the second power module 504 so as to face each other in the lateral direction of the housing. The DC positive connection terminal 86 is electrically connected to the DC positive module terminal 33, 42, and the DC negative connection terminal 85 to the DC negative module terminal 26, 41.

Holes 18 in the upper face of the upper casing 10 are used for connecting external cables to the DC positive external terminal 82 and the DC negative external terminal 81. The holes 18 are blocked with a lid, except during the connecting operations.

AC bus bars 60 for three phases are arranged in both lateral ends of the housing. The AC bus bars 60 extend from the lower room of the cooling water to the upper room thereof via through-holes provided in a vertical direction (height direction of the housing) at an end of each of the first base 11 and the second base 12. An AC module terminal 61 is formed at one end of the AC bus bar 60, located in the upper room of the water channel. The AC module terminal 61 faces an AC module terminal 27, in the lateral direction of the housing, is opposed to the AC module terminal 27, and is fixed thereto by means of a fixture such as a screw. In this way, the AC module terminal 61 is electrically connected to the AC module terminal 27. External connection terminals 62 for connection to the external cables extending to the rotating electric machines 130, 140 are formed at the other end of the AC bus bar 60, located in the lower room of the water channel, and the external connection terminals 62 are held by a terminal holder 63.

Reference number 14 denotes fitting legs adapted to fix the housing of the power converter 200 to a housing of a transmission 105 or to an engine 104 and the housing of the transmission 105. The fitting legs 14 employ stainless steel or any other appropriate rigid material to ensure strength. The fitting legs 14 are also formed into a U-shape to have resilience for minimum vibration from the transmission 105 and the engine 104.

The first and second embodiments described above improve cooling efficiency since the cooling water channels that are cooling medium passageways have an opening, since heat release fins protrude from the openings into the water channels, and since the cooling water that is the cooling medium cools directly the heat release fins.

In the first and second embodiments described above, in addition to direct cooling of the heat release fins by the cooling water, a structure formed to block each of the above openings with a metallic base plate for bonding the heat release fins improves cooling efficiency and simplifies the structure of the entire device.

In the first and second embodiments described above, in addition to direct cooling of the heat release fins by the cooling water, the fact that DC terminals, of power modules with the heat release fins which contain switching semiconductors to constitute inverters are arranged at one side of each of the power modules simplifies capacitor module connection structure and reduces inductance.

In the first and second embodiments described above, the cooling water channels are arranged in parallel, the openings in the cooling water channels are arranged in parallel, and cooling fins protrude towards the openings, whereby the heat release fins are directly cooled. In addition, the fact that the DC terminals of the power modules with the heat release fins which contain the switching semiconductors to constitute inverters are lined up at inner sides of the parallel-arranged water channels simplifies capacitor module connection structure and reduces inductance. Furthermore, since capacitor modules are arranged in parallel in a plurality of split rows and since capacitor module terminals are positioned internally to the parallel arrangement, it is possible to reduce inductance of a DC circuit as well as to improve cooling efficiency and simplify the configuration of the entire device.

In the above power modules, a copper material that contains another metal is used to increase the hardness of the metallic base plates which retain the semiconductor elements and the heat release fins. This makes it possible to suppress the disturbance of planarity due to fin brazing and facilitates subsequent bonding of a dielectric substrate having a plurality of semiconductor chips. In addition, the above dielectric substrate can be easily bonded onto a plurality of positions of one metallic base, and reliability thereof can be maintained over a long period of time.

Next, a semiconductor power module applied to both power converters of the first and second embodiments will be described in detail below with reference being made to FIGS. 28-36.

Figure 28:
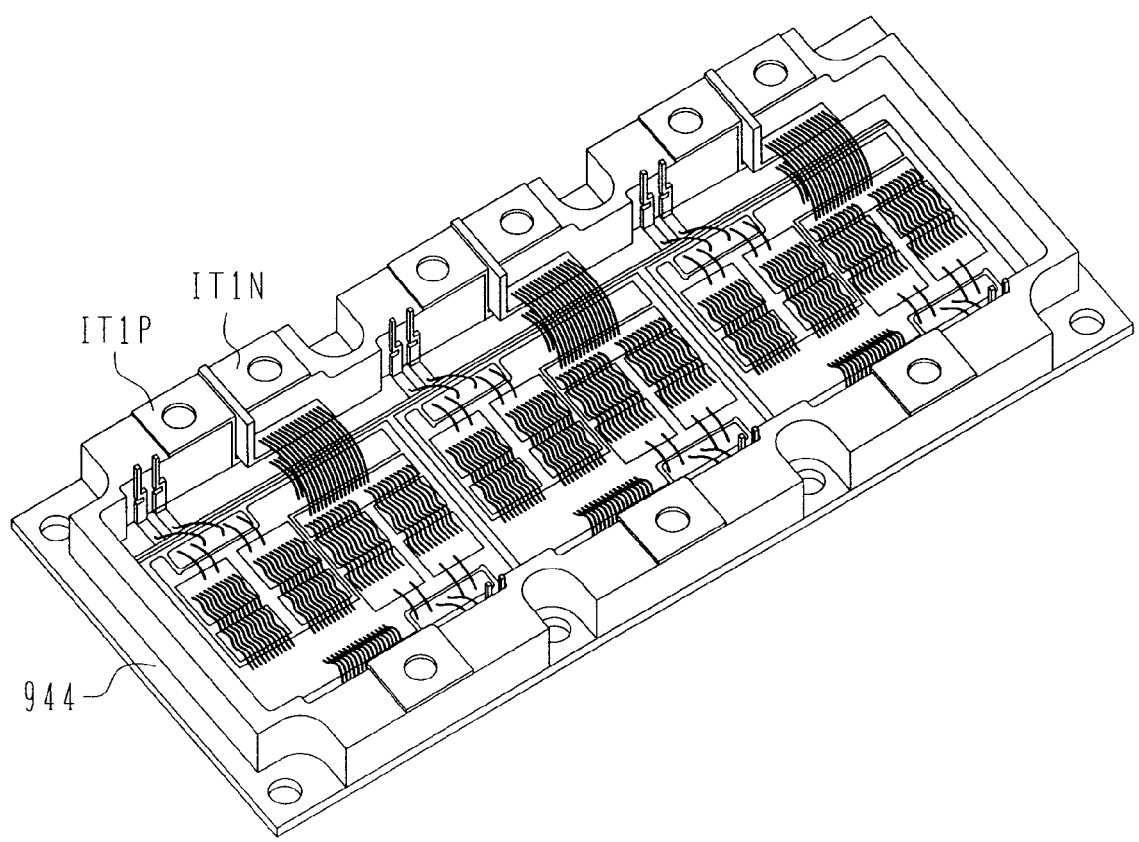
FIG. 28 is a view showing an internal structure of a semiconductor power module in the present embodiment.
Figure 29A:
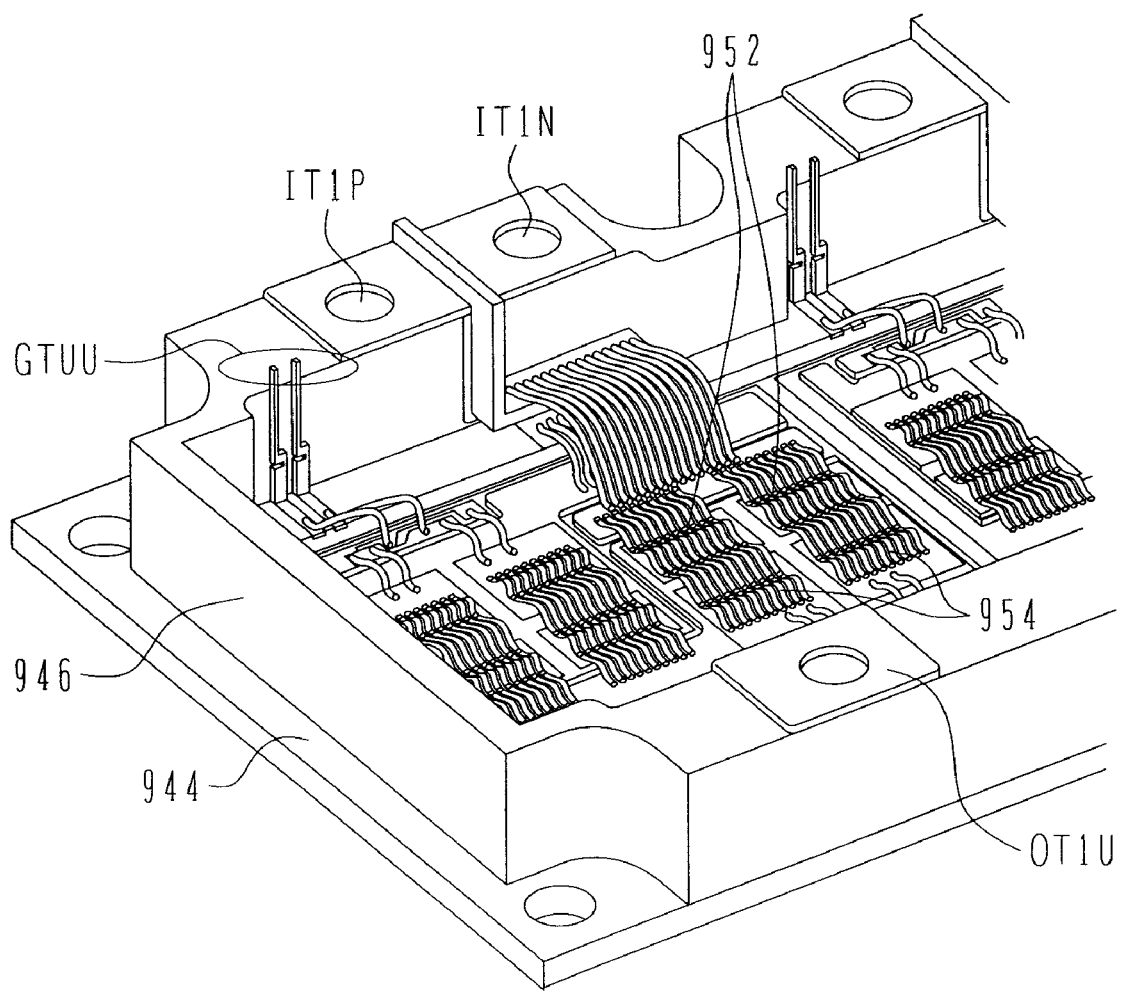
FIG. 29A is a partial enlarged view of the semiconductor power module in FIG. 28.
Figure 29B:
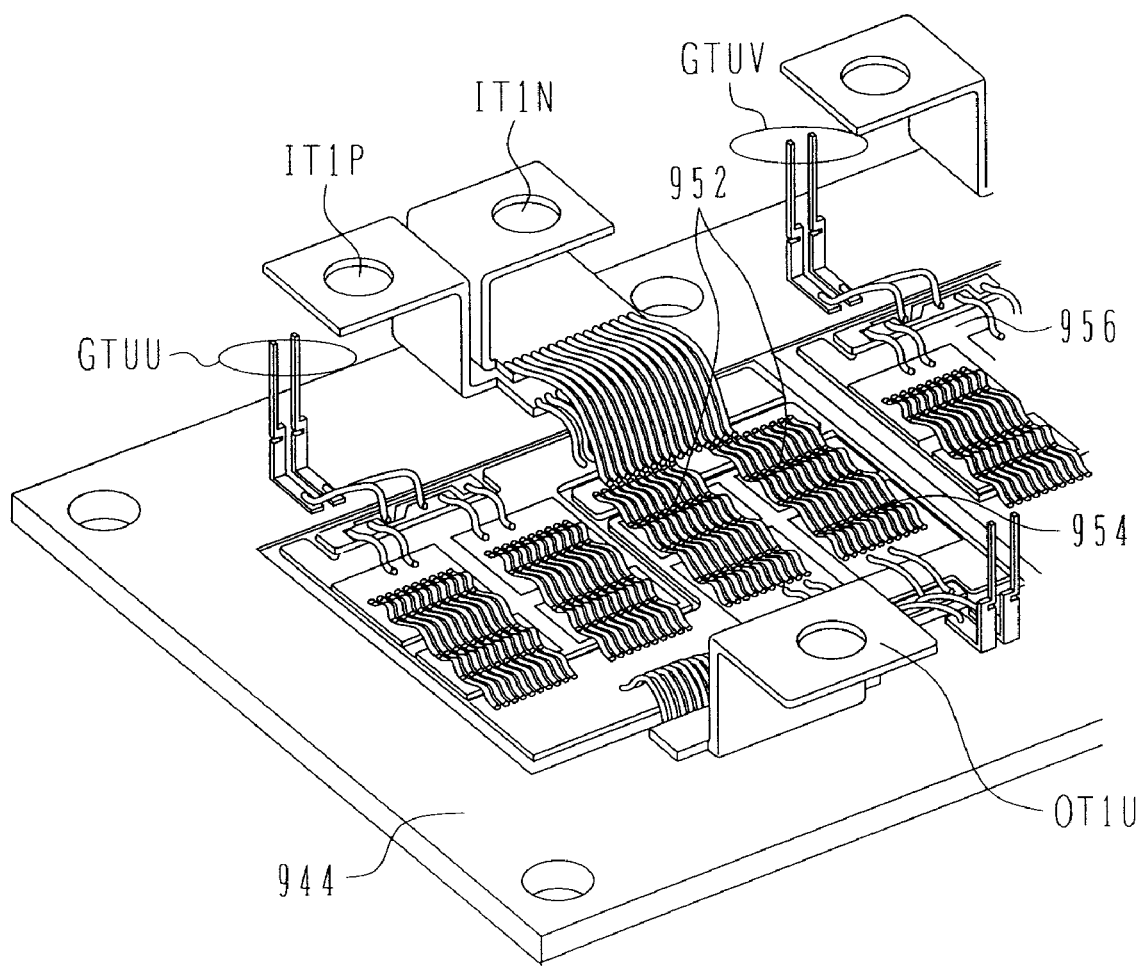
FIG. 29B is a partial enlarged view showing a state in which a casing in FIG. 29A is removed.
Figure 29C:
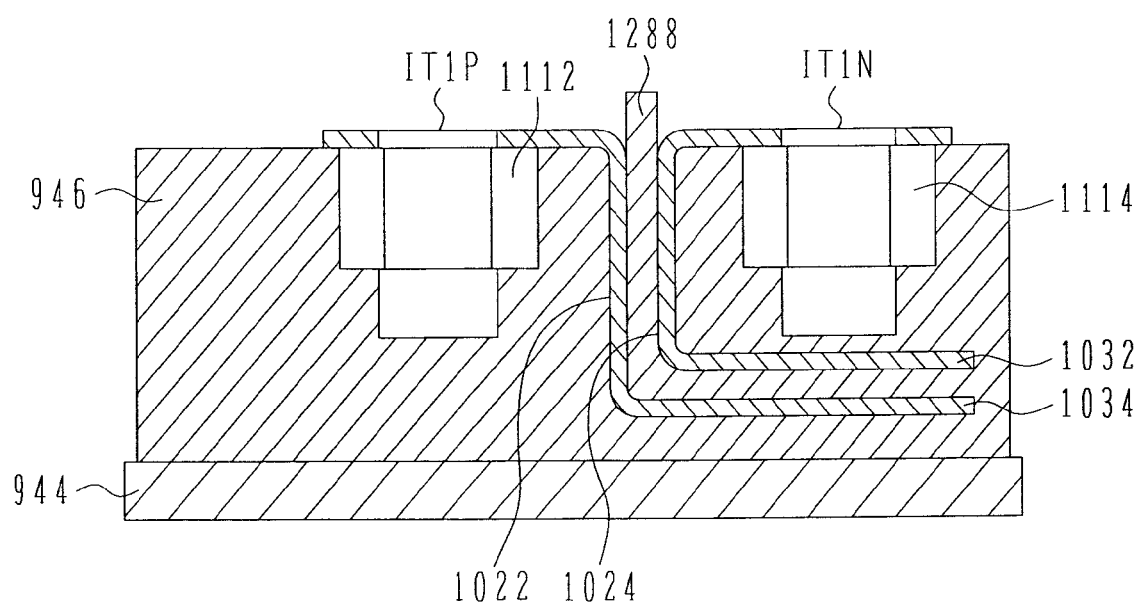
FIG. 29C is a sectional view of DC terminals.

FIG. 28 is a view showing an internal structure of the semiconductor power module described in the above embodiments. The figure shows the internal structure, inclusive of the connections between semiconductor chips and terminals thereof. FIGS. 29A and 29B are partial enlarged views from which the casing shown in FIG. 28 is omitted. FIG. 29C is a sectional view of DC terminals. The semiconductor chips are fixed to one side of a metallic base 944 and hermetically sealed with a resin casing 946. In the present embodiment, IGBTs 952 and diodes 954, somewhat differently from those described above, are connected in parallel, for composing this parallel circuit increases currents to be controlled. The DC positive terminal IT1P and the DC negative terminal IT1N form a stacked structure in an opposed arrangement, and are connected to the above chips by bonding in the parallel arrangement. These chips constitute a U-phase upper arm of an inverter. The two rows of chips located to the left of the above chips constitute a lower arm of the inverter.

Inductance is reduced to a low level since the DC terminals form the stacked structure that has wide, opposed conductors arranged with an insulator sandwiched therebetween. Terminal GTUU is a gate terminal of the IGBT which controls a U-phase lower arm of the inverter.

The IGBTs 952 and the diodes 954 are mounted on a dielectric substrate 956 formed from aluminum nitride (AlN). Aluminum nitride (AlN) is favorably used because of its excellent heat conductivity. Silicon nitride (SiN) can be used instead of aluminum nitride (AlN). High toughness of silicon nitride (SiN) allows thin formation of the dielectric substrate 956.

A full-surface pattern of nickel-plated copper or the like is formed on the metallic base side of the dielectric substrate 956, and an electrical wiring pattern of nickel-plated copper or the like is formed on the chip side of the dielectric substrate 956. The dielectric substrate 956 has a metal attached to both sides thereof to allow soldering between the chip 952 and the metallic base 944 and to construct the dielectric substrate 956 into a metals-sandwiched structure. This construction prevents deformation due to a difference in thermal expansion coefficient between the above two metals when temperature changes. As a result of this sandwiched structure being adopted, thinning down the dielectric substrate 956 induces a greater amount of eddy current into the full-surface pattern on the metallic base side of the substrate according to a particular change in a flow rate of a switching current into the wiring pattern on the chip side of the substrate. This results in the wiring pattern of the dielectric substrate 956 being reduced in parasitic inductance and contributes to reduction in power module inductance.

Figure 30A:
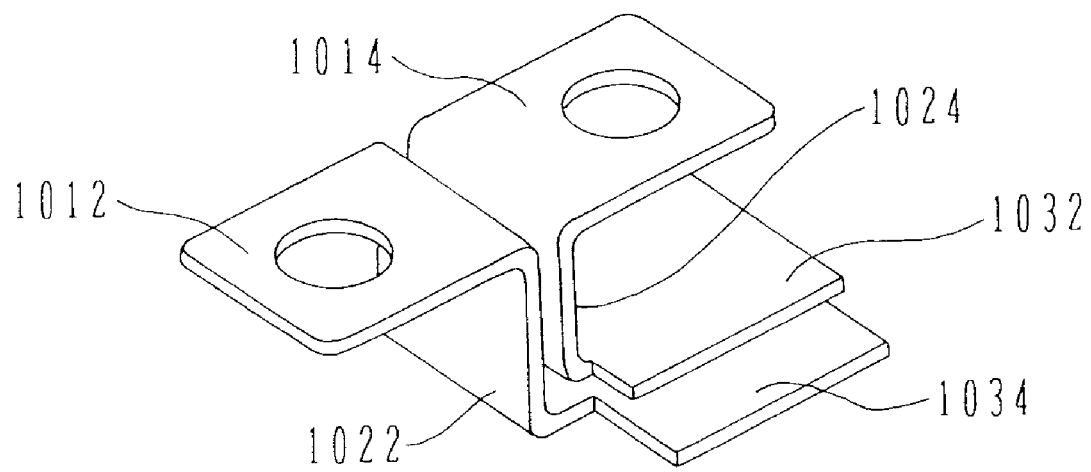
FIG. 30A is a diagram showing a structure of terminals in the present embodiment.

For ease in the description of the terminal structure, FIG. 29B shows the power module, from which the resin casing 946 shown in FIG. 29A is removed. The positive terminal IT1P and the negative terminal IT1N have a wide structure and are arranged in an opposed condition with respect to each other. FIG. 30A shows the terminal structure, in which reference numbers 1012 and 1014 denote conductor-side connections on the positive terminal IT1P and the negative terminal IT1N, respectively, with ends of the connections being bent in opposite directions. Reference numbers 1022 and 1024 denote intermediate conductors of the positive terminal IT1P and the negative terminal IT1N, respectively, and form a stacked structure with a sheet insulator interposed between the intermediate conductors.

Figure 30B:
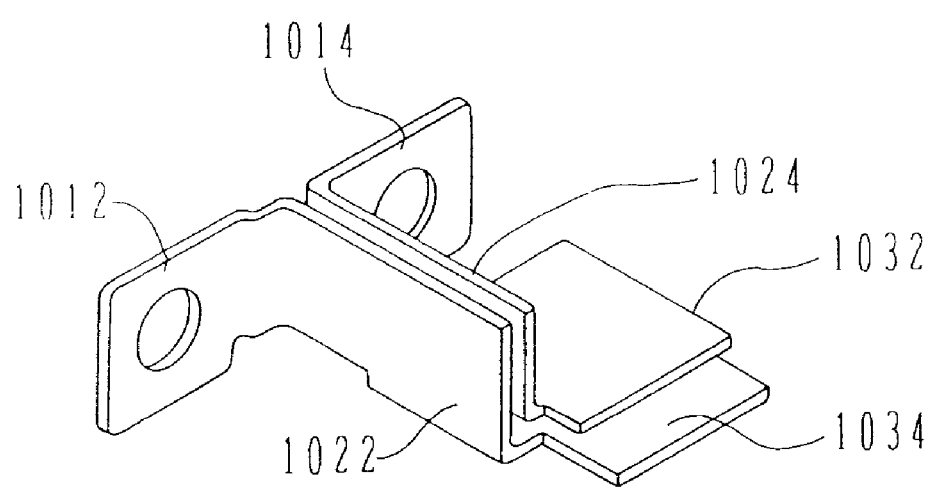
FIG. 30B is a diagram showing another example of a terminal structure in the present embodiment.
Figure 30C:
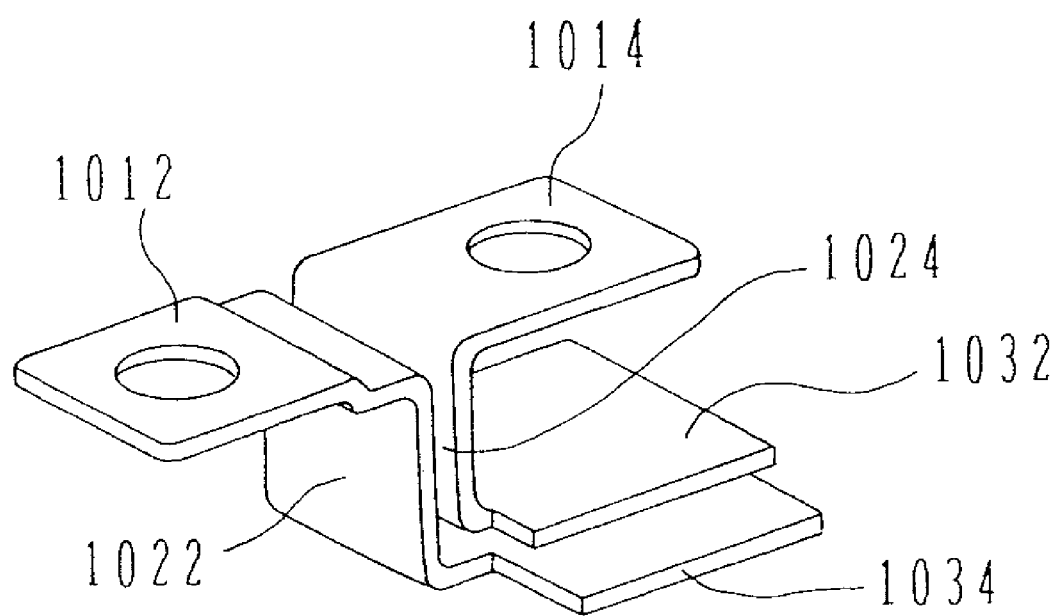
FIG. 30C is a diagram showing yet another example of a terminal structure in the present embodiment.

Reference numbers 1032 and 1034 denote chip-side connections on the positive terminal IT1P and the negative terminal IT1N, respectively, and both connections are bent in the same direction. The chip-side connections 1032 and 1034 differ from each other in length because the connections are later connected in parallel to the conductors electrically connected to the semiconductor chip. In FIG. 29A, wire bondings are arranged in a parallel-like fashion, which reduces inductance. In FIG. 29A, terminal OT1U is a U-phase terminal of the terminals formed to output three-phase power. In FIG. 29C, nuts 1112 and 1114 are embedded in the resin casing in order to facilitate terminal connection to the conductor terminals, and as shown in FIG. 30, the conductor-side connections have a screw insertion hole for fastening with screws.

Reference numbers 1032 and 1034 denote the chip-side connections on the positive terminal IT1P and the negative terminal IT1N, respectively, and both connections are bent in the same direction. The chip-side connections 1032 and 1034 differ from each other in length because the connections are later connected in parallel to the conductors electrically connected to the semiconductor chip. The chip-side connections on the flat-plate-like positive and negative terminal conductors stacked via an insulator in this manner are bent in the same direction to constitute the two stacked flat-plate conductor planes. This allows a wiring pattern to be formed in parallel to the edge side of the dielectric substrate that is the closest to the terminals. This, in turn, makes it possible to miniaturize the dielectric substrate without creating a superfluous space thereon. In FIG. 29A, wire bondings are arranged in a parallel-like fashion, and directions of the currents flowing into the wire bondings connected to the positive and negative terminals will be opposite to each other. Consequently, inductance will decrease since the magnetic fields created by the currents will counteract each other. In FIG. 29A, terminal OT1U is a U-phase terminal of the terminals formed to output three-phase power. In FIG. 29C, the nuts 1112 and 1114 are embedded in the resin casing in order to facilitate terminal connection to the conductor terminals, and as shown in FIG. 30, the conductor-side connections have a screw insertion hole for fastening with screws. At these connections, as described above, the directions of the currents flowing into the capacitor terminal connections and the power module terminal connections will be opposite to each other. Accordingly, inductance will decrease since the magnetic fields created by the currents will counteract each other.

Figure 31A:
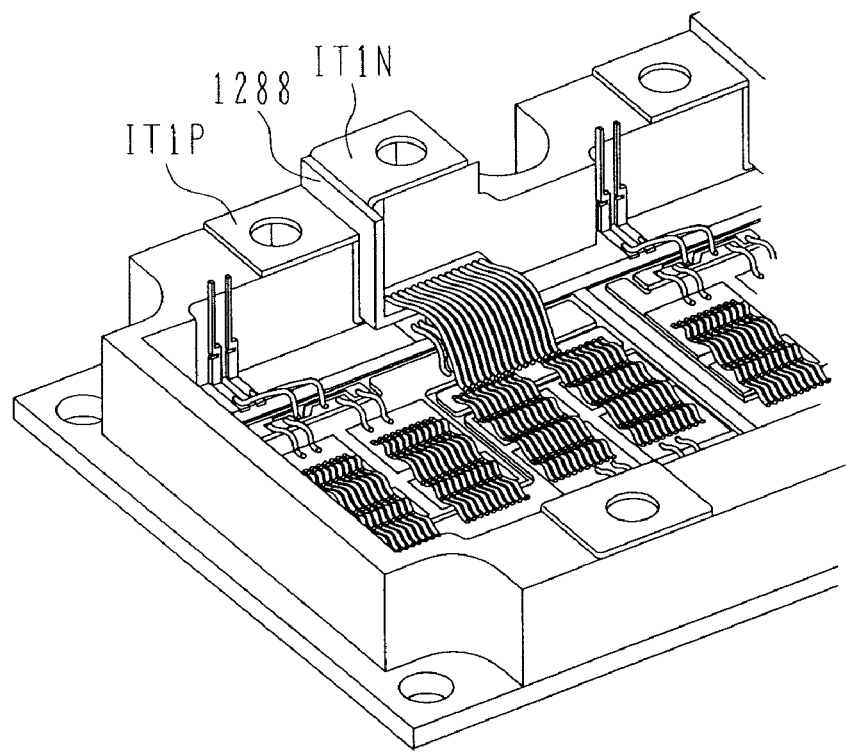
FIG. 31A is a partial enlarged view showing another example of a semiconductor power module in the present embodiment.
Figure 31B:
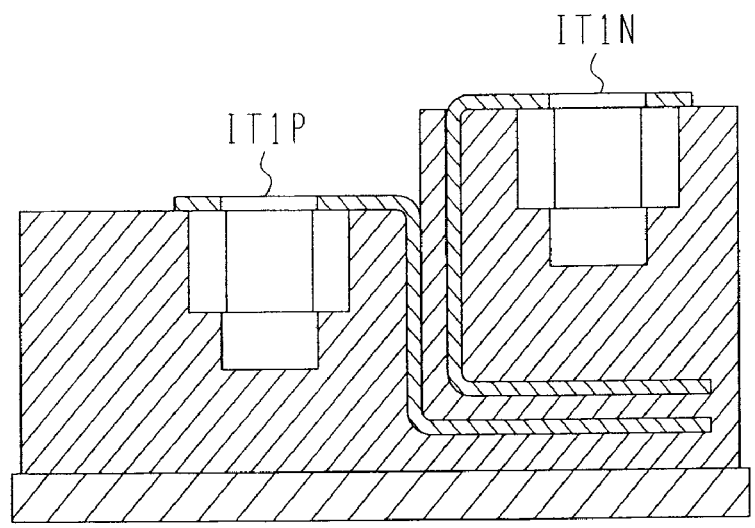
FIG. 31B is a sectional view of DC terminals.

FIGS. 31A and 31B show yet another example, which employs a terminal structure in which the positive terminal IT1P and the negative terminal IT1N are arranged at different heights to increase an electrical withstand pressure between the two terminals. Changing the layout height extends a creeping distance and increases dielectric strength. Layout height of the capacitor terminals, as with that of the above power module terminals, is changed to fit the particular power module connections. This ensures an appropriate dielectric creeping distance for the capacitors. In addition, when the power module terminals and the capacitor module terminals are connected, the directions of the currents flowing into the connections will be opposite to each other. Consequently, inductance can be reduced since the magnetic fields created by the currents will counteract each other. In the flat plate conductors elongated when the layout height of the power module and capacitor terminals, the directions of the currents flowing into the conductors will be opposite to each other. Consequently, parasitic inductance can be reduced since the magnetic fields created by the currents will counteract each other.

Figure 32A:
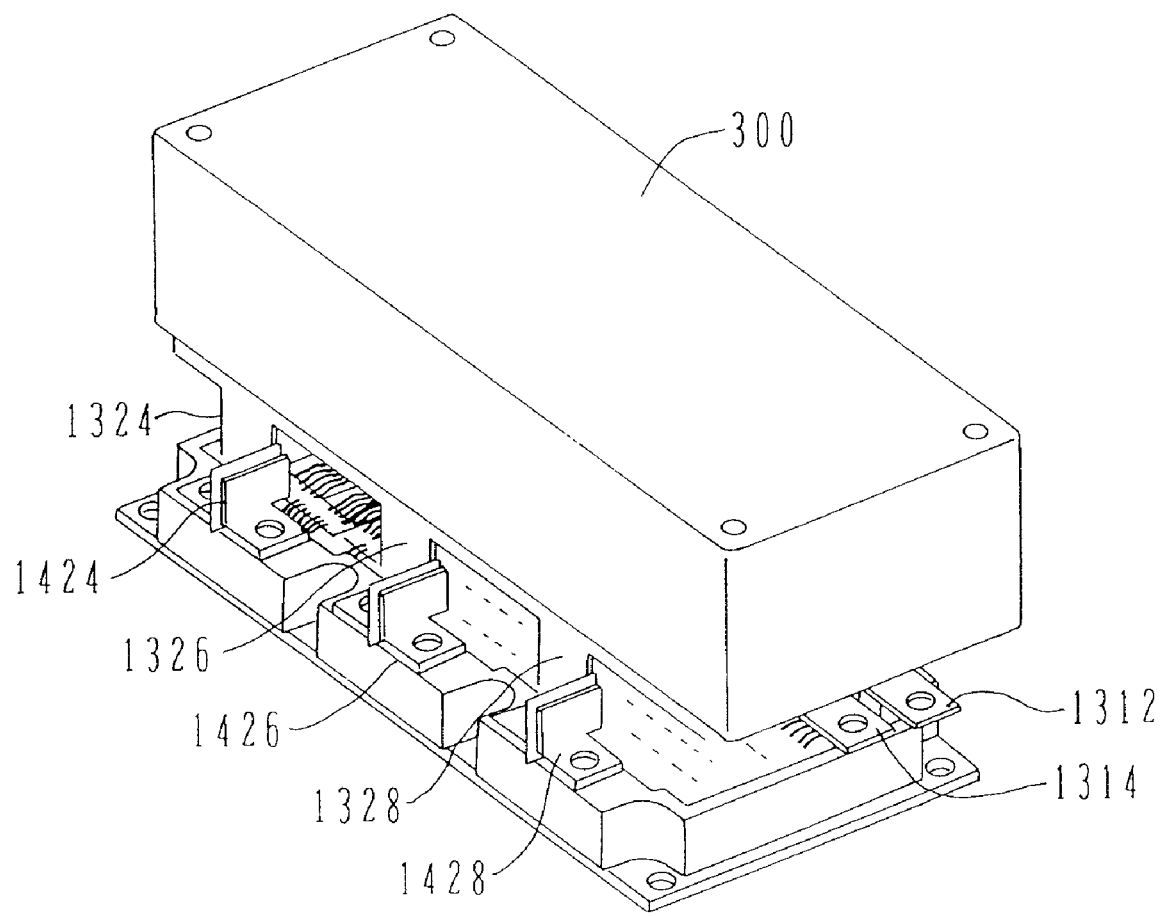
FIG. 32A is a view showing a semiconductor power module—capacitor module in the present embodiment.
Figure 32B:
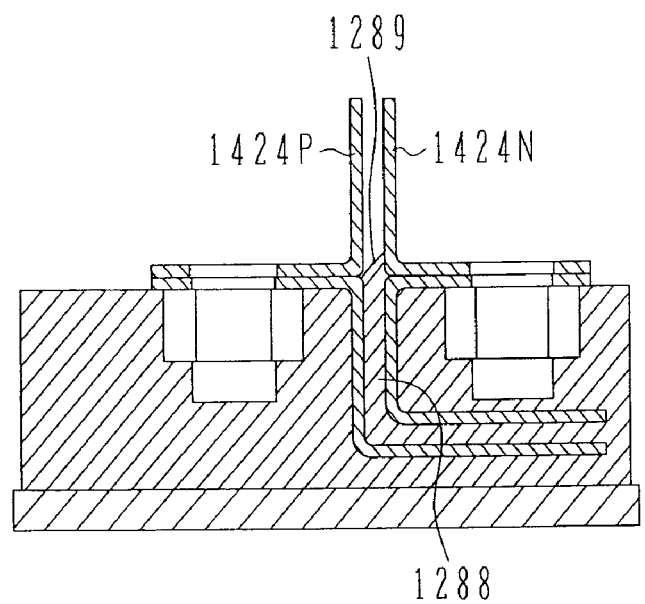
FIG. 32B is a sectional view of an essential section of the connection.

FIG. 32B is a detailed sectional view of the connections between the DC terminal pair formed at the power module side, and the DC terminal pair formed at the capacitor side. The DC terminal pair at the power module side is constituted by stacking a positive terminal IT1P and a negative terminal IT1N as flat plate conductors via an insulator 1288. The positive terminal IT1P and the negative terminal IT1N are bent in opposite directions to each other at respective front ends. The bent ends serve as the connection planes electrically connected to the positive terminal IT1P and negative terminal IT1N forming the DC terminal pair at the capacitor side. The DC terminal pair at the power module side and the DC terminal pair at the capacitor side are fixed to the connection planes by means of screws.

The DC terminal pair at the capacitor side is constituted by stacking a positive terminal 1424P and a negative terminal 1424N as flat plate conductors via a sheet insulator 1289. An insulator 1288 for the DC terminal pair at the power module side is formed so as to protrude above the peripheral resin section in order to ensure a creeping distance. For this reason, the insulator 1288 at the power module side and the sheet insulator 1289 at the capacitor side overlap each other at respective front ends.

FIGS. 32C to 32G show different, further examples of the connection structure shown in FIG. 32B. In each of these examples, the construction of the insulator 1288 and that of the sheet insulator 1289 are appropriately modified to ensure the creeping distance.

Figure 32C:
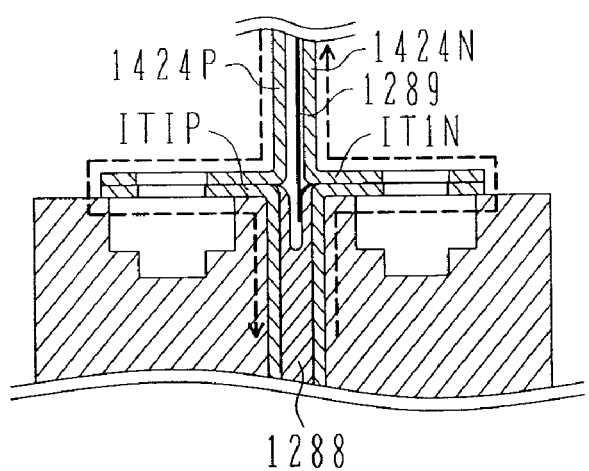
FIG. 32C is a sectional view of an essential section of another example in the above connection.

FIG. 32C shows a structure that has two protrusions at the front end of the insulator 1288 for the power module. The sheet insulator 1289 for the capacitor is disposed between the two protrusions of the insulator 1288. That is to say, in this case, the insulator 1288 at the power module side and the sheet insulator 1289 at the capacitor side also overlap each other at the respective front ends.

Flow routes of switching currents in the terminals are shown as a broken line in FIG. 32C. As shown therein, currents of the same polarity counteract each other at the terminal connection, whereas currents different in polarity counteract each other at the stacked section having an insulator inserted therein. The magnetic fluxes created by the currents will therefore counteract each other, which will make it possible to reduce parasitic inductance of the terminal connection.

Figure 32D:
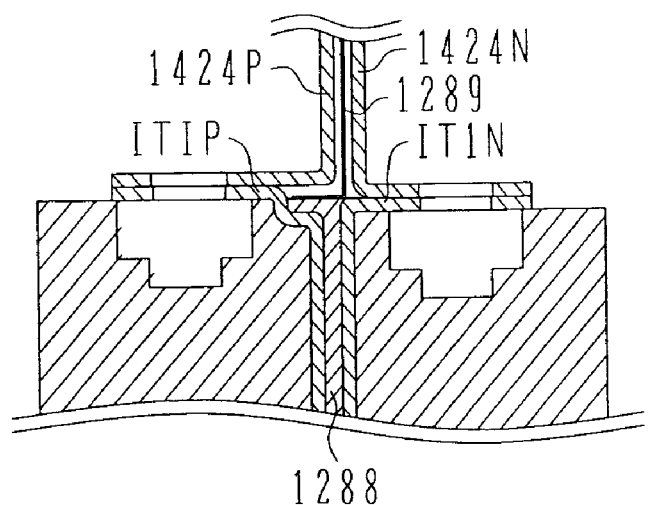
FIG. 32D is a sectional view of an essential section of yet another example in the above connection.

FIG. 32D shows a construction in which the power module insulator 1288 has its front end bent towards the positive terminal IT1P. In order for the positive terminal IT1P to accommodate the vent insulator 1288, the terminal IT1P has a planar region, except at where the terminal comes into contact with the positive terminal 1424P at the capacitor side.

A front end of the vent insulator 1288 is accommodated in the planar region. In addition, the insulator has a face positioned internally to the connection plane. Adopting this structure makes it possible to avoid deterioration due to cracking or other unusual events associated with application of stresses to the insulator during connection.

The sheet insulator 1289 at the capacitor side also has a front end bent towards the positive terminal 1424P. As a result, the insulator 1288 at the power module side and the sheet insulator 1289 at the capacitor side overlap each other at the respective front ends. The two insulators overlap during connection, thus double-ensuring adequate insulating characteristics during the connection.

Figure 32E:
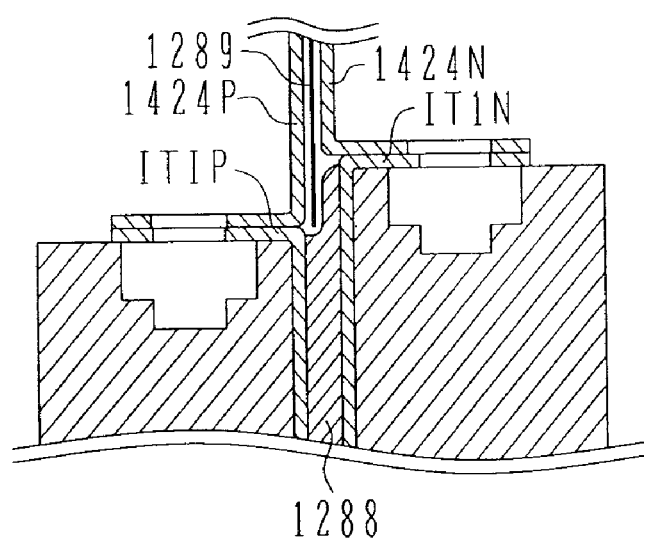
FIG. 32E is a sectional view of an essential section of a further example in the above connection.

FIG. 32E shows a construction in which the front ends of the positive terminal IT1P and negative terminal IT1N at the power module side are changed in height. In this figure, the negative terminal IT1N is constructed to be higher than the positive terminal IT1P. Accordingly, the front end of the insulator 1288 protrudes at the negative terminal IT1N. Also, the sheet insulator 1289 at the capacitor side extends to a bent section of the positive terminal 1424P, and the sheet insulator 1289 has a front end positioned at the positive terminal IT1P free from the insulator 1288. As a result, the insulator 1288 at the power module side and the sheet insulator 1289 at the capacitor side overlap each other at the respective front ends. The internal insulator of the capacitor terminal pair and that of the power module terminal pair are formed so that total thickness of the two insulators existing when overlapped on each other will be smaller than maximum thickness of the capacitor terminal or power module terminal pair's insulator, whichever is the larger. It becomes possible, by doing so, to avoid deterioration due to cracking or other unusual events associated with insulator stressing during connection. Such deterioration can also be avoided in a polarity-inversed construction.

Figure 32F:
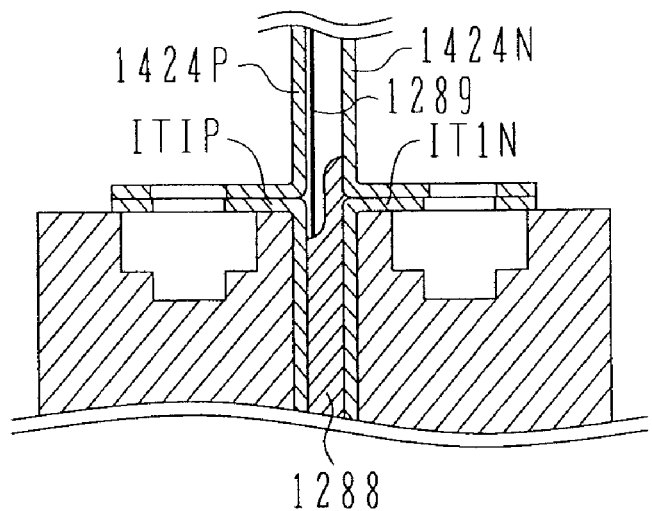
FIG. 32F is a sectional view of an essential section of a further example in the above connection.

FIG. 32F shows a construction in which the front end of the insulator 1288 at the power module side is formed at a position higher than the peripheral resin section. At the negative terminal IT1N, the front end of the insulator 1288 extends to a position higher than the peripheral resin section, whereas, at the positive terminal IT1P, the front end is located at a position lower than the peripheral resin section. Also, the sheet insulator 1289 at the capacitor side extends to the positive terminal 1424P for the power module. As a result, the insulator 1288 at the power module side and the sheet insulator 1289 at the capacitor side overlap each other at the respective front ends. This can also be realized in a polarity-inversed construction.

Figure 32G:
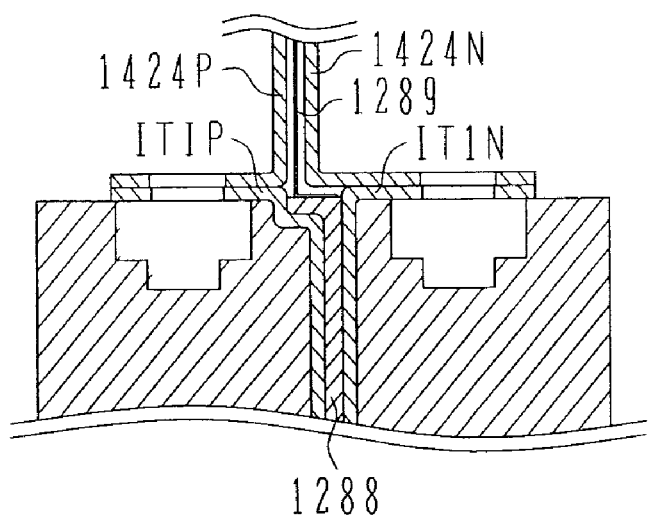
FIG. 32G is a sectional view of an essential section of a further example in the above connection.

In FIG. 32G, although the construction of the power module terminal insulator is the same as that shown in FIG. 32D, the construction of the capacitor terminal insulator differs from that shown in FIG. 32D. In FIG. 32G, the sheet insulator 1289 has a front end bent towards the negative terminal IT1N, that is, in a direction opposite to the bending direction of the insulator 1288. In this case, the insulator 1288 at the power module side and the sheet insulator 1289 at the capacitor side also overlap each other at the respective front ends. This can also be realized in a polarity-inversed construction.

In addition, while the insulator 1288 is formed from essentially the same resin as used in the peripheral resin section, the insulator is not limited to this kind of material and can use, instead of resin, essentially the same sheet insulator material as that used at the capacitor side. In that case, the sheet insulator will protrude from the terminal pair. When the sheet insulator is used, parasitic inductance can be further reduced since the distance between the stacked conductors will be shorter than that of the paired terminals formed using the stacked conductors that have a molded insulator such as resin.

It is possible to embed terminals and a sheet insulator in resin and then form a resin casing integrally with the resin-embedded terminals and sheet insulator. Alternatively, it is realizable to create the resin casing beforehand and then insert the terminals and the sheet insulator. In the latter case, when solder is used to connect the terminals to a wiring pattern on a dielectric substrate or when ultrasonic, welding, or any other bonding method is used to directly bond the metals of the terminals and the metal of the wiring pattern on the dielectric substrate, height adjustment of the connection surface becomes easy since the resin casing and the terminals are independent of each other.

Figure 33A:
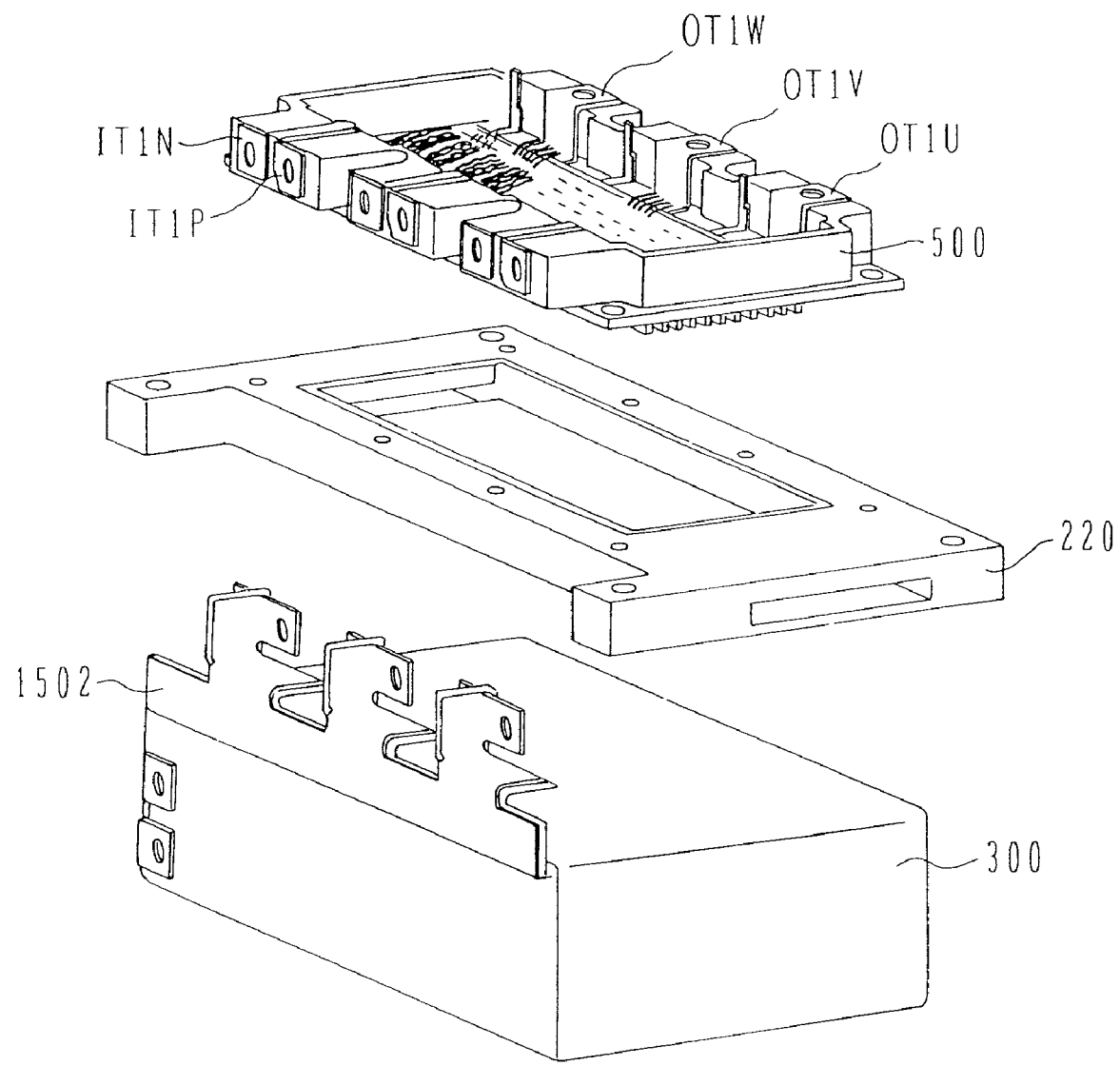
FIG. 33A is an exploded view showing a further example of an electric power converter in the present embodiment.
Figure 33B:
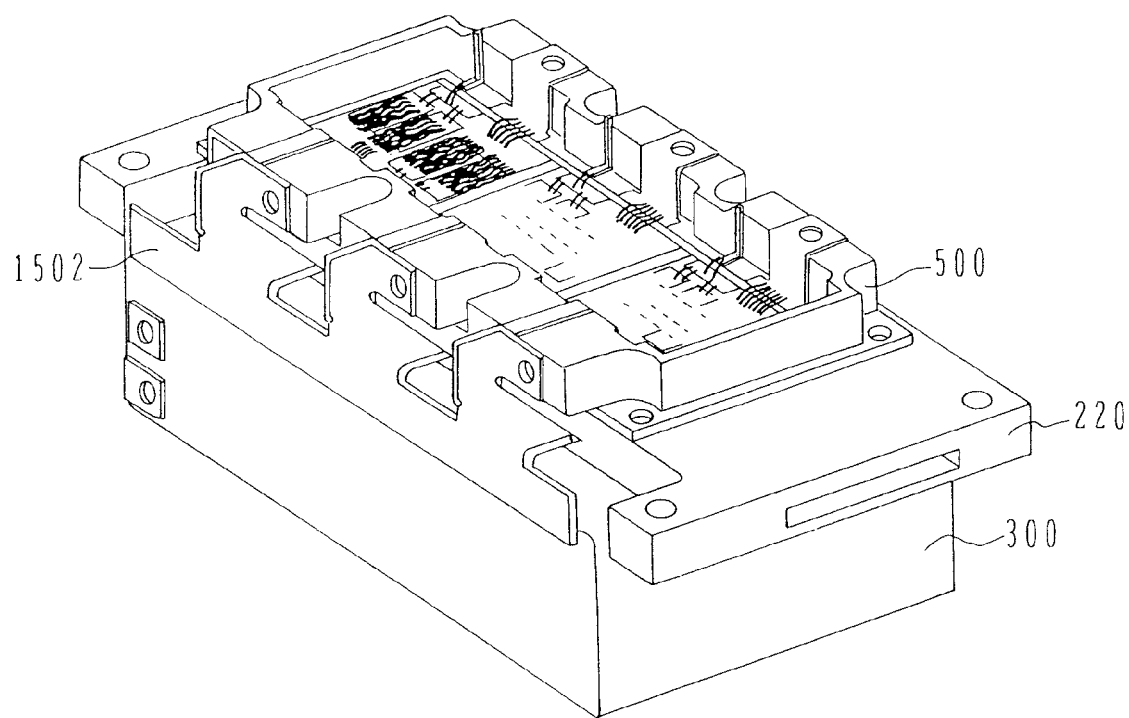
FIG. 33B is an integral block diagram showing the example of FIG. 33A.
Figure 33C:
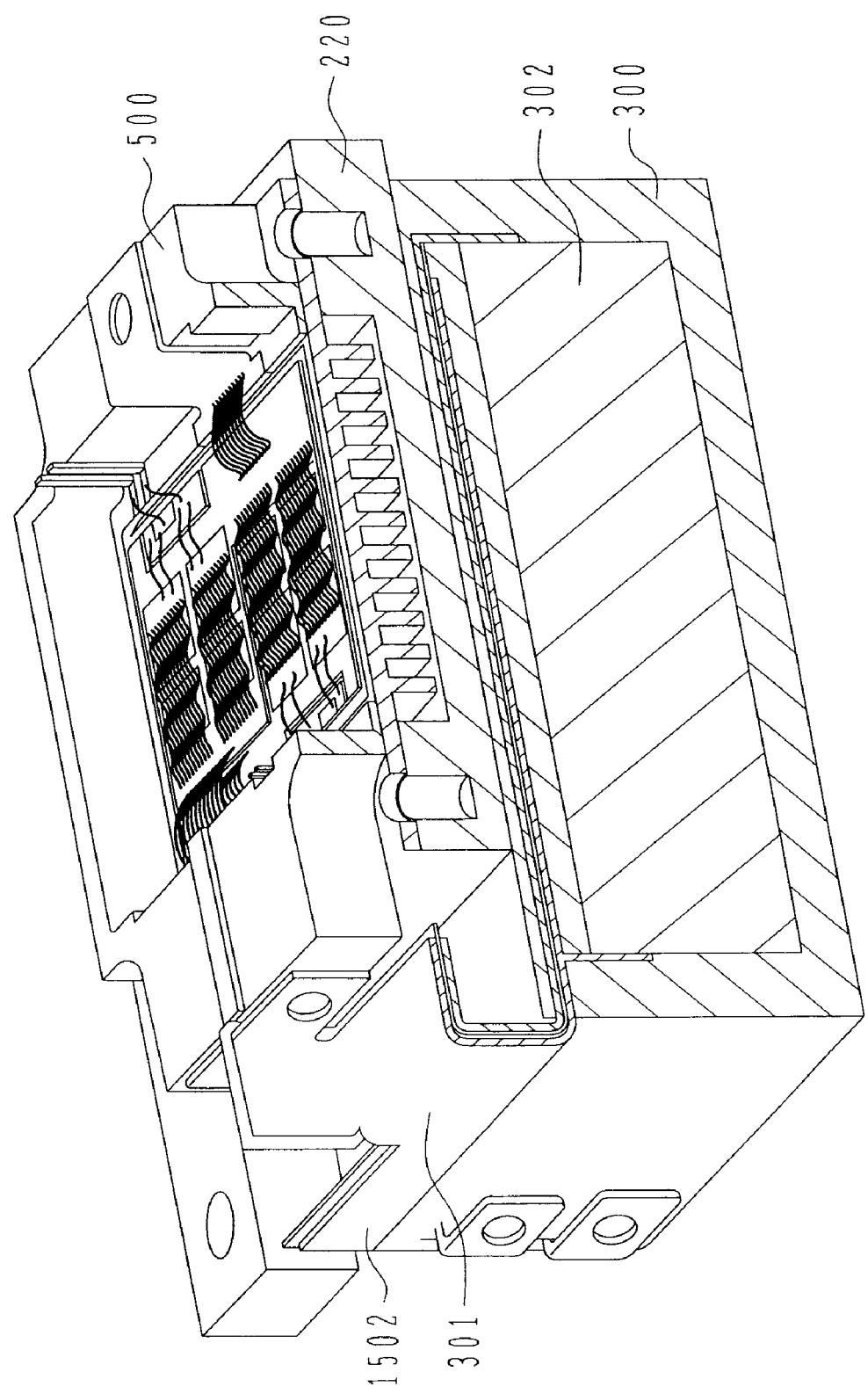
FIG. 33C is a sectional view of the power converter in FIG. 33B.

FIG. 33A shows a further example employing a structure in which the power module 500, the water channel formation 220, and the capacitor module 300 are integrated. The power module 500 and the capacitor module 300 are arranged at opposite sides of the water channel formation 220, and a conductor 1502 of a stacked structure, inclusive of a wide conductor and a sheet insulator, is formed to connect DC terminals. FIG. 33B shows the integrated structure, with the stacked conductor being positioned next to the water channel formation 220, and with the DC terminals being connected in that state. FIG. 33C is a sectional view of a power converter including the stacked structure. Since the water channel formation for cooling is sandwiched between the power module and the capacitor module, reliability of both improves since highly efficient release of heat and reduction in the amount of heat, based on inductance reduction, become possible. The capacitor module 300 includes a wired capacitor element 302 on a flat plate conductor 301 having two stacked flat plate conductors with an insulator therebetween. Terminals of the capacitor module 300 are formed by bending an end of the flat plate conductor 301 with the stacked conductors remaining therein, and then bending both ends in opposite directions.

Figure 34:
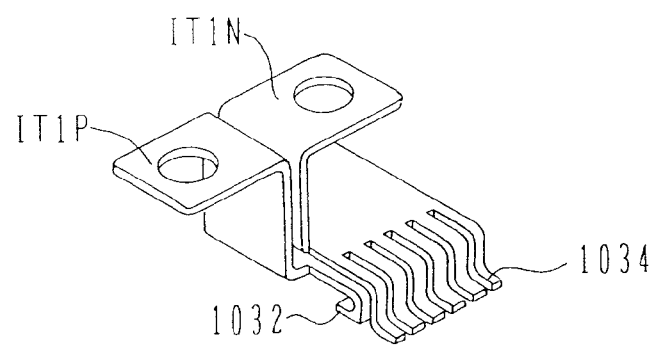
FIG. 34 is a diagram showing a further example of a terminal structure in the present embodiment.

FIG. 34 shows a further example of terminals of the power module 500, with each of the chip-side connections 1032 and 1034 being constructed into a plurality of leads. Front ends of the chip-side connections 1032 and 1034 are bent in opposite directions and connected by soldering or the like.

Figure 35A:
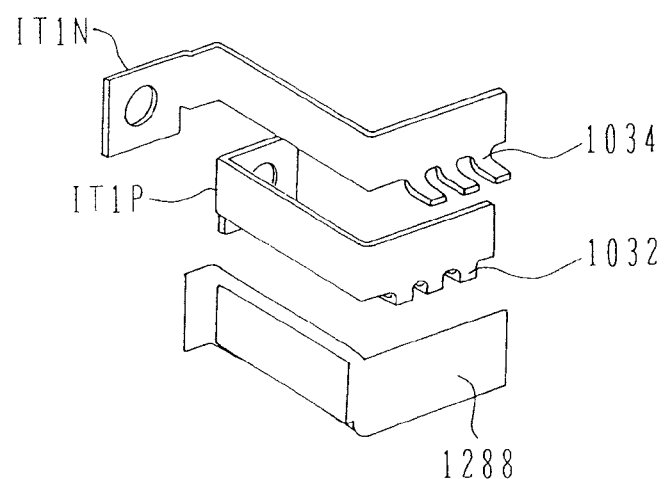
FIG. 35A is a diagram showing another example of a stacked structure in the present embodiment.
Figure 35B:
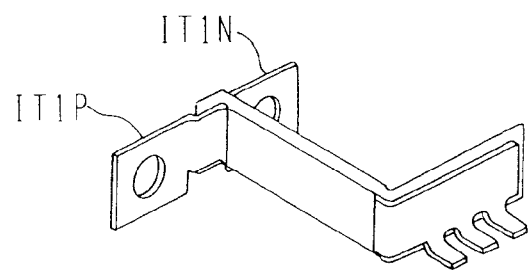
FIG. 35B is a diagram showing yet another example of a stacked structure in the present embodiment.

FIGS. 35A and 35B show further examples. In both of the examples, a positive wide conductor IT1P and a negative wide conductor IT1N form a stacked structure with an insulator 1288 sandwiched therebetween. The chip-side connections 1032 and 1034 on these terminals are constructed as a plurality of leads, and are connected to chip-side conductors by solder connection or ultrasonic connection. Although somewhat different in form of terminal bending, the examples shown in FIGS. 35A and 35B are the same in operational effectiveness.

Figure 36A:
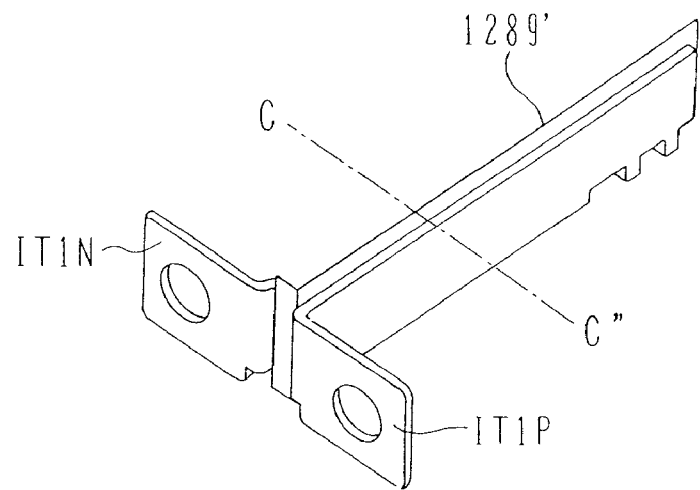
FIG. 36A is a perspective view showing a further example in a DC terminal pair of a power module.
Figure 36B:
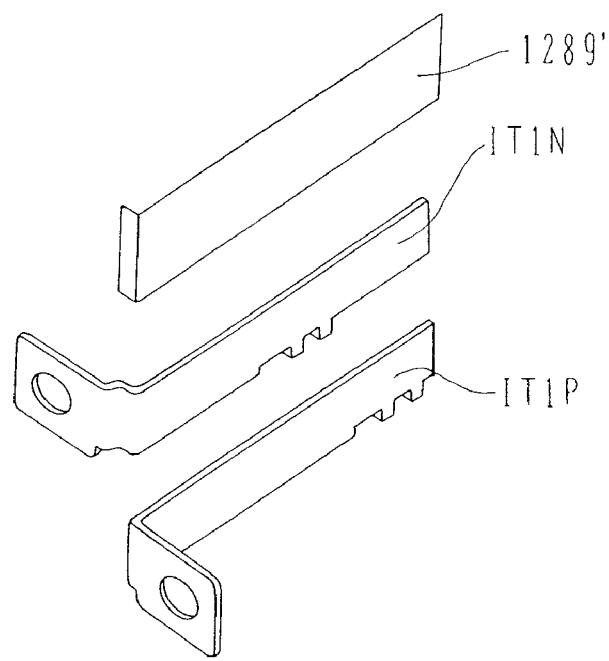
FIG. 36B is an exploded view of FIG. 36A.

FIGS. 36A and 36B are respectively a perspective view and exploded view showing a further example of a DC terminal pair for a power module. The DC terminal pair in these figures has a sheet insulator 1289' interposed between a positive terminal IT1P and a negative terminal IT1N. If, as shown in the figures, essentially the same sheet insulator 1289' as that used at the capacitor module side is also applied to the DC terminal pair used at the power module side, a distance between the positive terminal IT1P and the negative terminal IT1N can be narrowed down in comparison with using an insulator 1288 made of a resin material. Accordingly, inductance in the power module can be further reduced.

Figure 36C:
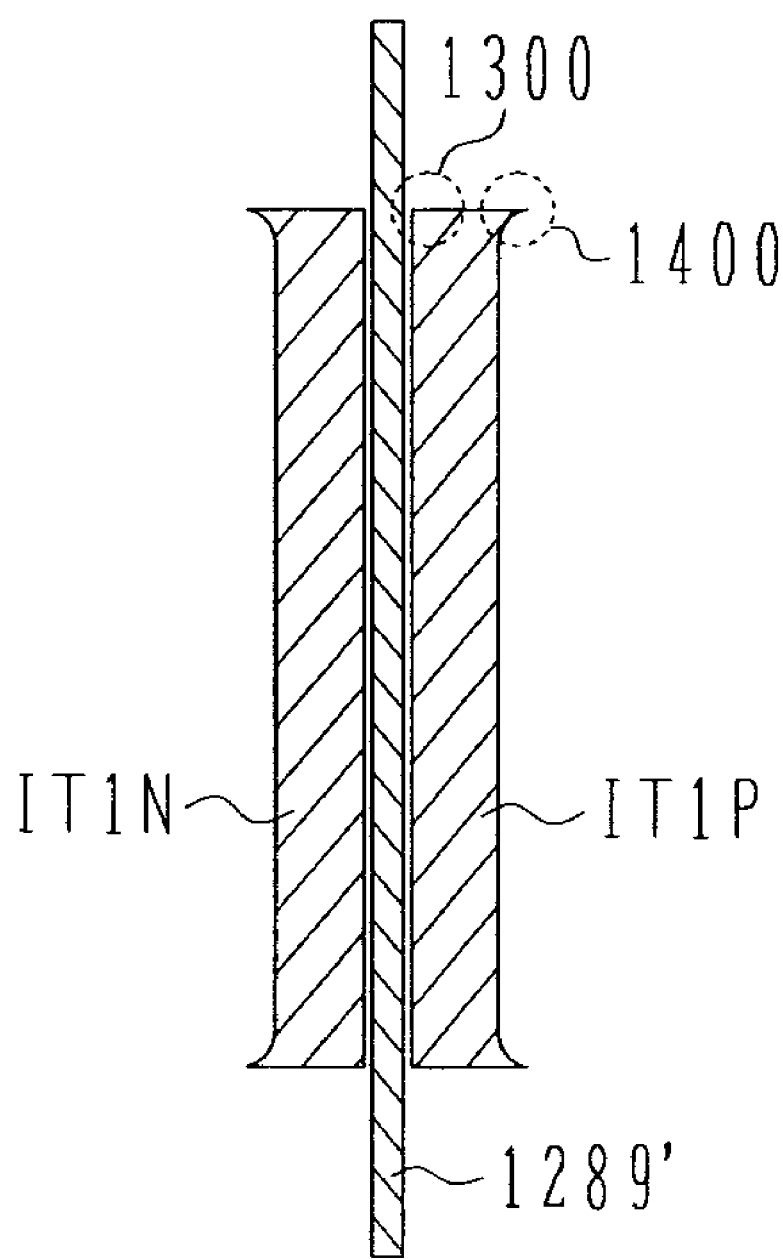
FIG. 36C is a sectional view taken along line C-C' in FIG. 36A.

FIG. 36C is a sectional view of section C-C' in FIG. 36A. Forming a positive terminal IT1P and a negative terminal IT1N by die punching results in a sagging surface 1300 and a burred surface 1400 being generated. Since the burred surface has a sharp edge, sheet insulator 1289' is likely to be damaged. For this reason, each terminal preferably has a sagging surface positioned near the sheet insulator 1289'. This prevents the sheet insulator 1289' from being damaged at the burred surface, even if either terminal shifts in position. In that case, reliability of insulating characteristics in the positive/negative DC terminal pair can be enhanced as a result.

If the sheet insulator 1289' is to be contained in the power module casing molded, the sheet insulator is preferably a highly heat-resistant sheet insulator such as polyamideimide highly durable at high temperature. This prevents the insulator from being fused by heat as high as about 300° C. during molding. If the sheet insulator is to be inserted between terminals following completion of power module molding, the insulator can be a relatively inexpensive, meta-based aramid fiber capable of withstanding at least a maximum semiconductor junction temperature of 150° C. (preferably, up to 260° C.).

If the associated terminals are of an internally bent structure, adhesion of the sheet insulator 1289' with respect to the terminals at the bends thereof can be improved by thinning down the sheet insulator to 50 µm or less.

Adopting any one of the above structures makes it possible to reduce below 30 nH the main circuit inductance with the modules and capacitors combined. Also, using a thin dielectric substrate such as that of silicon nitride allows the inductance to be further reduced below 20 nH, for example. Accordingly, an increase rate of voltage can be controlled to stay within its permissible range, even if, for example, an on-to-off switching time of the semiconductor chip of the inverter is reduced below 2.0 µs, or further below 1.2 µs, or further below 1.0 µs. The normal DC voltage attained at that time ranges from 300 V to 600 V. Consequently, the device can be operated, even at a maximum current variation (di/dt) of 2 kA/µs, preferably, 4 kA/µs or more.

Speeding up the switching of the semiconductor chip in this manner to shorten the switching time makes it possible to reduce the amount of switching heat generated and released from the semiconductor chip. A less expensive inverter with a smaller silicon area on a semiconductor chip can be consequently realized.

What is claimed is:

1. An electric power converter comprising:
   a power module having a power semiconductor element that converts from DC current to AC current;
   a capacitor module having a capacitor element that smoothes the DC current;
   a conductor for connecting said power module and said capacitor module electrically; and
   a fluid channel formation for forming a fluid channel in which coolant flows;
   wherein said power module is arranged at a first face of said fluid channel formation;
   said capacitor module is arranged at a second face of said fluid channel formation, with said first and second faces located at opposite sides of the fluid channel formation; and
   said conductor is arranged to extend from a space between said capacitor module and the second face of said fluid channel formation to said power module via a side portion of said fluid channel formation.

2. The electric power converter according to claim 1, wherein
   said power module has a base plate, said power semiconductor element is arranged at one face of said base plate, and a heat discharge fin is provided at another face of said base plate;

said fluid channel formation has an opening that connects to the fluid channel at the first face of the fluid channel formation;

said base plate closes the opening of the fluid channel formation; and said heat discharge fin projects toward an inside of the fluid channel.

3. The electric power converter according to claim 1, wherein said conductor has a laminated structure and passes at a side portion of said fluid channel formation.

4. The electric power converter according to claim 1, wherein said power module comprises a base plate and a DC terminal;

said power semiconductor element is arranged at one face of the base plate, and another face of the base plate is fixed to said fluid channel formation;

a case is arranged at the one face and surrounds said power semiconductor element;

said case is constructed by a bottom portion, which connects with said base plate, an upper portion, which counters with said bottom portion, an inside wall portion, which forms a space installing said power semiconductor element, and an outside wall portion, which counters with said inside wall portion; and said DC terminal is arranged at said outside wall portion.

5. The electric power converter according to claim 4, wherein said power module provides a power semiconductor element forming a U-phase, a power semiconductor element forming a V-phase, and a power semiconductor element forming a W-phase; and said DC terminal is formed by a U-phase DC terminal, a V-phase DC terminal, and a W-phase DC terminal.

6. The electric power converter according to claim 4, wherein said conductor is mutually crooked in a counter direction at a tip part by the side of said power module, and has a connection face with said DC terminal at a point at which it is crooked.

* * * * *